US012673482B2

(12) United States Patent
Liu et al.

(10) Patent No.: US 12,673,482 B2
(45) Date of Patent: Jul. 7, 2026

(54) LAYERED AND SCROLLED NANOCOMPOSITES WITH ALIGNED SEMI-INFINITE GRAPHENE INCLUSIONS AT THE PLATELET LIMIT

(71) Applicant: MASSACHUSETTS INSTITUTE OF TECHNOLOGY, Cambridge, MA (US)

(72) Inventors: Pingwei Liu, Malden, MA (US); Michael S. Strano, Lexington, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 945 days.

(21) Appl. No.: 16/319,315

(22) PCT Filed: Jul. 20, 2017

(86) PCT No.: PCT/US2017/043183
§ 371 (c)(1),
(2) Date: Jan. 18, 2019

(87) PCT Pub. No.: WO2018/017906
PCT Pub. Date: Jan. 25, 2018

(65) Prior Publication Data
US 2019/0275775 A1 Sep. 12, 2019

Related U.S. Application Data

(60) Provisional application No. 62/364,396, filed on Jul. 20, 2016.

(51) Int. Cl.
B32B 27/36 (2006.01)
B05D 1/00 (2006.01)
(Continued)

(52) U.S. Cl.
CPC ........... B32B 27/365 (2013.01); B05D 1/005 (2013.01); B05D 3/12 (2013.01); B05D 7/50 (2013.01);
(Continued)

(58) Field of Classification Search
None
See application file for complete search history.

(56) References Cited

U.S. PATENT DOCUMENTS 9,144,962 B2 9/2015 Lee et al.
9,309,382 B2 4/2016 Wu et al.
(Continued)

FOREIGN PATENT DOCUMENTS

KR 2010031981 A * 3/2010 ............. B82Y 30/00
WO WO-2017014821 A2 * 1/2017 ............... F41H 5/04

OTHER PUBLICATIONS

Written Opinion for PCT/US2017/043183 mailed on Oct. 6, 2017.
(Continued)

*Primary Examiner* — Seth Dumbris
(74) *Attorney, Agent, or Firm* — McDonnell Boehnen Hulbert & Berghoff LLP

(57) ABSTRACT

A composite can include alternating layers of a first layer including a 2D material and a second layer including a polymer matrix. Fabrication methods can take a thin layer of molecular thickness and construct large composite stacks that scale exponentially with the number of processing steps. An analogous shear scrolling method can create Archimedean scroll fibers from single layers with similar scaling. These methods can produce materials that demonstrate the $\alpha \rightarrow \infty$ limit while combining electrical and optical properties minimal volume fraction of the filler.

26 Claims, 58 Drawing Sheets

A1. G/copper          A2. single layer G/PC film          A3. i layers repeat
III-IV j-1 times    G/PC,
i × 4ʲ layers A4. i layers, 4 parts          A5. i × 4¹ layers

(51) Int. Cl.

| | |
|---|---|
| *B05D 3/12* | (2006.01) |
| *B05D 7/00* | (2006.01) |
| *B32B 9/00* | (2006.01) |
| *B32B 27/00* | (2006.01) |
| *B32B 27/06* | (2006.01) |
| *B32B 37/24* | (2006.01) |
| *C23C 16/02* | (2006.01) |
| *C23C 16/26* | (2006.01) |
| *B82Y 30/00* | (2011.01) |
| *H01B 1/04* | (2006.01) |

(52) U.S. Cl.

CPC .............. *B32B 9/007* (2013.01); *B32B 27/00* (2013.01); *B32B 27/06* (2013.01); *B32B 37/24* (2013.01); *C23C 16/0272* (2013.01); *C23C 16/26* (2013.01); *B05D 1/60* (2013.01); *B05D 2203/30* (2013.01); *B05D 2518/00* (2013.01); *B05D 2601/20* (2013.01); *B32B 2037/243* (2013.01); *B32B 2037/246* (2013.01); *B32B 2457/14* (2013.01); *B82Y 30/00* (2013.01); *H01B 1/04* (2013.01)

(56) References Cited

U.S. PATENT DOCUMENTS 10,093,072 B2    10/2018  Vlassiouk et al.

| 2010/0092723 A1* | 4/2010 | Guo | D01F 1/10 |
| | | | 264/108 |
| 2011/0088931 A1* | 4/2011 | Lettow | D21H 19/10 |
| | | | 428/476.3 |
| 2012/0070612 A1 | 3/2012 | Lee et al. | |
| 2013/0108800 A1* | 5/2013 | Chakraborty | B05D 3/062 |
| | | | 427/407.1 |
| 2015/0259589 A1* | 9/2015 | Takagi | C09D 201/00 |
| | | | 252/75 |
| 2015/0266258 A1 | 9/2015 | Vlassiouk et al. | |
| 2015/0368439 A1* | 12/2015 | Wu | C08K 9/06 |
| | | | 524/262 |

OTHER PUBLICATIONS

International Search Report for PCT/US2017/043183 mailed on Oct. 6, 2017.

Chandler, Borrowing from pastry chefs, engineers create nanolayered composites, MIT News, Jul. 21, 2016 [retrieved from the Internet: <URL:http://news.mit.edu/2016/stack-nanolayered-composites-0721>.

Notification Concerning Transmittal of International Preliminary Report on Patentability for PCT/US2017/043183 mailed Jan. 31, 2019.

* cited by examiner 9 layers, ~ 30 μm j = 1

36 layers, ~ 110 μm j = 2

144 layers, ~ 290 μm

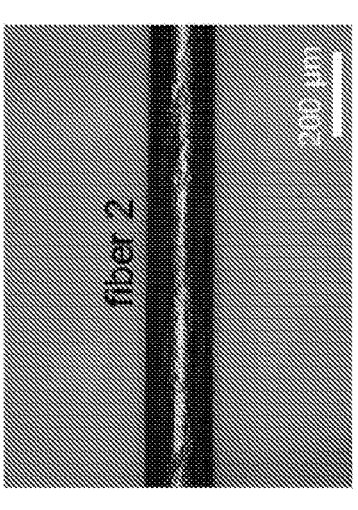
FIG. 11C
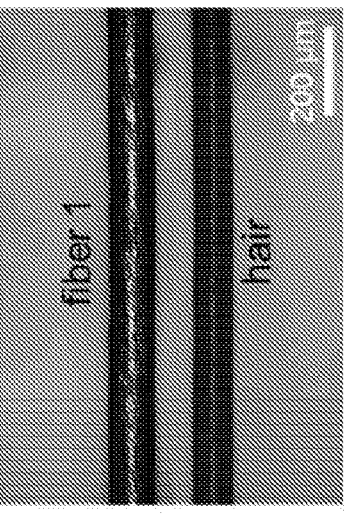
FIG. 10B
FIG. 10A (I) $V_G$ = 0.009%, 10 layer, ~ 31.0 μm thick (II) $V_G$ ≈ 0.082%, 40 layer, ~ 17.1 μm thick (III) $V_G$ = 0.185%, 80 layer, ~ 14.5 μm thick

LAYERED AND SCROLLED NANOCOMPOSITES WITH ALIGNED SEMI-INFINITE GRAPHENE INCLUSIONS AT THE PLATELET LIMIT

CLAIM OF PRIORITY

This application claims priority under 35 USC 371 to International Application No. PCT/US2017/043183, filed on Jul. 20, 2017, which claims the benefit of prior U.S. Provisional Application No. 62/364,396 filed on Jul. 20, 2016, each of which is incorporated by reference in its entirety.

TECHNICAL FIELD

This invention relates to nanocomposites.

BACKGROUND

The concept of nanocomposites is motivated by the observation that filler particles can stiffen and strengthen otherwise softer materials such as polymers to form lightweight, sturdy composites when processed correctly. Eshelby first demonstrated this possibility mathematically for ellipsoidal 'inclusions' in a solid. See, J. D. Eshelby, *Proc. R. Soc. London, Ser. A* 241, 376 (1957), which is incorporated by reference in its entirety. However, in practice, it has proven exceedingly difficult to insert closely spaced but distinctly separated nanoparticles within a material, a fundamental requirement for strengthening it. For anisotropic nanoparticles, such as platelets, nanofibers, or nanotubes, mechanical reinforcement can occur at very low volume fractions of the added filler, since the particles can align along preferential axes of strain. See X. Wang et al., *Mater. Res. Lett.* 1, 19 (2013), Z. Zhou et al., *Carbon* 75, 307 (2014), H. Liu, L. C. Brinson, *Compos. Sci. Technol.* 68, 1502 (2008), P. M. Ajayan, J. M. Tour, *Nature* 447, 1066 (2007), and C.-W. Nan, Q. Jia, *MRS Bull.* 40, 719 (2015), each of which is incorporated by reference in its entirety. But for a platelet filler, such as graphene or other 2D materials, a unique limit can be realized as the aspect ratio, a, of the aligned plates approaches to infinity. A closely-spaced stack of aligned, semi-infinite plates of nanometer or atomic thickness approaches a limit of maximal mechanical reinforcement at minimal platelet addition per mass of material. It has only recently become possible to test this a→∞ limit with the development of chemical vapor deposition (CVD) methods of creating single unit cell or atom thickness films, such as graphene and other 2D materials which can span the physical dimensions of a composite large enough for testing. See A. Reina et al., *Nano Lett.* 9, 30 (2009), X. Li et al., *Science* 324, 1312 (2009), and Y.-H. Lee et al., *Adv. Mater.* 24, 2320 (2012), each of which is incorporated by reference in its entirety.

SUMMARY

In one aspect, a composite can include alternating layers of a first layer including a 2D material and a second layer including a polymer matrix.

In another aspect, a method of making a composite can include:
(1) depositing a layer including a polymer;
(2) depositing a layer including a 2D material in the layer including the polymer; and
(3) repeating step (1) and step (2) to make stacked layers.

In certain circumstances, the method can further include quadrant-folding the stacked layers.

In certain circumstances, the method can include segmenting the stacked layers into quadrants and stacking.

In certain circumstances, the method can include hot-pressing the stacked layers.

In another aspect, a method of making a composite can include:
(1) preparing a substrate;
(2) depositing a layer including a polymer;
(3) depositing a layer including a 2D material on the layer including the polymer;
(4) repeating step (2) and step (3) to make stacked layers; and
(5) scrolling the stacked layers by exerting a transverse shear force.

In certain circumstances, the substrate can be a wafer. For example, the shear force can be exerted by two wafers.

In certain circumstances, the method can include depositing the layer including the polymer by spin-coating.

In certain circumstances, the method can include depositing the 2D material by chemical vapor deposition (CVD).

In certain embodiments, the 2D material can include graphene, graphyne, borophene, germanene, silicene, $Si_2BN$, stanene, phosphorene, molybdenite, or a single atom layer of metals. For example, the 2D material can be graphene.

In certain embodiments, the polymer matrix can include a polyolefin, polyacrylate, polyester, polycyanate, polystyrene, polyamide or other polymer or blend thereof. For example, the polymer matrix can include a polycarbonate.

Other aspects, embodiments, and features will be apparent from the following description, the drawings, and the claims.

BRIEF DESCRIPTION OF THE DRAWINGS

FIG. 1A shows 4$^i$ stacking method for planar composites: (I) spin-coating of PC solution and etching out copper, (II) stacking i layers of G/PC films, (III) cutting/folding, and (IV) stacking and hot-pressing at 37 MPa and 155° C. FIGS. 1B-1D are scanning electron microscope (SEM) images of the planar composites with i=9 (3570 nm/layer, $V_G{\approx}0.009\%$), j=1, and 2, respectively. FIG. 1E shows the transverse shear method for scrolled nanocomposite fiber: (E1) a single layer of G/PC film supported on $Si/SiO_2$ substrate, (E2) the supported film with folds at one end created by a glass capillary, (E3) the scrolling of the film by the transverse shear force exerted by the two $Si/SiO_2$ wafers, and (E4) a scrolled fiber with Archimedean spiral pattern in the cross-section plane. FIG. 1F shows the optical microscope image of fiber 2 with d=160±4 μm. FIGS. 1G-1I show SEM images of fiber 2 with d=131±3 μm in the cross-section plane, scaling bars are 20, 10, and 5 μm, respectively.

FIG. 2A shows Raman spectra of CVDG/PC composites (1 layer) and PC matrix control. FIG. 2B shows Raman spectra of G/PC composites ($V_G{\approx}0.030\%$) with layer number (n) of 1, 9, and 144; the spectroscopy intensity was normalized by n. FIG. 2C shows plots of $-lg(I_{2D}/n)$ against n for G/PC composites with $V_G{\approx}0.009\%$ and 0.030%.

FIG. 3A shows the storage modulus (E') and loss modulus (E") vs.

temperature curves of two 40-layer planar composites with $V_G$≈0.185% and 0.082%, and PC matrix control. FIG. 3B shows E' and E" vs. temperature curves of fiber 1 ($V_G$≈0.185%), fiber 2 (0.082%), control-1 and control-2 (with similar scroll structure). FIG. 3C shows a comparison of the elastic modulus increase ($\Delta$E and $\Delta$E') with respect to the PC matrix, against $V_G$ of planar composites and scrolled fibers with reported data of various G/PC composites. FIG. 3D shows the ideal telescoping mechanism (I). In practice, deformation occurs internally in the bulk of the fiber and not near the gripped fiber ends; the optical image of the scrolled fiber 2 in tensile with diameter=120±2 μm at 60% strain (II) and at break (III and IV); SEM image of scrolled fiber (control-1) at break (V), demonstrating layer separations during failure. FIG. 3E shows true stress-strain responses of two composite fibers and their PC matrix control fibers with similar scroll structures.

FIG. 4A shows a microprobe system for simultaneously testing the electrical properties of the CVDG/PC composite, a tungsten microprobe mounted on the motorized translation stage system has a shaft diameter of 80 μm tapering to a 100 nm tip. FIG. 4B shows periodic current cycles formed by the contact and disengagement of the microprobe with CVDG/PC composite surface. FIG. 4C shows the electric current curves versus depth trace during the microprobe movement (1.00 μm/s, 1.0 mV) and penetration process for three similar CVDG/PC composite samples ($V_G$≈0.003%, 4 layers). FIG. 4D shows the histogram profiles of the value distribution (count) of electric current signals measured in C (red one). FIGS. 4E-4F show SEM images of a typical fracture site on the composite film punched by the microprobe, scale bars are 20 and 10 μm, respectively.

FIG. 7A shows the ratio between the intensity of the 2D peak at 2680 cm⁻¹ from graphene and that of the C—O stretch of PC at 1230 cm⁻¹ ($I_{2D}/I_{PC,C—O}$) against the volume ratio of CVD graphene to PC ($V_G/V_{PC}$). FIG. 7B shows Raman spectra of CVD graphene/PC composite films ($V_G$≈0.009%) with various layer numbers of 1, 4, 9, 36 and 144 layers, 8 wt % PC solution was used during the spin-coating and the intensity of each spectroscopy has been divided by the layer number. FIG. 7C shows physical model to understand Raman signal intensity of an n-layer composite by laser detector.

FIG. 8A shows the transmittance of G/PC composite films ($V_G$≈0.030%) with 1, 9, and 36 layers. FIG. 8B shows the plot of the transmittance of G/PC ($V_G$≈0.030%) composites against layer number n, a linear increase was found, in accordance with the Lambert-Beer law.

FIG. 9A shows thermal expansion of iodine monochloride-graphite intercalation compound (ICl-GIC) yielding expanded graphene (EG) that is expanded by over 300× along the direction orthogonal to the plane (c axis), its density <8 mg/cm³. FIG. 9B shows SEM image of the EG with a view perpendicular to c axis. FIG. 9C shows the impregnated EG in styrene solution. FIG. 9D shows PS-embedded EG sample. FIG. 9E shows SEM image of the polystyrene-intercalated graphene composite with an evidencing layer structure, polystyrene is in white color while EG in dark grey.

FIG. 10A shows photos of fiber 1 scrolled from G/PC film (average thickness 180 nm, $V_G$≈0.185%), fiber 2 from G/PC film (410 nm, 0.082%), and a human hair. FIG. 10B shows optical images of the fiber 1 with d=105±2 μm, the same hair is included for comparison. FIG. 10C shows optical image of fiber 2 with d=160±4 μm.

FIG. 14A shows plot of the Young's modulus and their linear fit (dashed line) of the layered composites in the longitudinal direction ($E_{longitudinal}$) measured by uniaxial tension (strain rate=0.002 s⁻¹, room temperature, and 0.5-2.5% strain) against $V_G$, the theoretical $E_{longitudinal}$ curve (dotted one) predicted by eq. 1 with $E_G$=360 GPa was included. FIG. 14B shows typical engineering stress-strain curves of G/PC (1 wt %) (10 layer, $V_G$≈0.185%) and PC control in stain of 0-0.5% (the inserted one) and 0-2.5%, linear fitting curves in strain of 0.5-2.5% were also included. FIG. 14C shows the storage modulus (E') vs. strain curve of PC control (bulk) and G/PC (2 wt %) ($V_G$=0.082%, 40 layer) measured by DMA at 30° C. and 1 Hz, note that the strain rate of each data point=strain/(¼ s).

FIG. 15A shows a sample indentation load vs. depth hysteresis the composite sample G/PC ($V_G$≈0.082%, 320 layer, 110 μm). FIG. 15B shows microindentation load vs. depth hystereses for a 320-layer G/PC ($V_G$≈0.082%, 110 μm thick) composite sample and a maximum indentation depth ($h_{max}$) of 10.4 μm. FIGS. 15C-15D show the optical images of indentations on the PC matrix control sample (scale bar=100 μm) and the composite sample G/PC ($V_G$≈0.185%) (scale bar=10 μm), respectively. FIG. 15E shows Young's elastic modulus ($E_{microindentation}$) and linear fit against $V_G$ (dashed line, based on rule of mixtures), for layered composites (where $V_G$ was estimated from sample thickness measured by scanning electron microscopy).

FIG. 17A shows the differential scanning calorimetry (DSC) curves and $T_g$s of G/PC ($V_G$≈0.009%) (144 layers), G/PC ($V_G$ ti 0.03%) (144 layers), G/PC ($V_G$ ti 0.082%) (40 and 320 layers, they are the same), PC control2 (layered) (160 layers, with the same interlayer thickness as G/PC ($V_G$≈0.082%)), G/PC ($V_G{\approx}0.185\%$) (160 layers), and PC control1 (layered) (160 layers, with the same interlayer thickness as G/PC ($V_G{\approx}0.185\%$)). FIG. 17B shows the storage modulus (E') and loss modulus (E') vs. temperature curves of PC-control (bulk), PC-control (180 nm/layer, 80 layer) measured by DMA 0.34% strain (amplitude 20 μm) and frequency=1 Hz.

FIG. 19A shows in-situ fiber imaging of fiber 2 ($V_G{\approx}0.082\%$) in tensile test. FIGS. 19B-19C show true stress versus true strain for various scrolled control-1 and PCG-1 fibers (fiber 1, $V_G$=0.185%). FIGS. 19D-19E show scrolled control-2 and PCG fiber-2 (fiber 2, $V_G{\approx}0.082\%$) specimens. FIG. 19F shows the true stress-strain curve of various PC control films with thickness in range of 7-12.5 μm.

FIG. 20A shows the entire setup was housed in a grounded Faraday cage and all electrical components were shielded with aluminum foil and grounded to minimize electrical noise. FIG. 20B shows the piezo-nanopositioner amounted with a tungsten microprobe for the penetration test of the sample on the stage. The sample was placed on the force sensor system to measure the applied force simultaneously. FIG. 20C shows a tungsten microprobe (Model 7XH, SE Technologies Corp.) with a shaft diameter of 80 μm a diameter of as low as 100 nm at the tip end was amounted on the piezo-nanopositioner for the penetration test. FIG. 2D shows the tip approach to the surface and penetration process was monitored remotely from a video camera.

DETAILED DESCRIPTION

Disclosed herein are composites and fabrication methods that can take a thin layer of molecular thickness and construct large composite stacks that scale exponentially with the number of processing steps. The stacks can include a 2D material layer and a polymer layer. An analogous shear scrolling method can create Archimedean scroll fibers from single layers with similar scaling. The methods can produce materials that demonstrate the a→∞ limit while combining electrical and optical properties at minimal volume fraction of filler.

Two-dimensional (2D) materials can uniquely span the physical dimensions of a surrounding composite matrix in the limit of maximum reinforcement. However, the alignment and assembly of continuous 2D components at high volume fraction remains challenging. A stacking and folding method can be used to generate aligned graphene/polycarbonate composites with as many as 320 parallel layers spanning 0.032 to 0.11 mm thickness that significantly increases the effective elastic modulus and strength at exceptionally low volume fractions of only 0.082%. For example, the layers can include 4 to 1,000 parallel layers. An analogous transverse shear scrolling method can generate Archimedean spiral fibers that demonstrate exotic, telescoping elongation at break of 110%, or 30 times greater than Kevlar. Both composites retain anisotropic electrical conduction along the graphene planar axis and transparency. These composites promise substantial mechanical reinforcement, electrical and optical properties at significantly reduced volume fraction.

A 2D material can include a material consisting of single layer of atoms that create a sheet molecular structure. In certain embodiments, a 2D material can include graphene, graphyne, borophene, germanene, silicene, $Si_2BN$, stanene, phosphorene, molybdenite, or a single atom layer of metals. The polymer layer can include a polyolefin, polyacrylate, polyester, polycyanate, polystyrene, polyamide or other polymer or blend thereof. For example, the polymer layer can be polycarbonate.

Figure 1A:
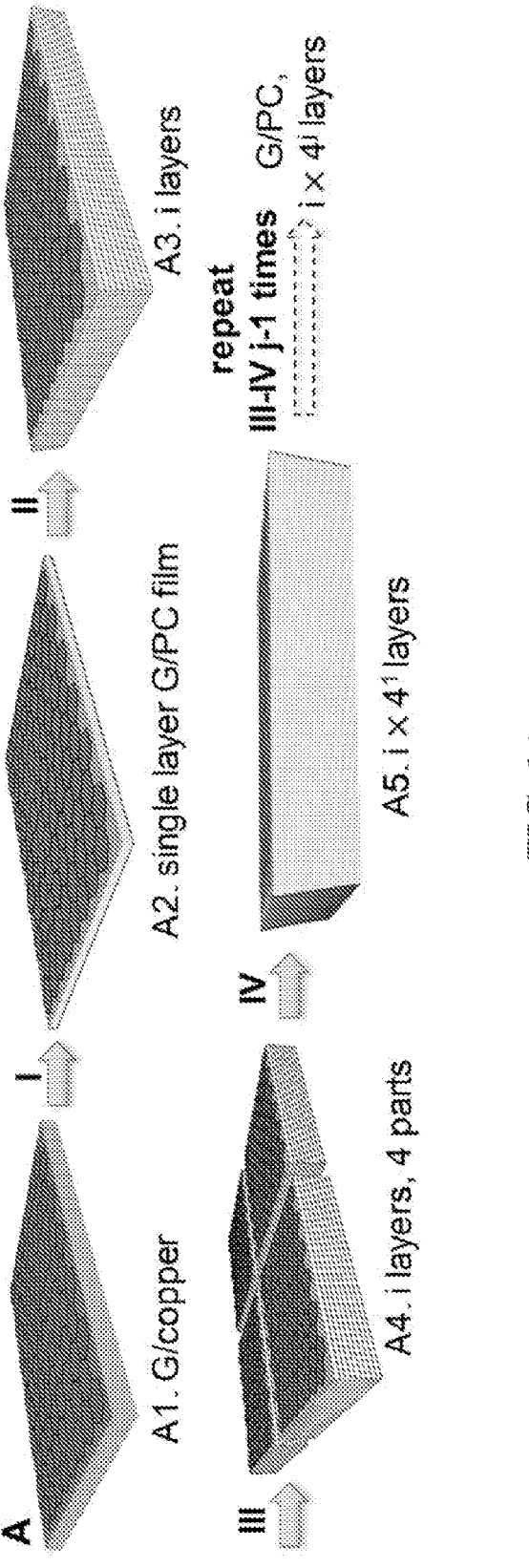
FIGS. 1A-1I show fabrication of graphene/polycarbonate (G/PC) composites with aligned, semi-infinite CVD graphene.
Figures 1B, 1C, 1D:
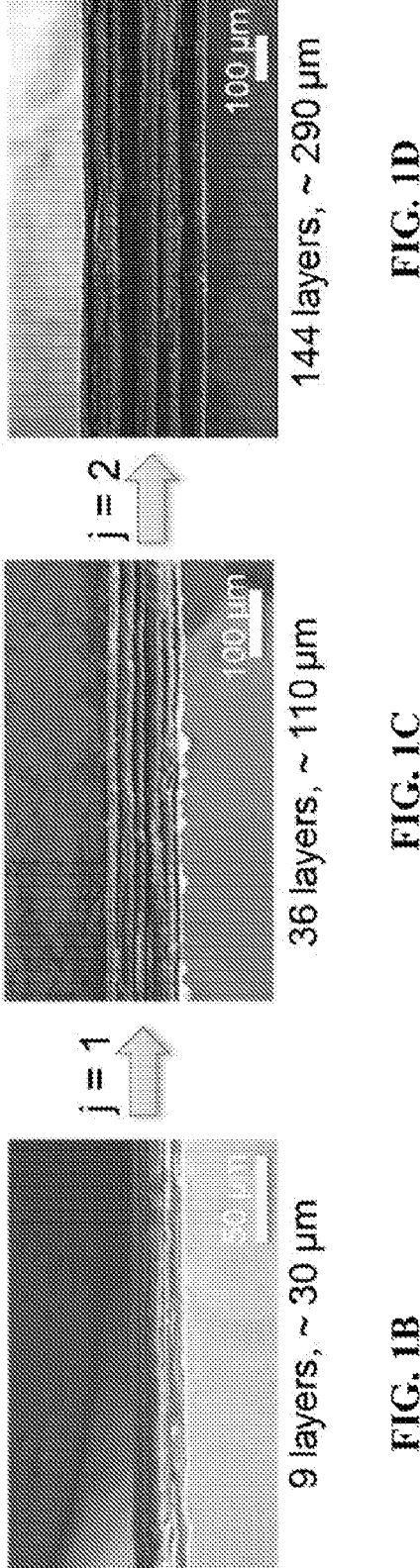
Figure 1E:
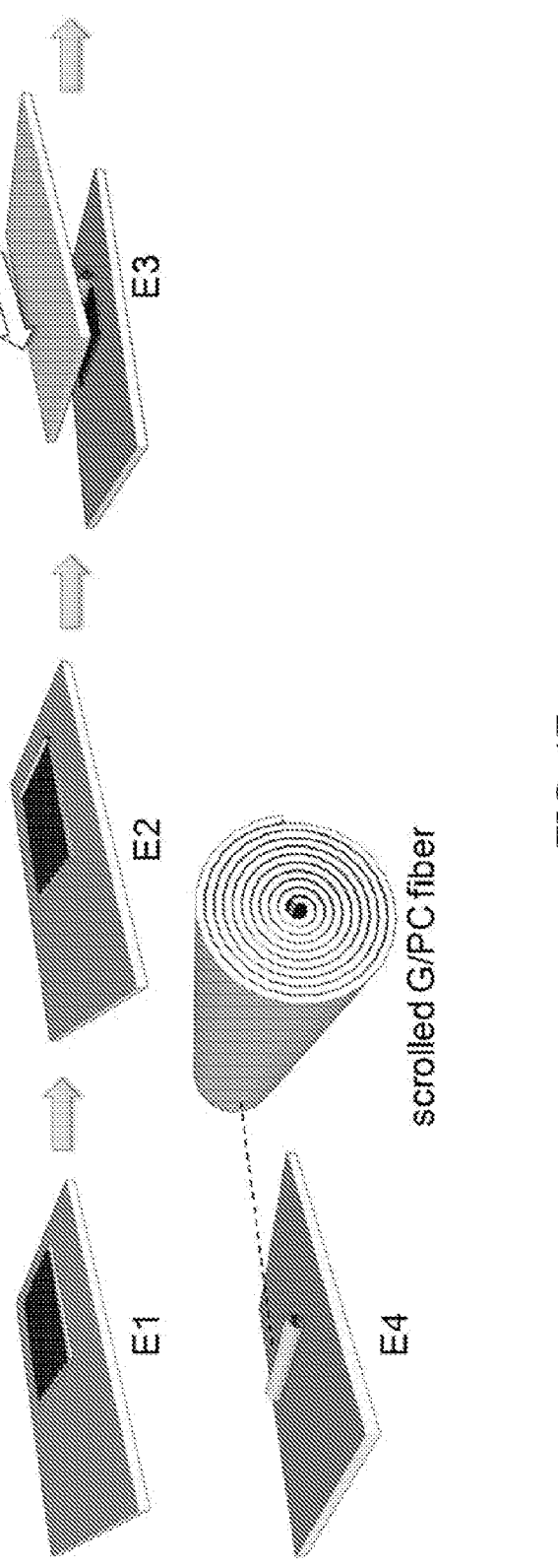
Figure 1F:
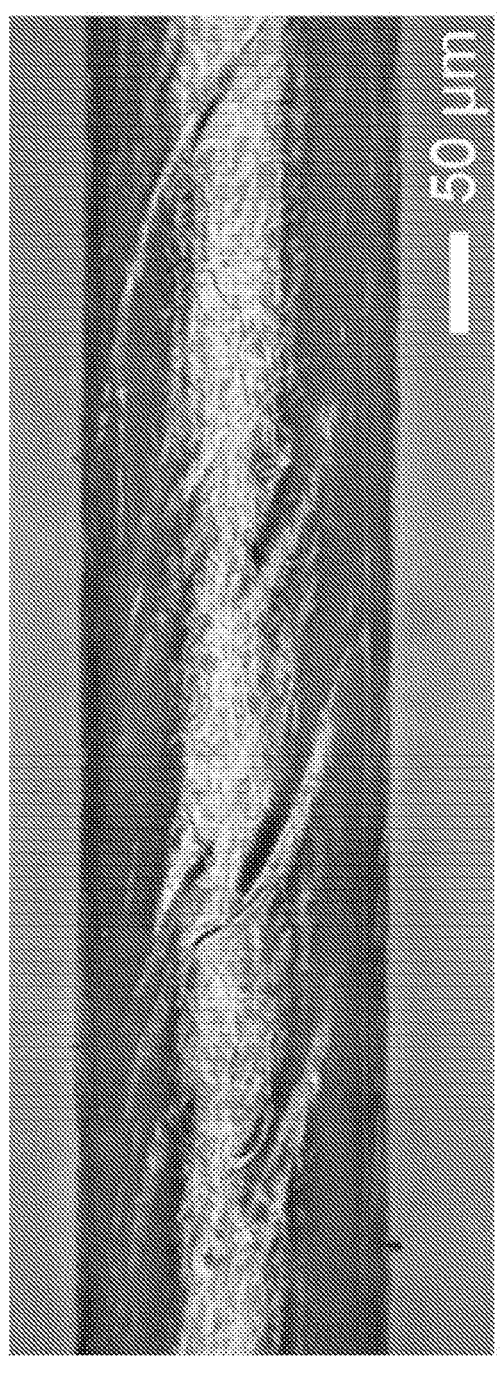
Figures 1G, 1H, 1I:
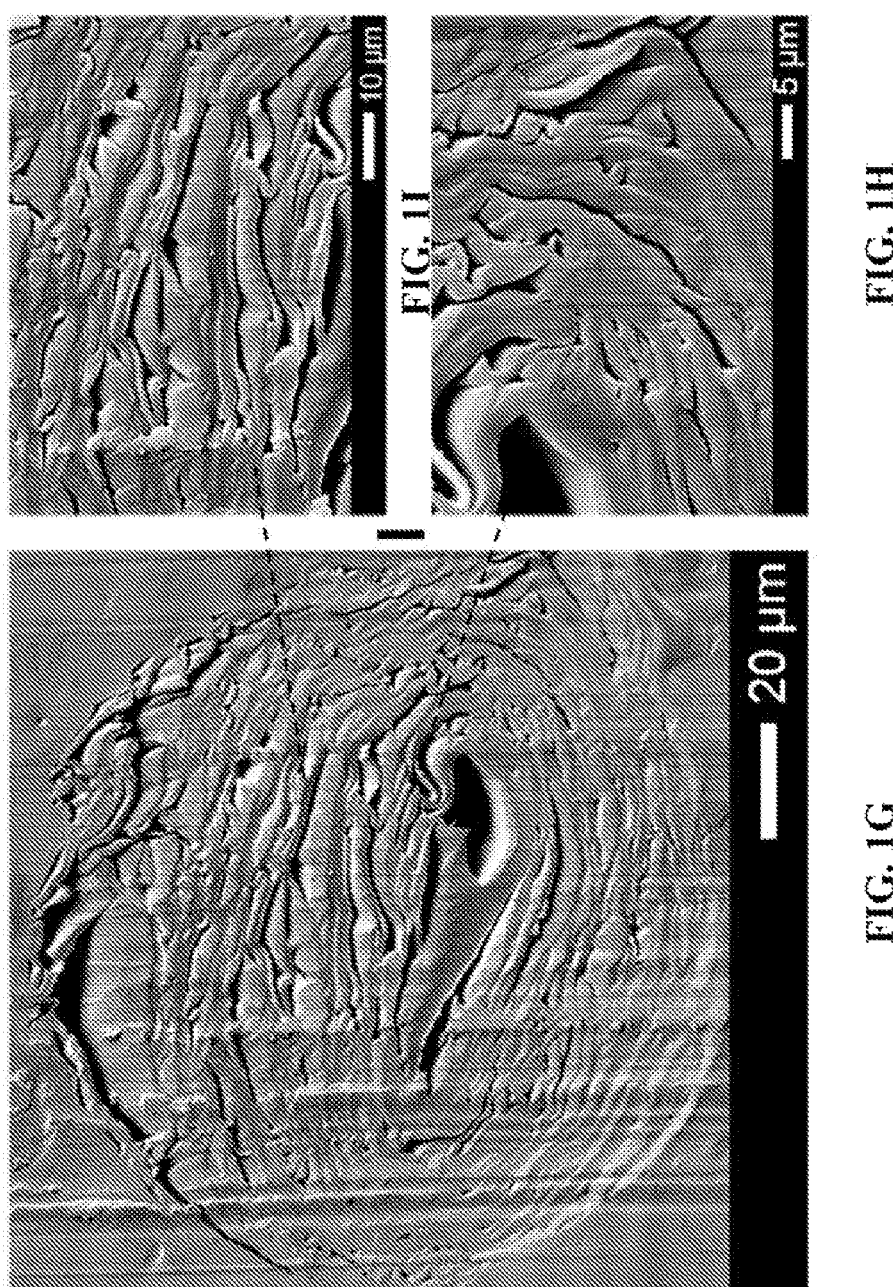
Figure 2A:
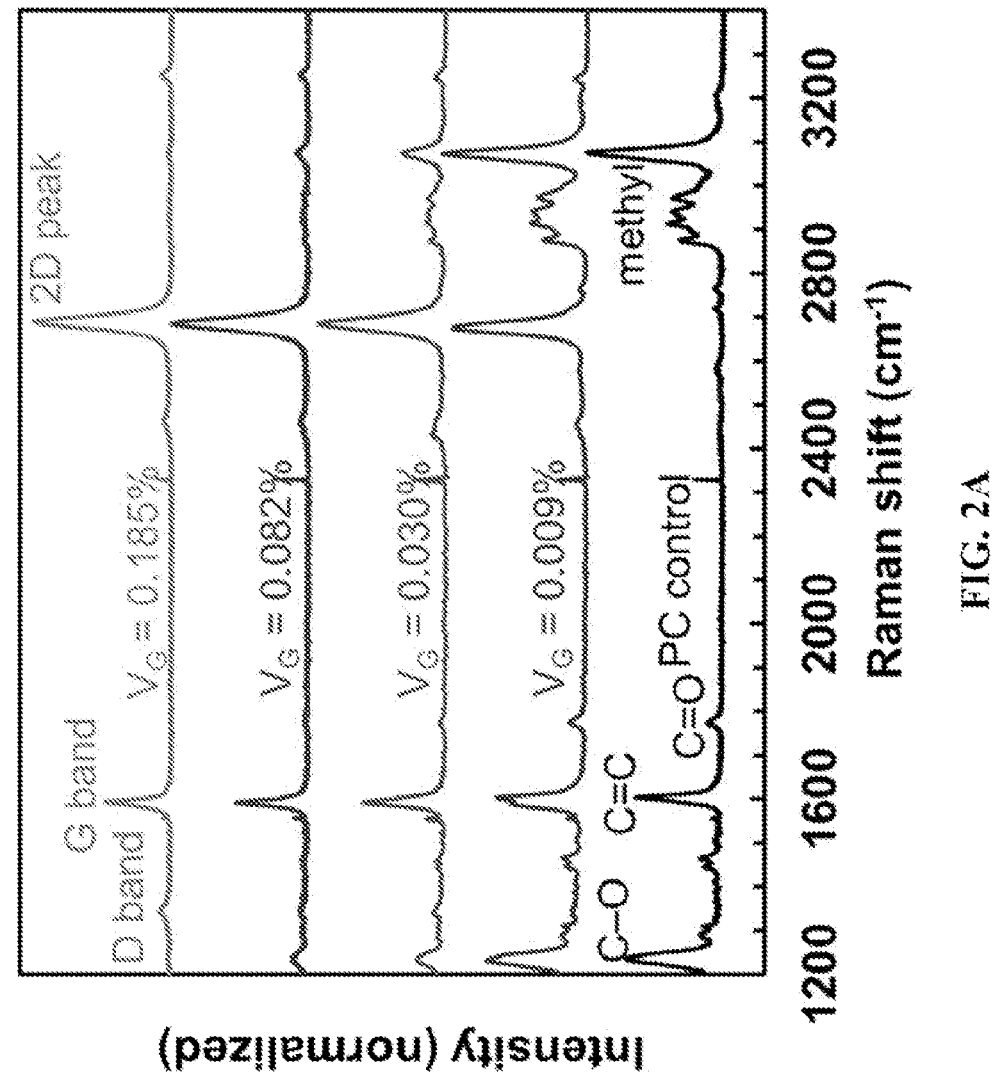
FIGS. 2A-2C show Raman spectrcopy study of CVDG/PC composites.
Figure 2B:
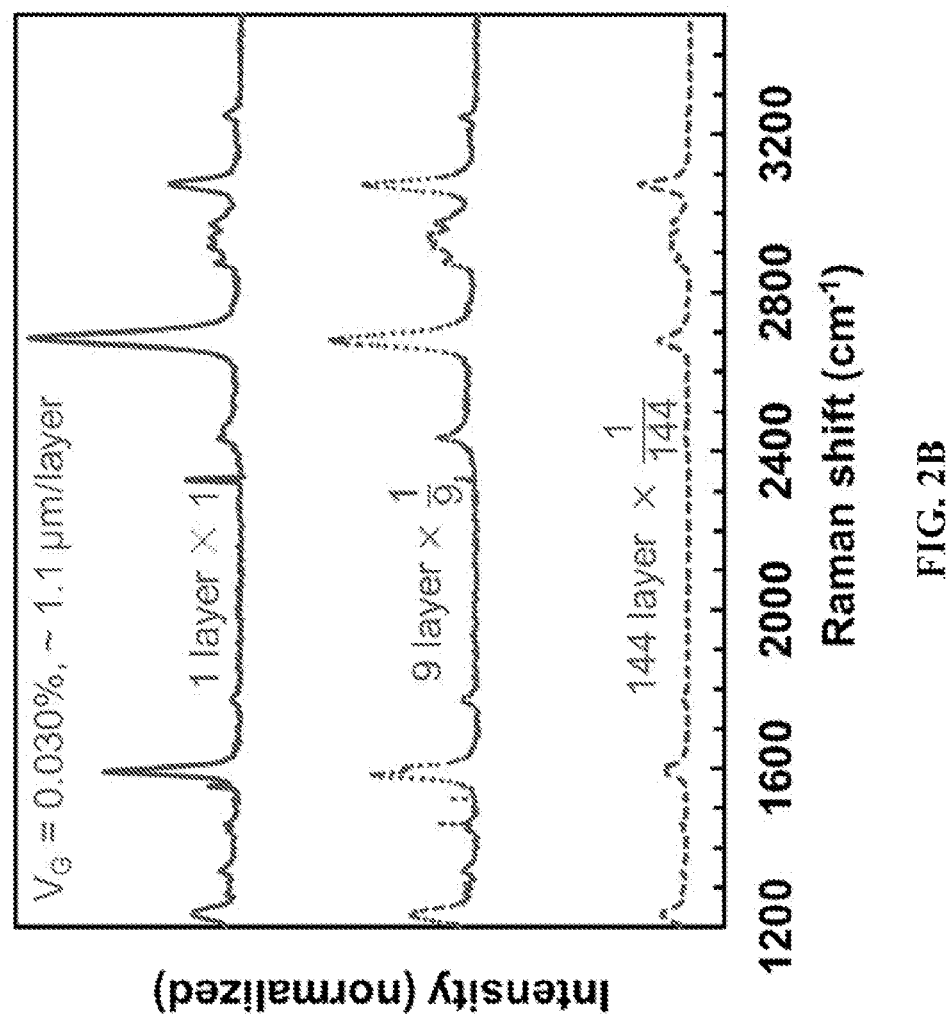
Figure 4A:
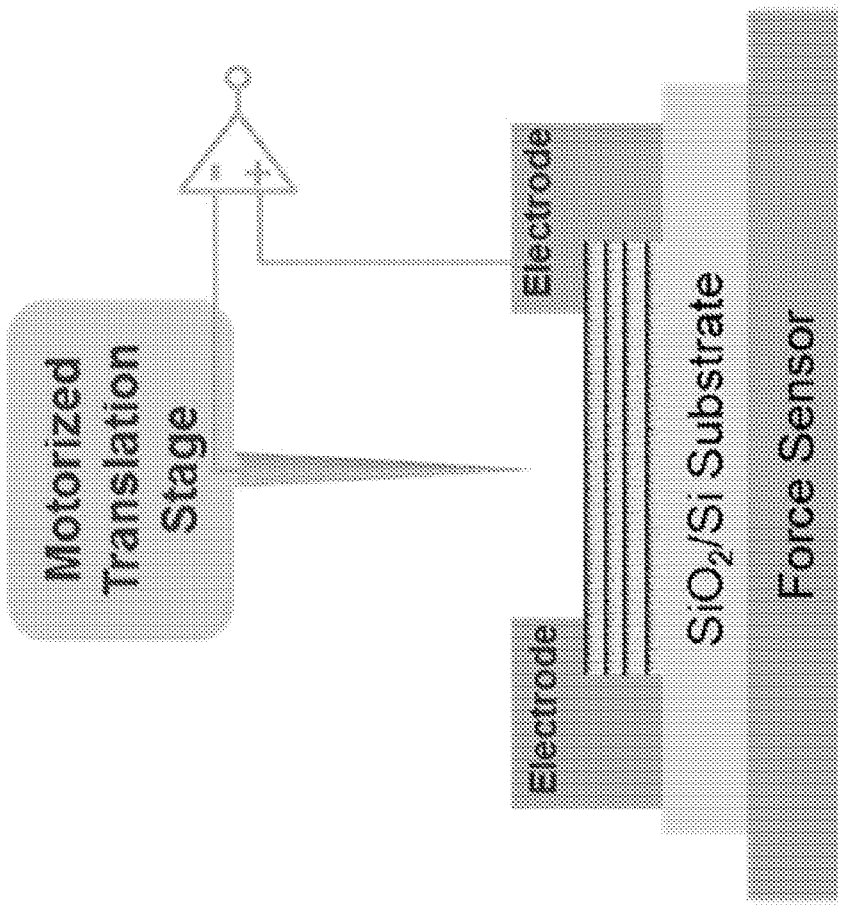
FIGS. 4A-4F show electric properties study of the planar composites.
Figure 4B:
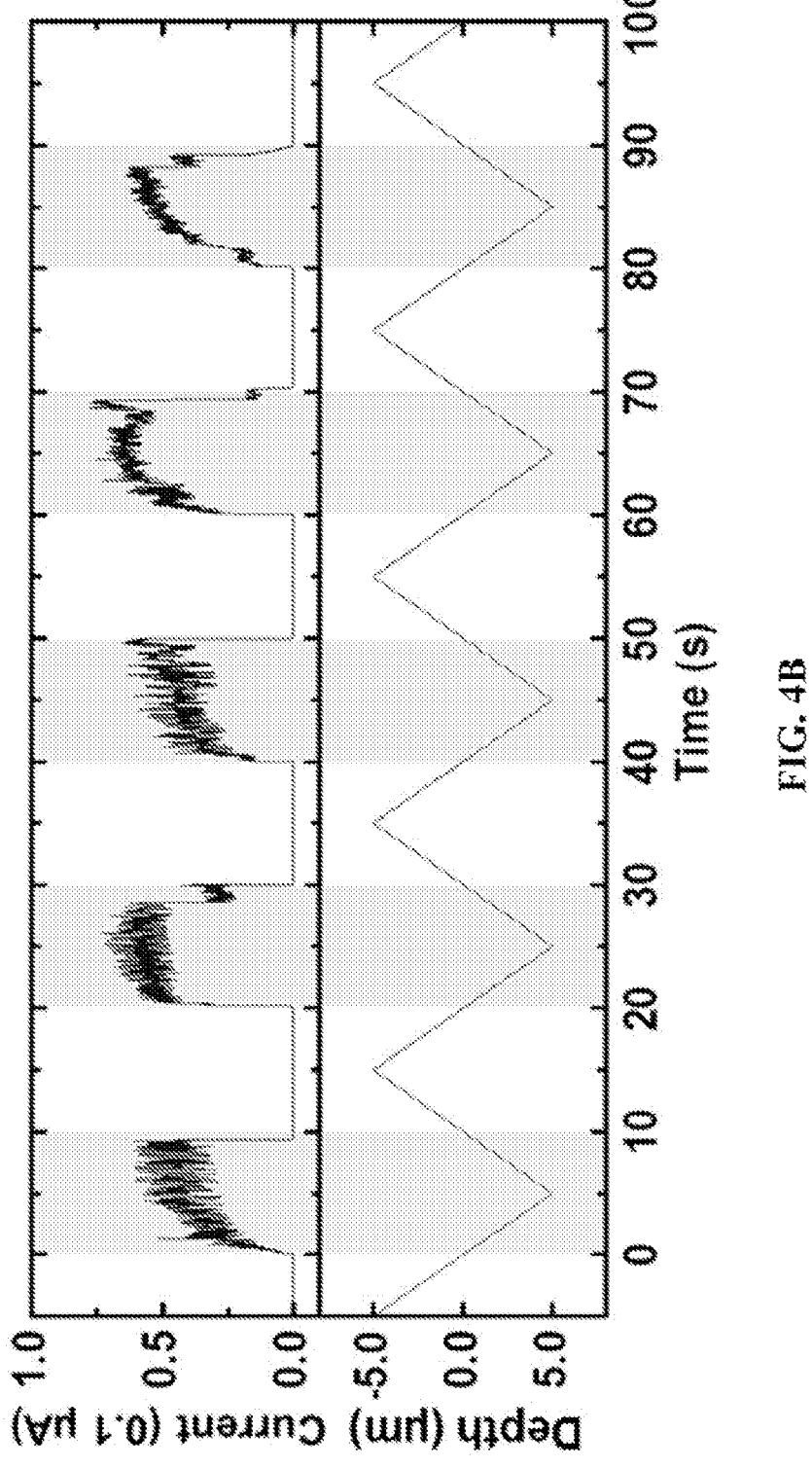
Figure 4C:
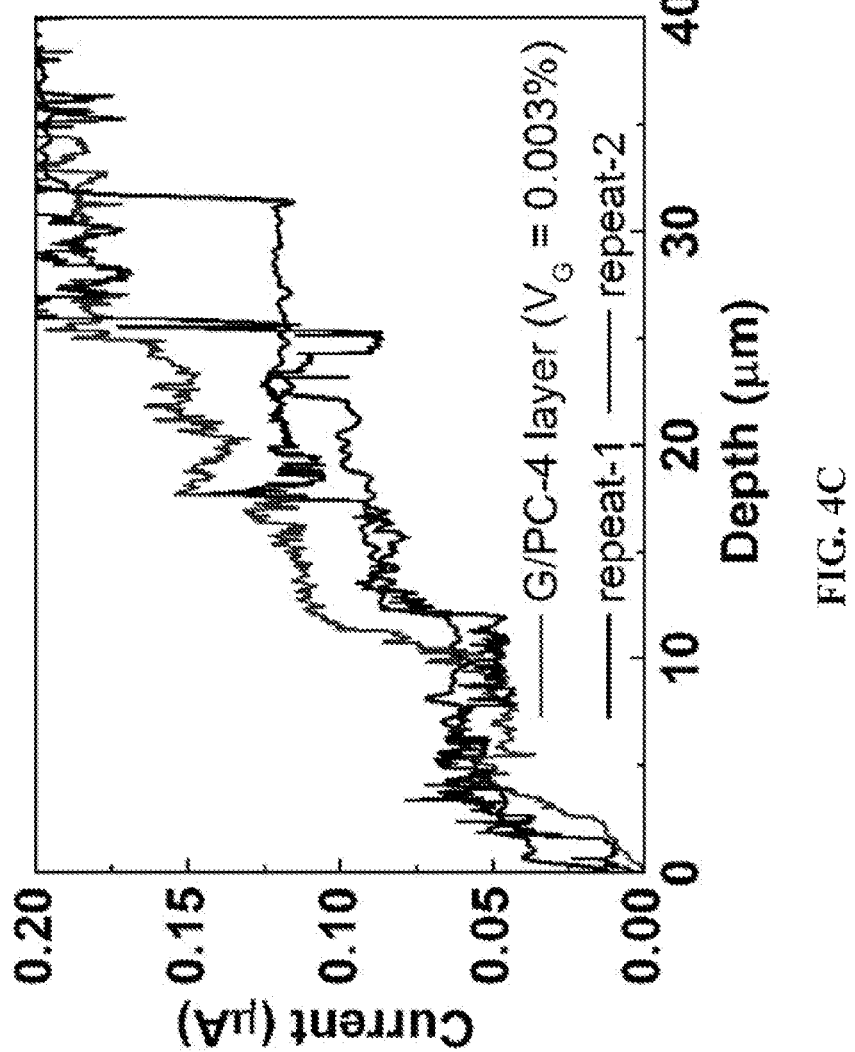
Figure 4D:
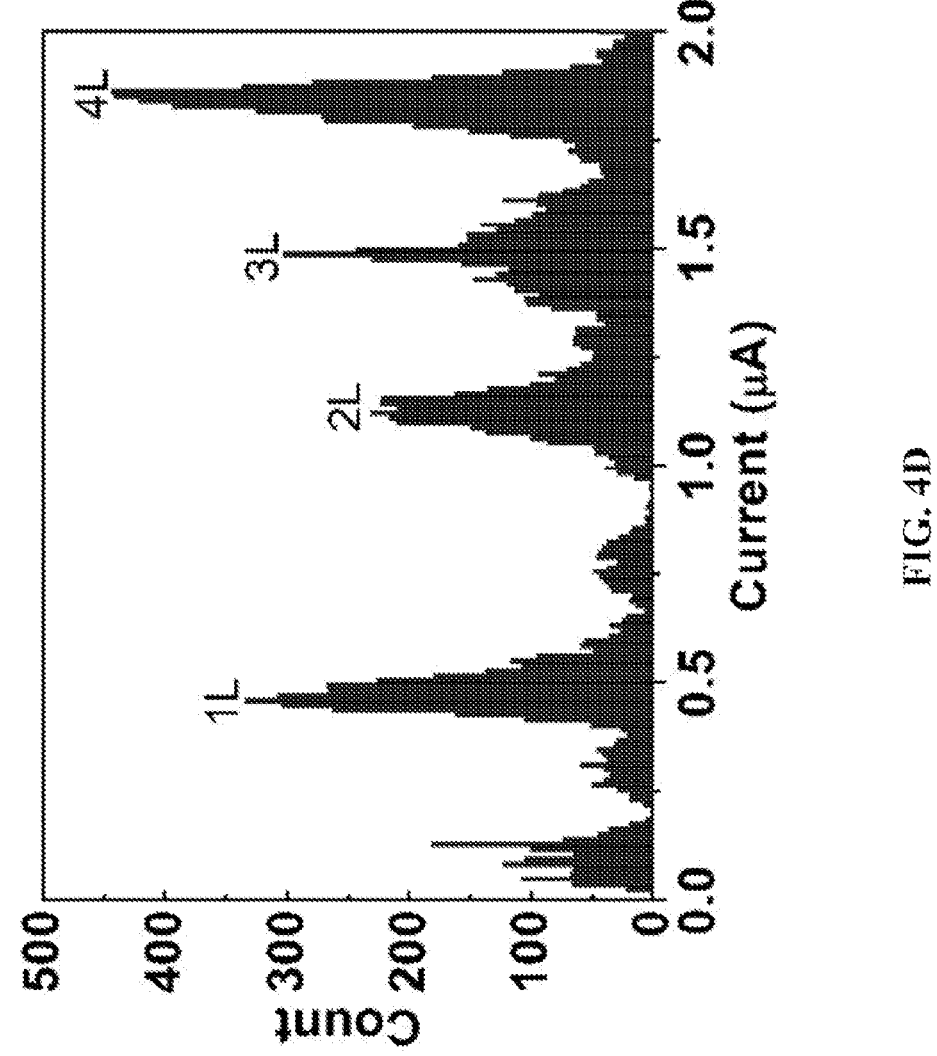
Figure 4F:
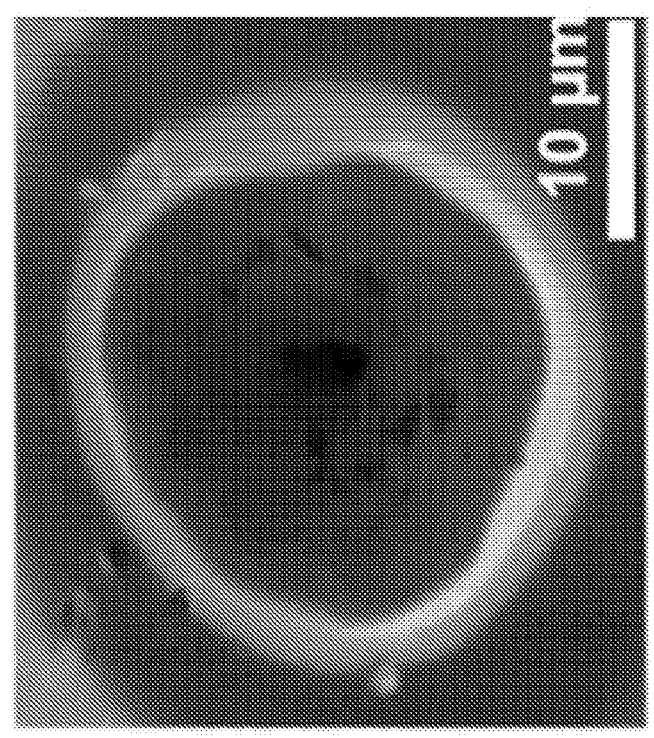
Figure 4E:
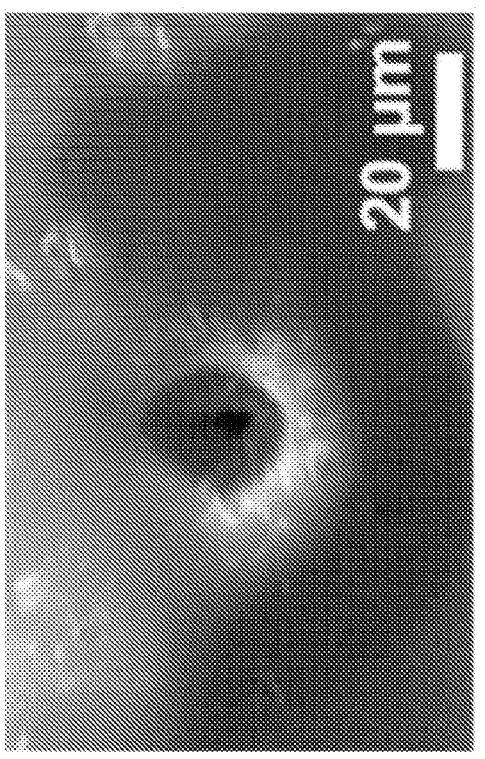
Figure 5:
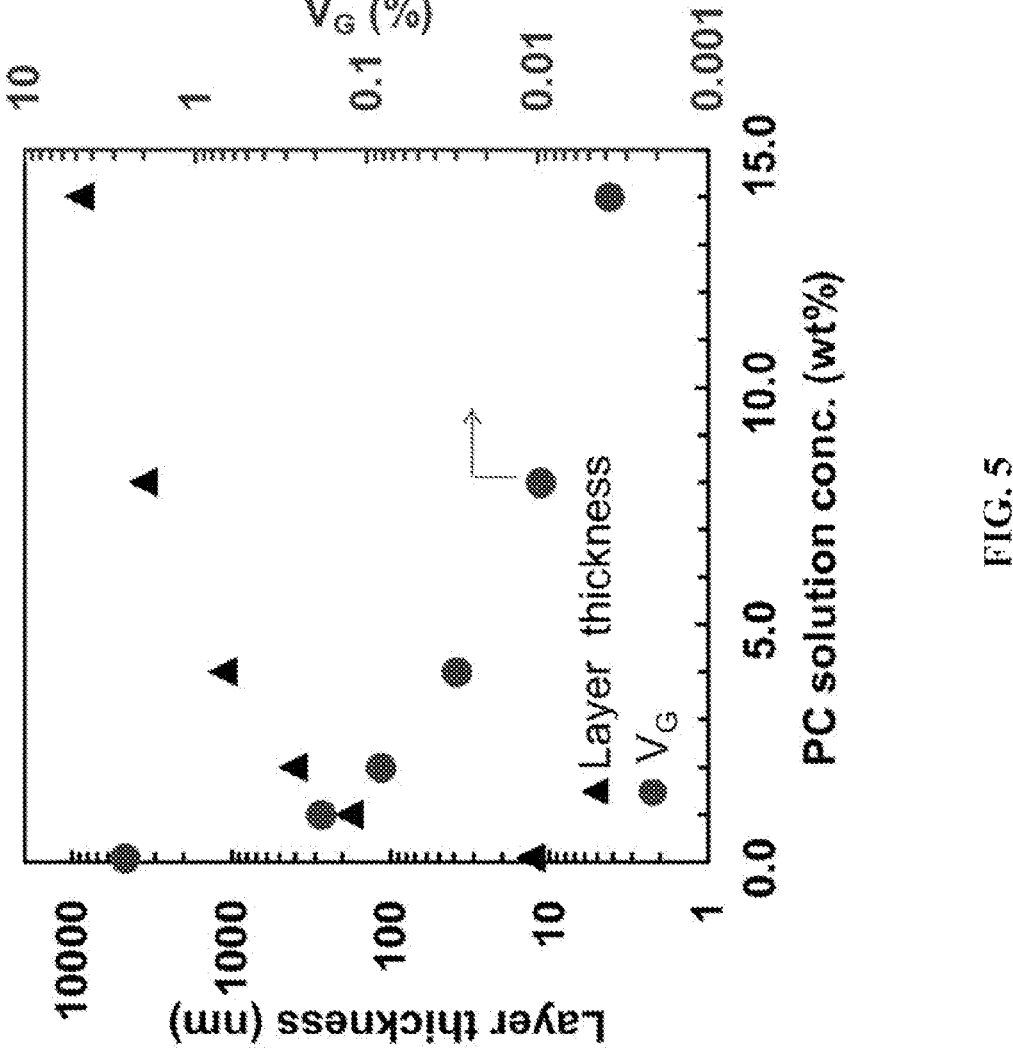
FIG. 5 shows dependencies of the average layer thickness of G/PC composite and $V_G$ on the concentration of PC solution used for spin-coating. The film thickness was measured by gravimetric method or ellipsometer (Table 1) and $V_G$=monolayer graphene thickness (≈0.34 nm (56)/film thickness.
Figures 7A, 7B:
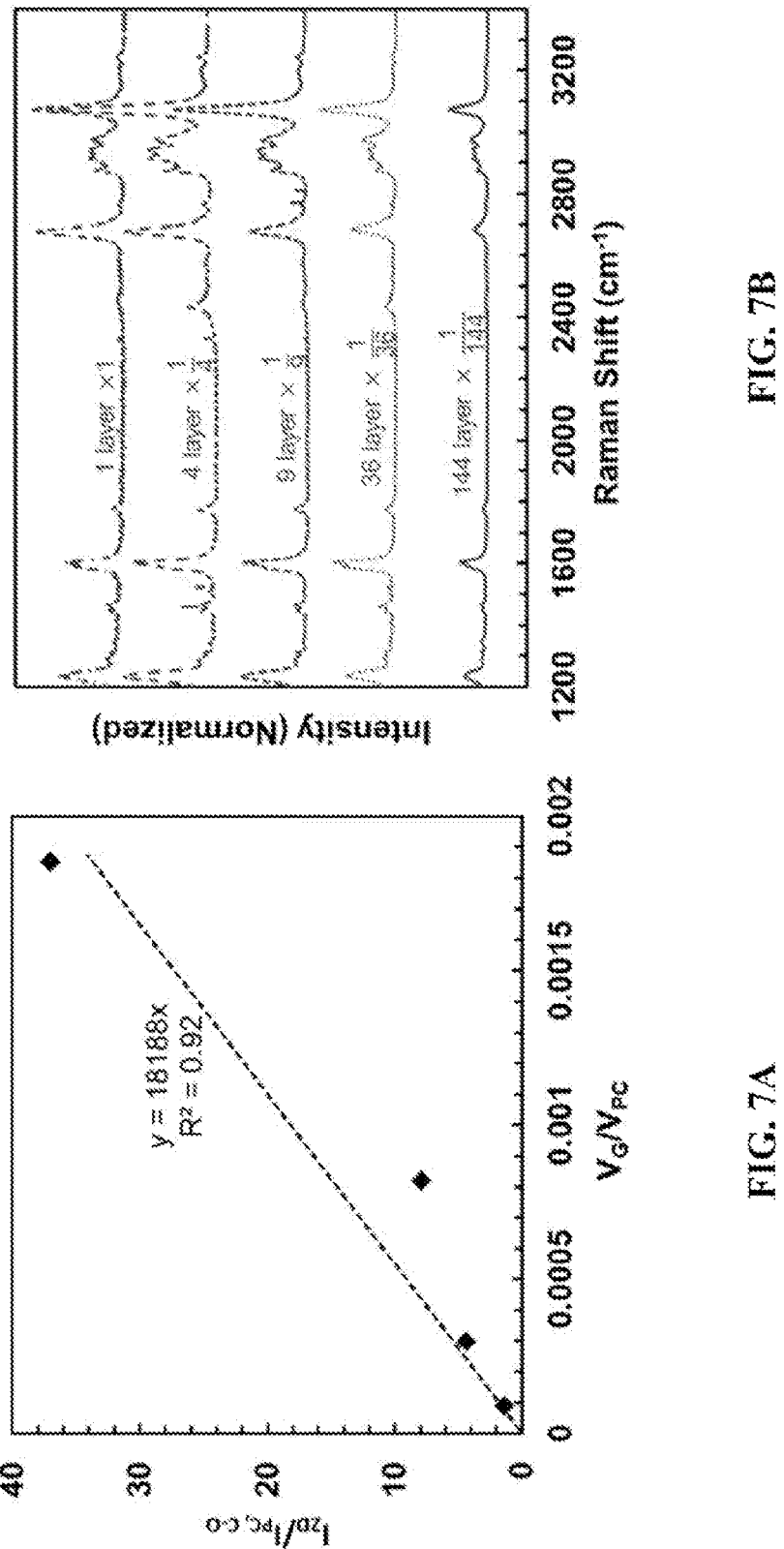
FIGS. 7A-7C show Raman spectroscopy characterization of layered composites.

The planar stacking method can generate a thickness that exponentially scales with each successive quadrant fold or segmentation, j, as $4^j$. A further hot-pressing promotes the interlayer integration (FIG. 1A). Replicating the process j times generates a nanocomposite of i×$4^i$ layers and a lateral dimension of W/$4^i$, where i is the initial stacking or number of layers and W is the initial width of the i-layer composite (FIGS. 1B-1D). For example, i is an integer ranging from 1 to 1,000. Polycarbonate (PC) is used as the polymer matrix due to its transparency and mechanical strength, creating bulk composites from CVD monolayer, polycrystalline graphene (FIG. 2A and see Q.-Y. Lin et al., *ACS Nano* 7, 1171 (2013), which is incorporated by reference in its entirety) with layer numbers of 8 to 320 and volume fractions ($V_G$s) of 0.003-0.185% (FIGS. 4-5 and Table 1). The intensity ratio of 2D peak to G peak ($I_{2D}/I_G$)=2.1 indicates the monolayer nature of graphene. A small D band at 1350 $cm^{-1}$ illustrating the polycrystalline nature of CVDG. See A. C. Ferrari et al., *Phys. Rev. Lett.* 97, 187401 (2006), which is incorporated by reference in its entirety. The resonance enhanced graphene Raman cross section is 18000 times larger than PC (FIG. 8A). The graphene layers appear intact upon this processing as the size of the translucent area containing graphene exhibits little change after each pressing step. Raman spectroscopy (FIGS. 2B-2C and 7) confirms that the absolute intensity of the graphene 2D peak ($I_{2D}$) decreases with increasing layer number approximately following a Lambert-Beer law (FIG. 7C):

$$-lg(I_{2D}/n) = kn + c \tag{1}$$

Figure 2C:
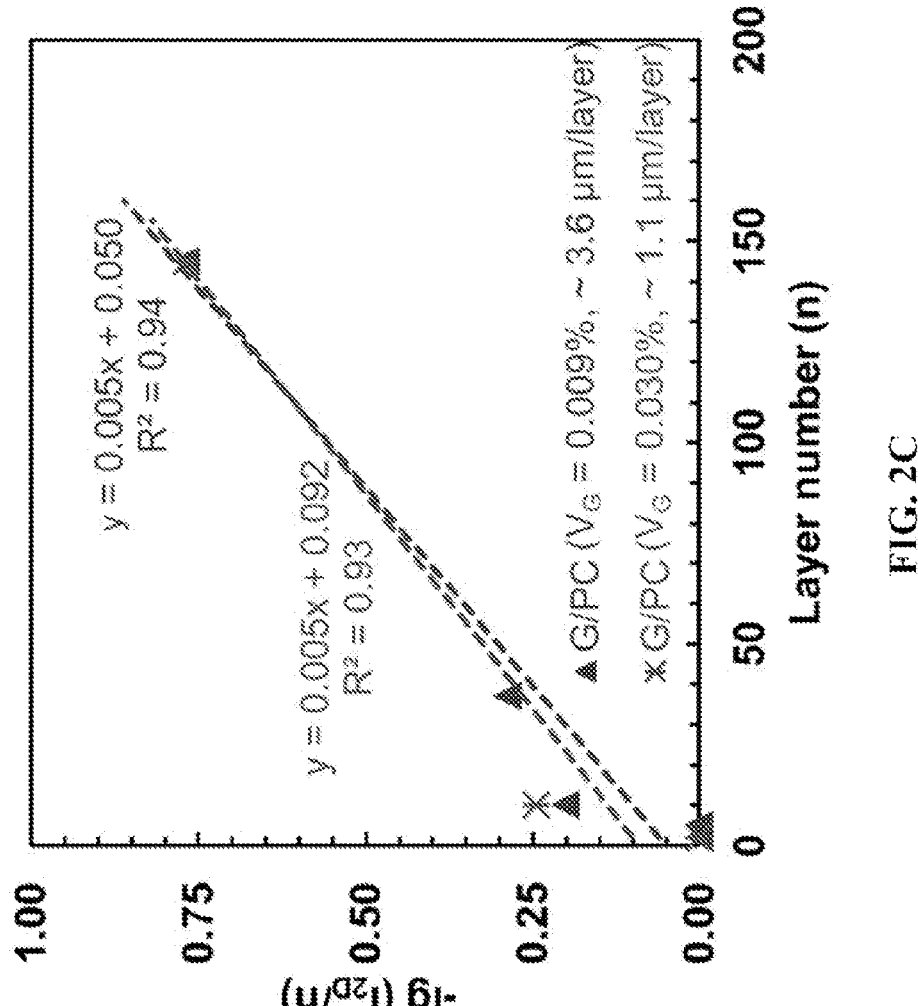
Figures 8A, 8B:
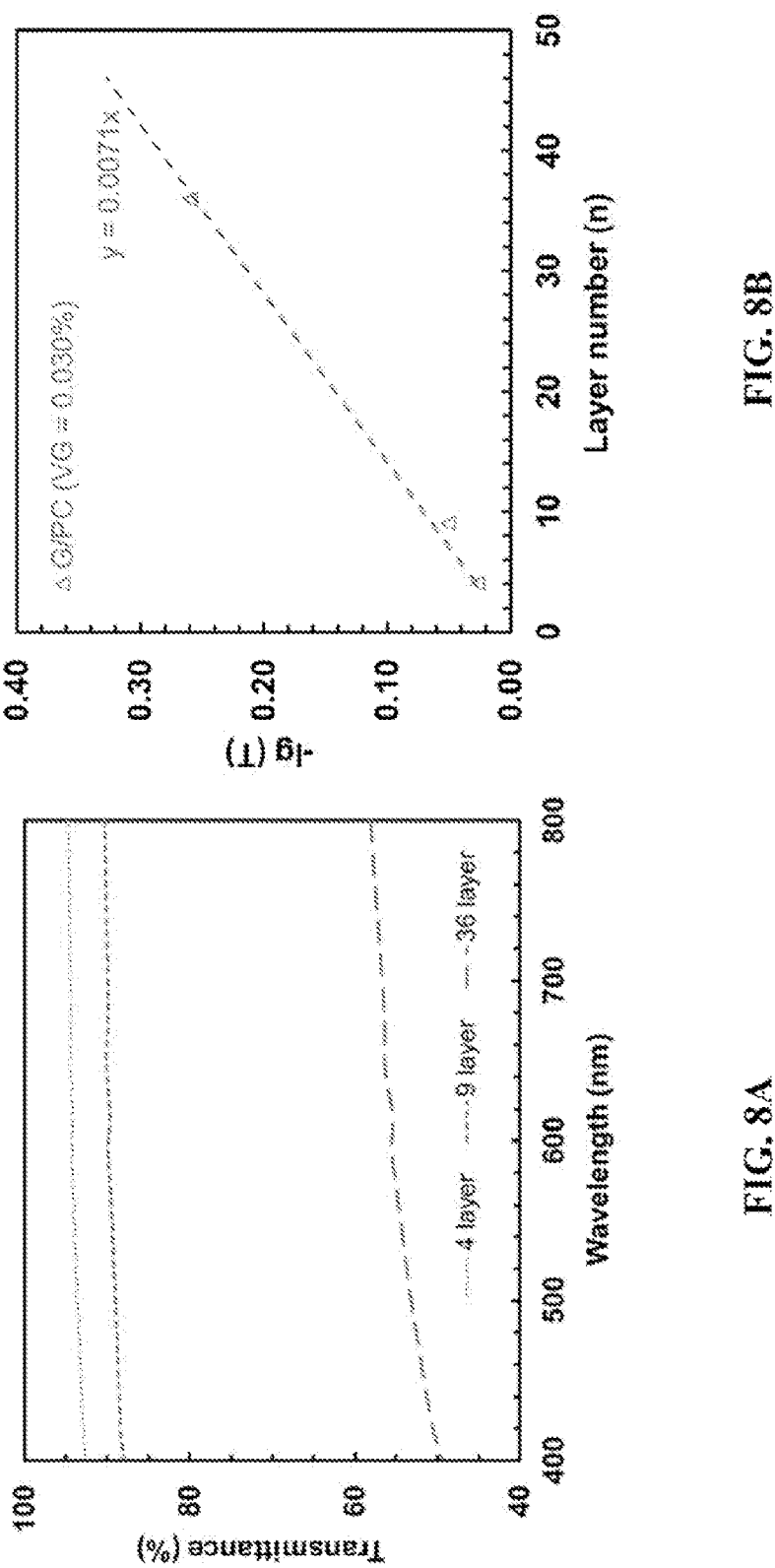
FIGS. 8A-8B show transmittance of layer composites and its dependence on layer numbers.
Figure 9A:
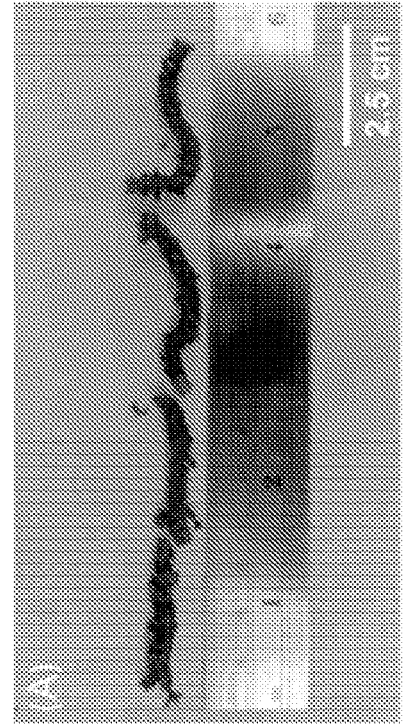
FIGS. 9A-9E show synthesis of polystyrene/graphene layered composite via monomer impregnation and in-situ polymerization within expanded graphite.
Figure 9A:
Figure 9B:
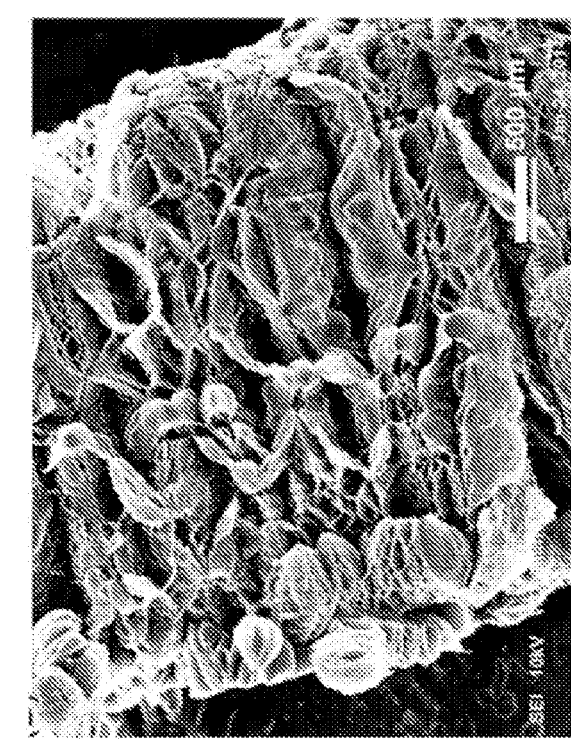
Figure 9D:
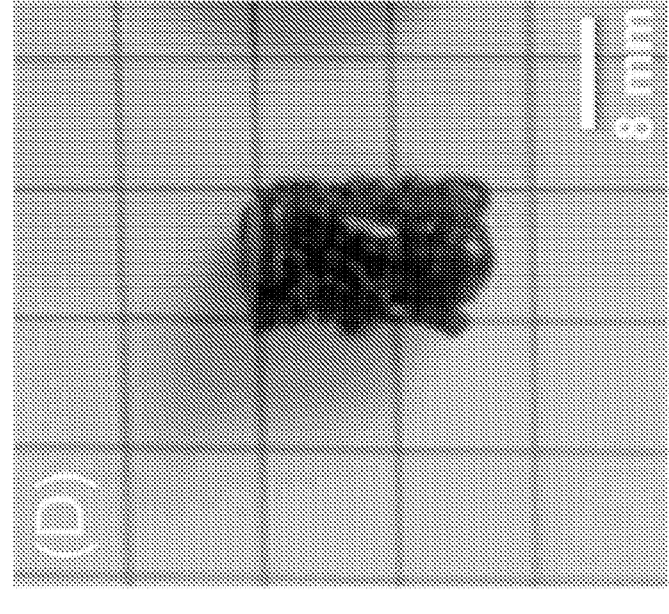
Figure 9D:
Figure 9C:
Figure 9E:
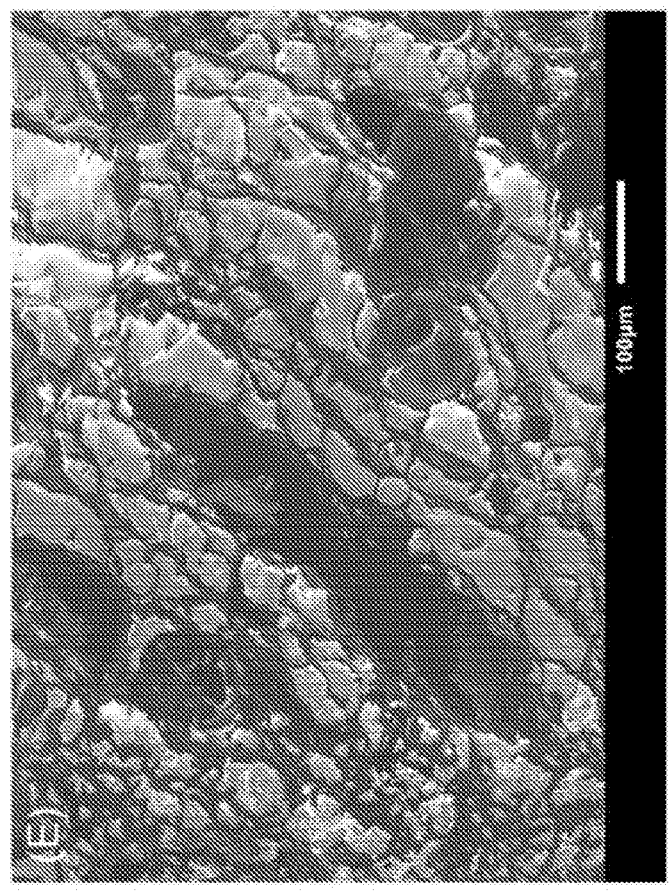
Figure 11C:
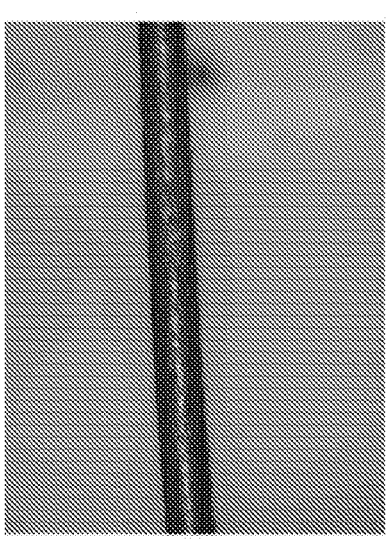
FIGS. 11A-11F show optical images of the various G/PC fibers with an average diameter d=105±2 μm and $V_G$≈0.185%. All images have a same scale bar of 200 μm.
Figure 11B:
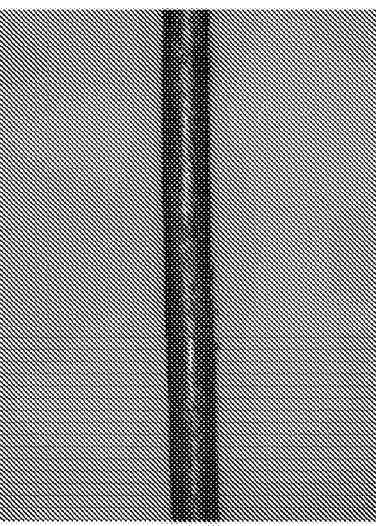
Figure 11A:
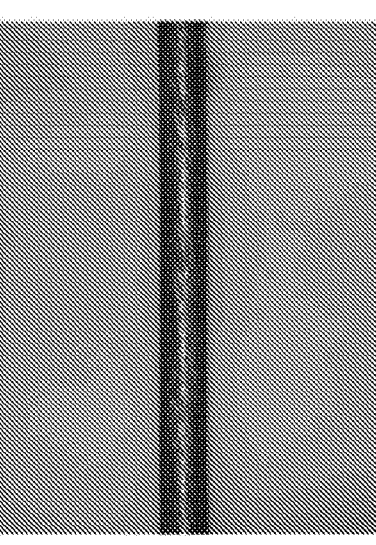
Figure 11F:
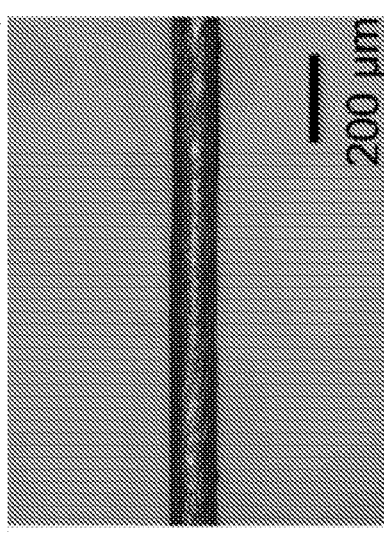
Figure 11E:
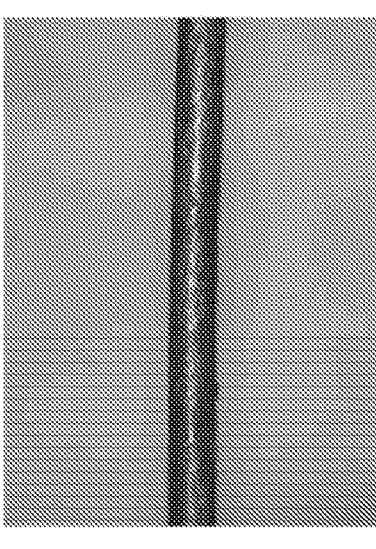
Figure 11D:
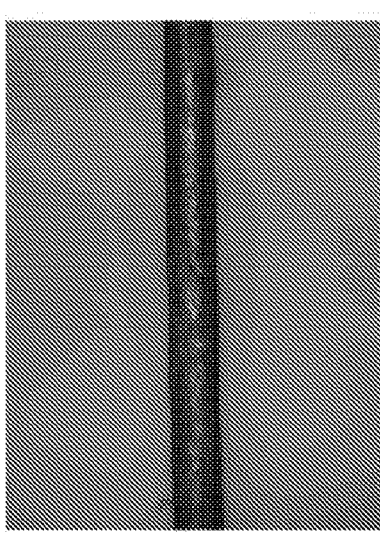
Figures 12A, 12B, 12C, 12D:
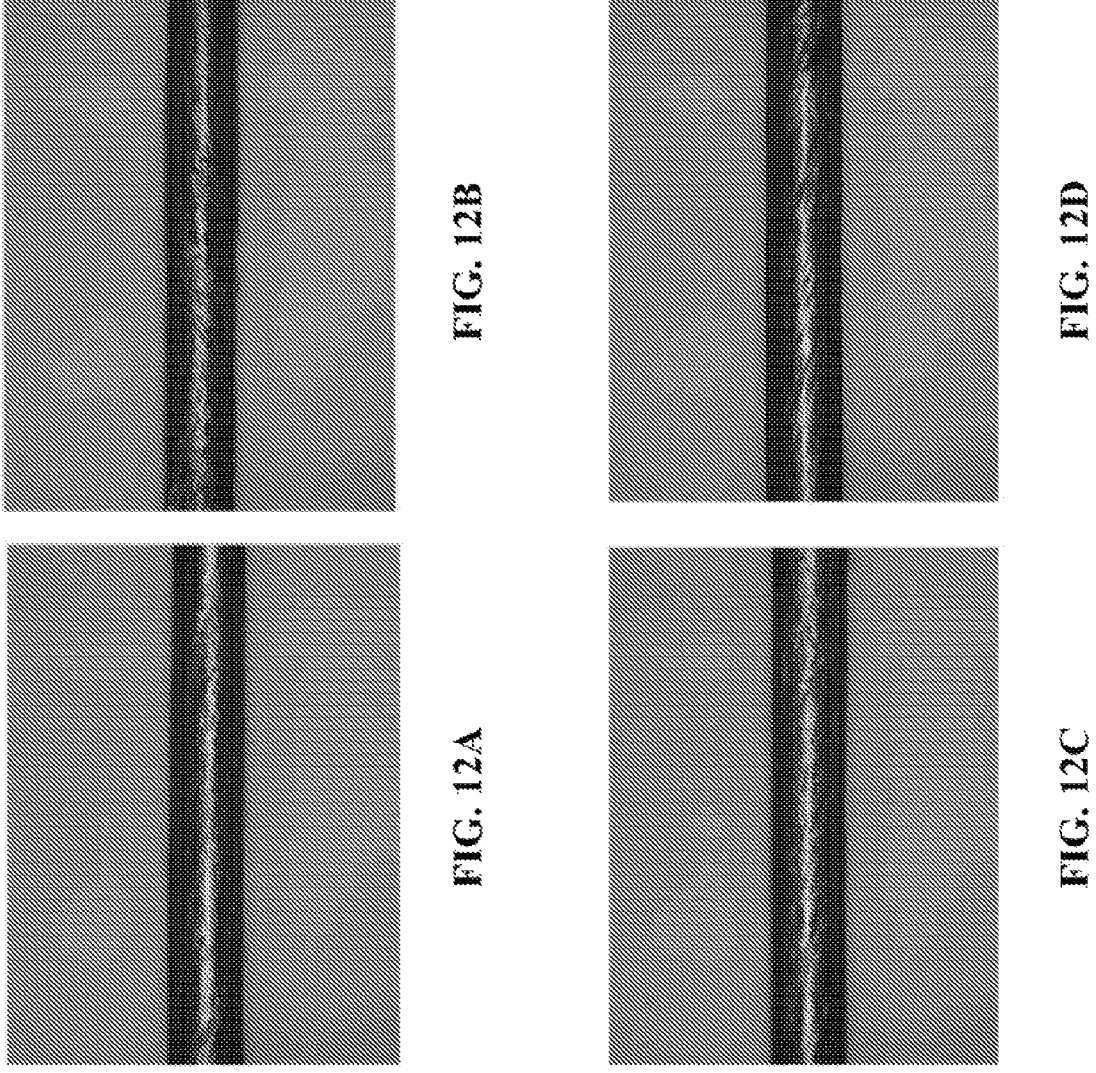
FIGS. 12A-12M show optical images of various G/PC (2 wt %) fibers with d=160±4 μm and $V_G$≈0.082%. All images have a same scale bar of 200 μm.
Figure 12G:
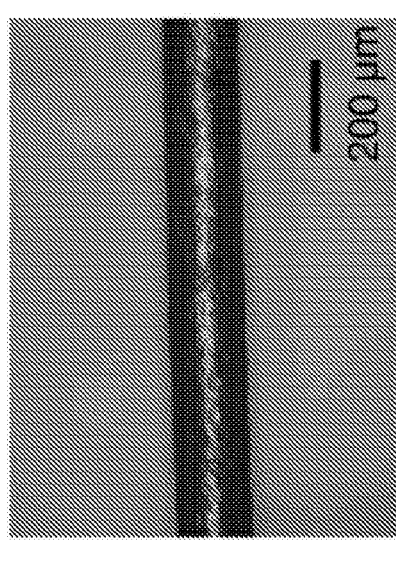
Figure 12F:
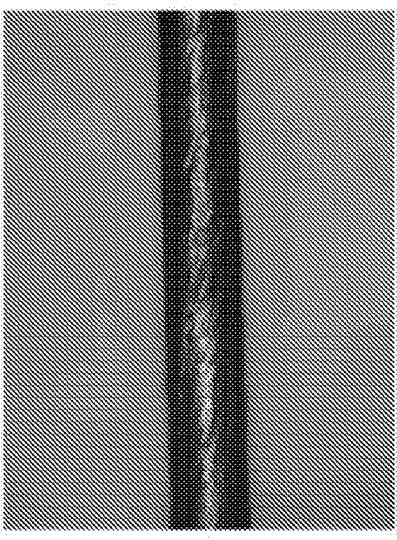
Figure 12E:
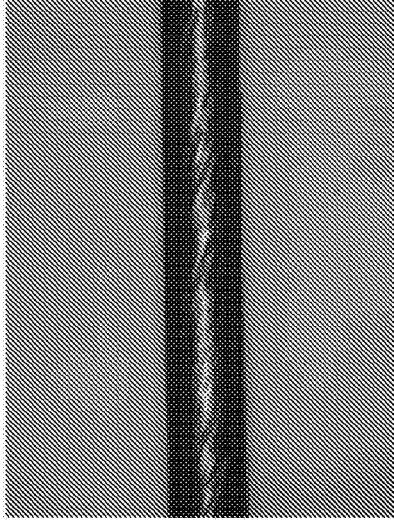
Figure 12J:
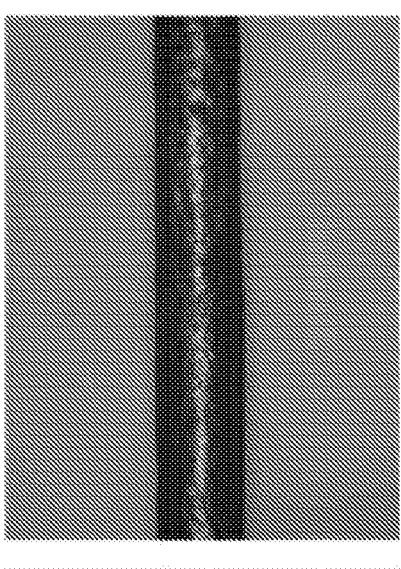
Figure 12I:
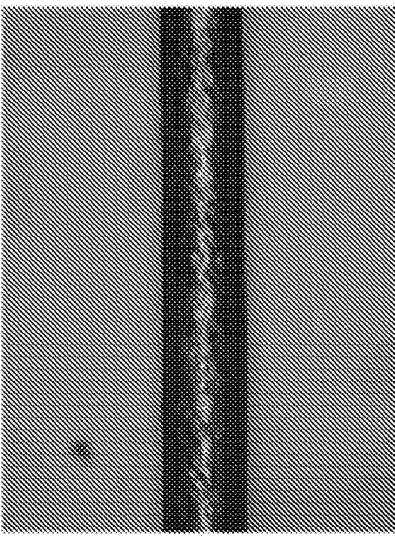
Figure 12H:
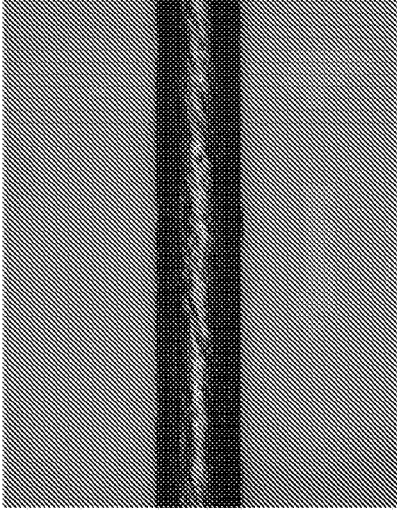
Figure 12M:
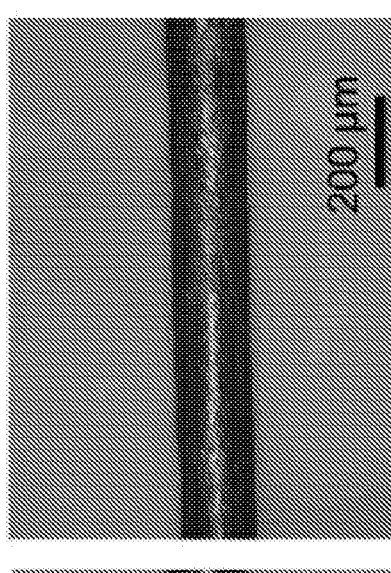
Figure 12L:
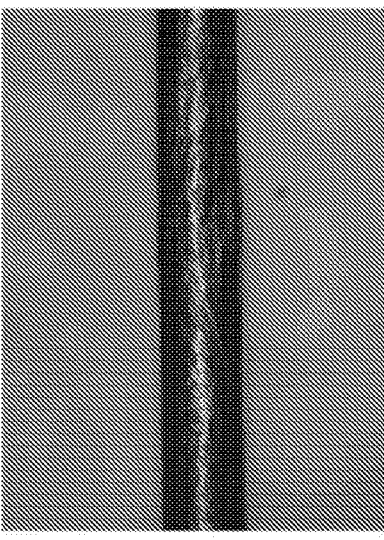
Figure 12K:
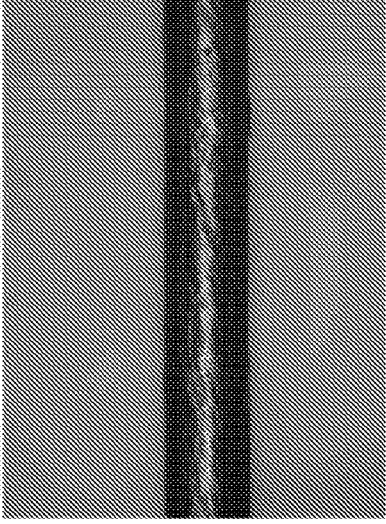
Figures 13A, 13B:
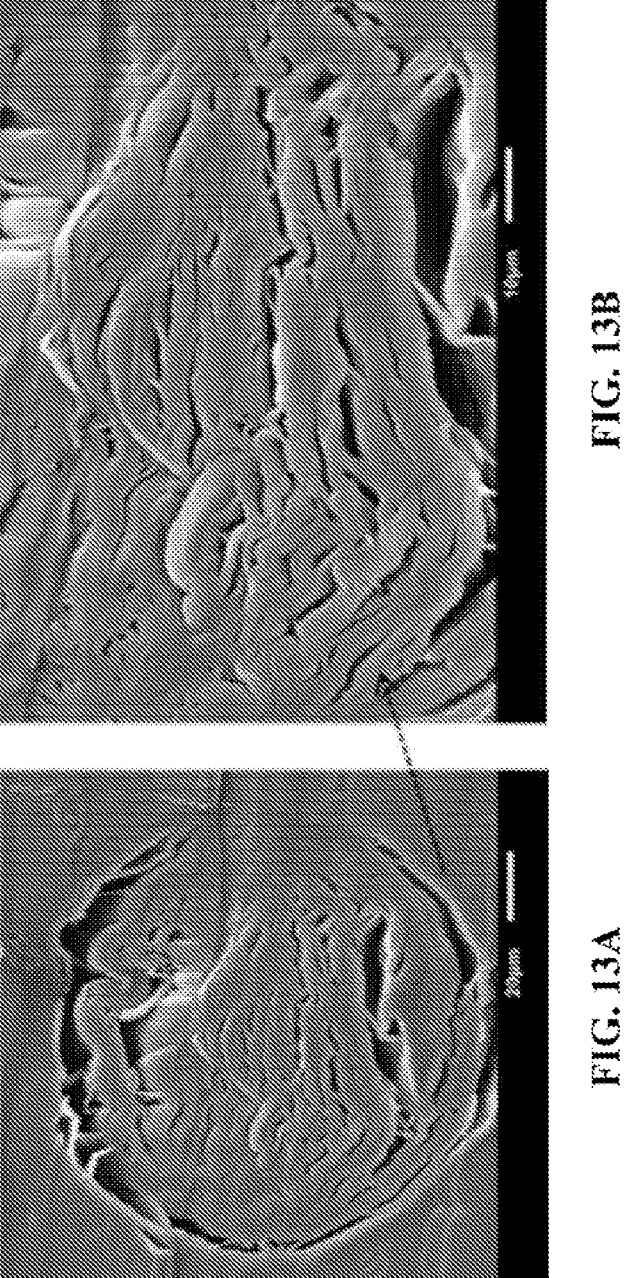
FIGS. 13A-13D show SEM images of the fiber cross sections from various G/PC (2 wt %) fibers with $V_G$≈0.082%. The scale bars are (A) 20 μm, (B) 10 μm, (C) 20 μm, and (D) 20 μm, respectively.
Figure 13D:
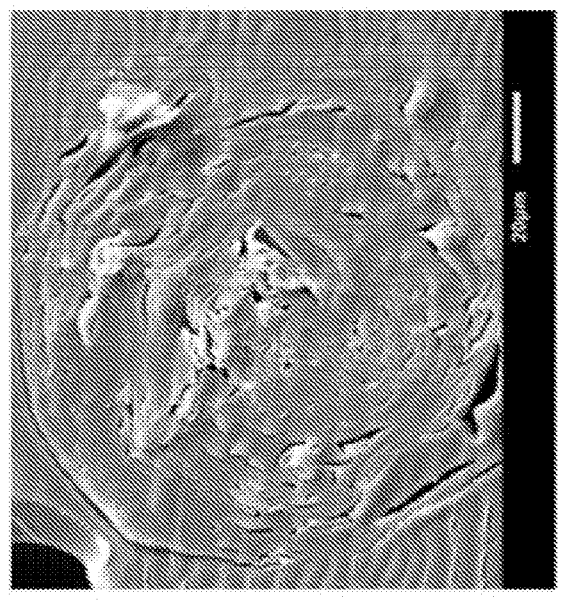
Figure 13D:
Figure 13C:
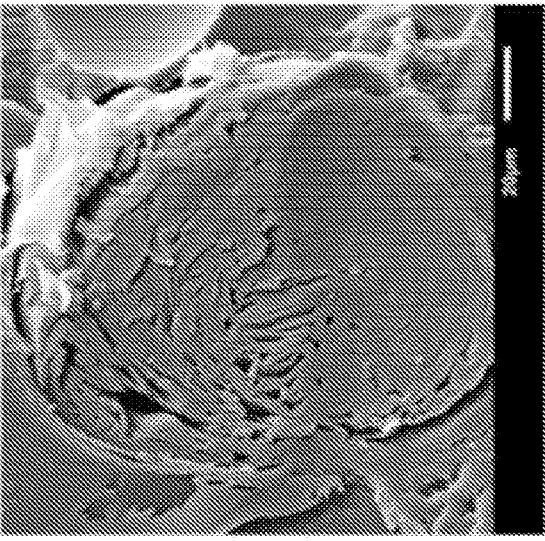

The equation is verified by well-fit least-squares regression fitting of these data for graphene/polycarbonate (G/PC) composites of $V_G{\approx}0.030\%$ and of $V_G{\approx}0.009\%$, each ranging from 1 to 144 layers (FIG. 2C). In FIG. 7B, the broad peak at 1230 $cm^{-1}$ attributes to C—O stretch in PC (see P. S. J. Dybal, J. Baldrian, J. Kratochvil, Macromolecules 31, 6611 (1998), which is incorporated by reference in its entirety) while the weak peak at 1775 $cm^{-1}$ derives from C=O bonds in PC. The strong peak around 1600 $cm^{-1}$ can be split and assigned as two components at 1592 $cm^{-1}$ (the G band of graphene) and 1602 cm$^{-1}$ (the aromatic C=C peak of PC). 2D band of graphene appears at 2680 cm$^{-1}$. The differences between the two fitted curves are very small due to the very low extinction coefficient ($\approx$0) of the highly transparent PC layer. The composites have high optical transmittance with 90% at 9 layers and 58% at 36 layers following Lambert-Beer law (FIGS. 8A-8B), corresponding to a transmittance of 98% per layer, in agreement with the known visible light transmittance of monolayer graphene. See Q.-Y. Lin et al., *ACS Nano* 7, 1171 (2013), which is incorporated by reference in its entirety. An alternate route to stack planar composites is by monomer impregnation and in-situ polymerization within expanded graphite derived from the thermal treatment of iodine chloride-intercalated highly ordered pyrolytic graphite (see C.-J. Shih et al., *Nat. Nanotechnol.* 6, 439 (2011), which is incorporated by reference in its entirety), achieving up to V$_G$$\approx$0.60% (FIGS. 9A-9E). However, the quality and control of layer spacing for the resulting composite was found to be lower than the 4$^j$ method (FIG. 9E).

TABLE 1

| Single layer G/PC film with various thicknesses prepared by spin-coating.[a] | | | | |
|---|---|---|---|---|
| | PC Conc. | Layer thickness (nm) | | Average graphene volume |
| G/PC Film | (wt %) | Grav.[b] | Ellipsometer | SEM[c] (layer number) | fraction (%)[d] |
| 1 | 14.0 | — | — | 9500 ± 300 (8) | 0.003 |
| 2 | 8.0 | 3570 ± 280 | — | 3464 ± 121 (9) | 0.009 |
| 3 | 4.0 | 1140 ± 53 | — | 930 ± 27 (144) | 0.030 |
| 4 | 2.0 | 413 ± 18 | 390 ± 4 | 377 ± 7 (160) | 0.082 |
| 5 | 1.0 | 184 ± 12 | 170 ± 12 | 206 ± 6 (160) | 0.185 |
| 6 | 0.1 | — | 13.3 ± 0.8 | — | 2.550 |

[a]Spin-coating conditions: chloroform as solvent, 2700 rpm, 1 min, room temperature.
[b]The weight of the composite/(the area of the composite film × the composite density (1.21 g/cm$^3$, assuming the same value as PC) × layer numbers).
[c]The thickness of a layered composite measured by SEM/the layer number (the number in the brackets).
[d]Average graphene volume fraction (V$_G$) = the number of graphene layers × single-layer graphene thickness ($\approx$0.335 nm)/the composite thickness, thickness data from gravimetric method or ellipsometer (Film 6) were used.

An analogous procedure was used to create Archimedean spiral fibers (FIGS. 1E-1I and FIGS. 10-12). A transverse shear force scrolls a single graphene/PC film (2.0×2.2 cm) into a fiber (FIG. 1E), of diameter 105±2 μm (fiber 1) measured optically (FIGS. 10A-10C and 11A-11F) and 160±4 μm (fiber 2, FIG. 1F, 10 and 12). The layer spacing of 190 and 400 nm, respectively, induces an observable birefringent effect in FIG. 1F (and FIGS. 10B-10C), respectively. The fiber axial cross section has a deformed spiral structure (FIGS. 1G-1I and 13). Both methods can control the resulting V$_G$ over three orders of magnitude from 0.003% to 2.55% (Table 1).

Figures 3A, 3B:
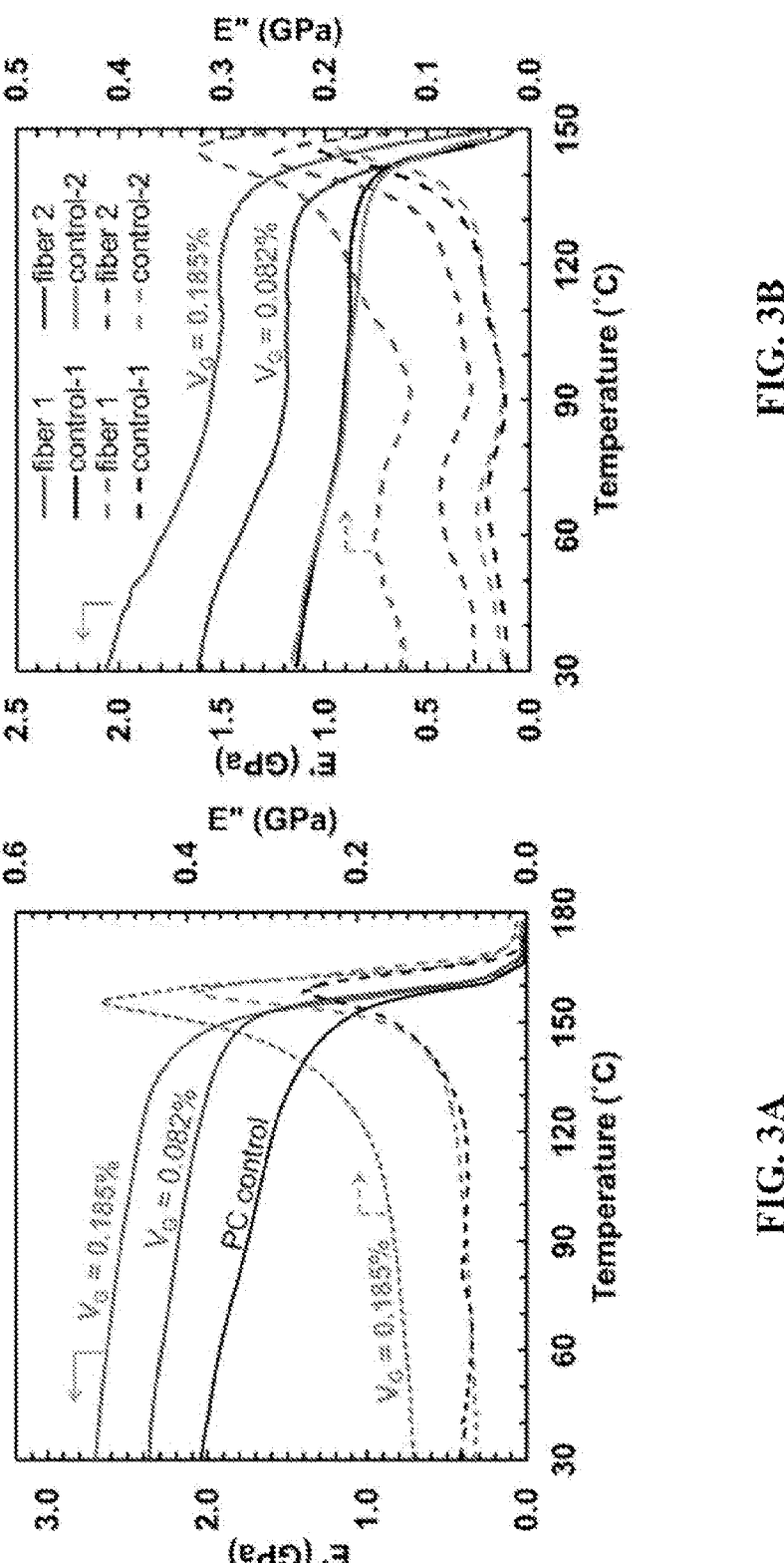
FIGS. 3A-3E show mechanical characterization of CVDG/PC planar and scrolled fiber nanocomposites.

Despite having vanishingly small V$_G$s, such aligned composites demonstrate substantial increases in both the uniaxial tensile storage (E') and loss (E") moduli from dynamic mechanical analysis (DMA) (FIGS. 3A-3B). Two 4$^j$ planar samples with V$_G$$\approx$0.082% and 0.185% respectively, both at 40 layers, have significantly higher E' than pure PC controls (FIG. 3A), with E'/E'$_{PC}$=2.36/2.04 (GPa/GPa) and 2.70/2.04 at 30° C., for example, or an increased stiffness of □E up to 0.66 GPa or 30%. The effective elastic modulus of the component graphene layers is estimated as 360 GPa with the rule of mixtures, agreeing with reported values of 210-510 GPa for CVDGs with ripple. See C. S. Ruiz-Vargas et al., *Nano Lett.* 11, 2259 (2011), and Q.-Y. Lin et al., *ACS Nano*

Figure 3C:
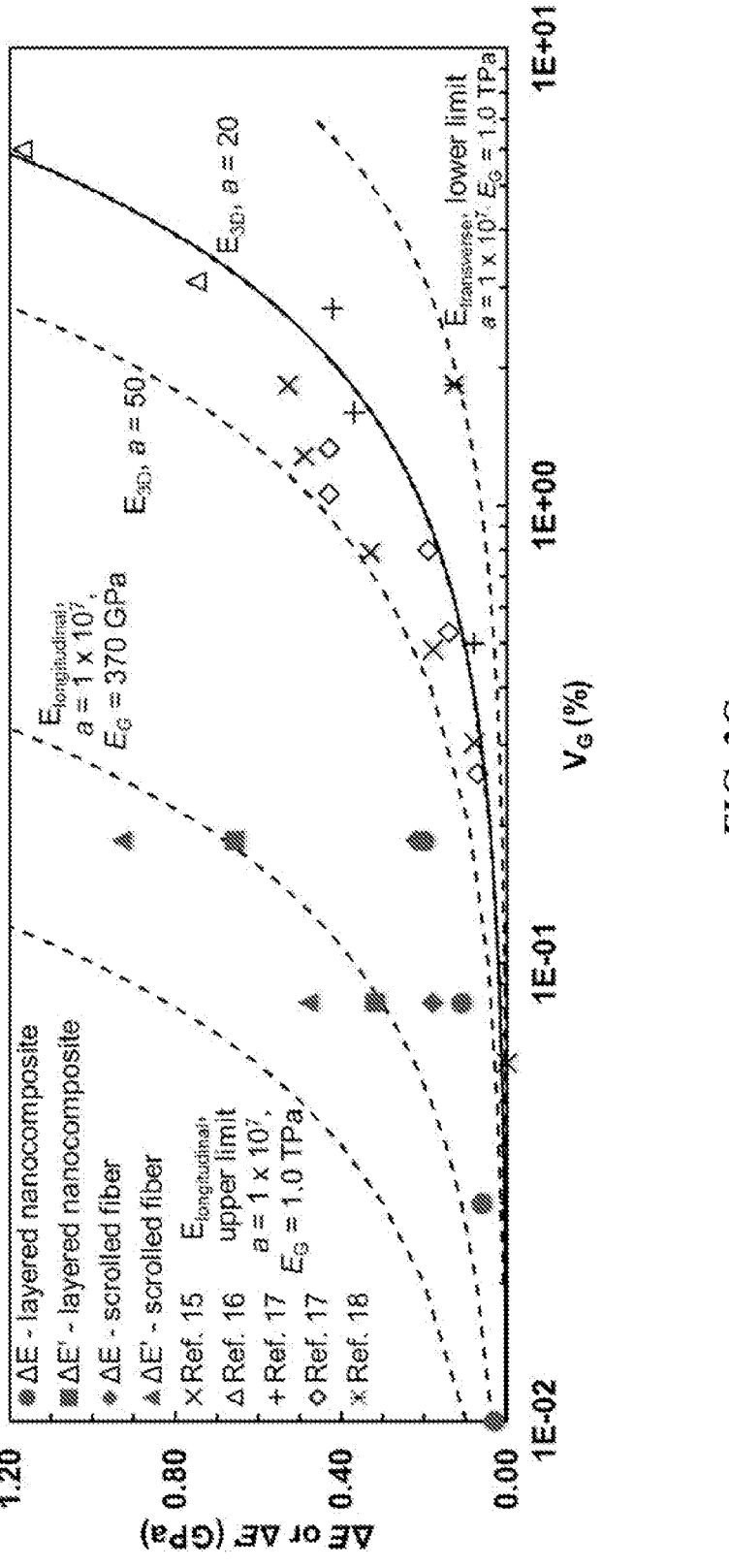
Figure 15A:
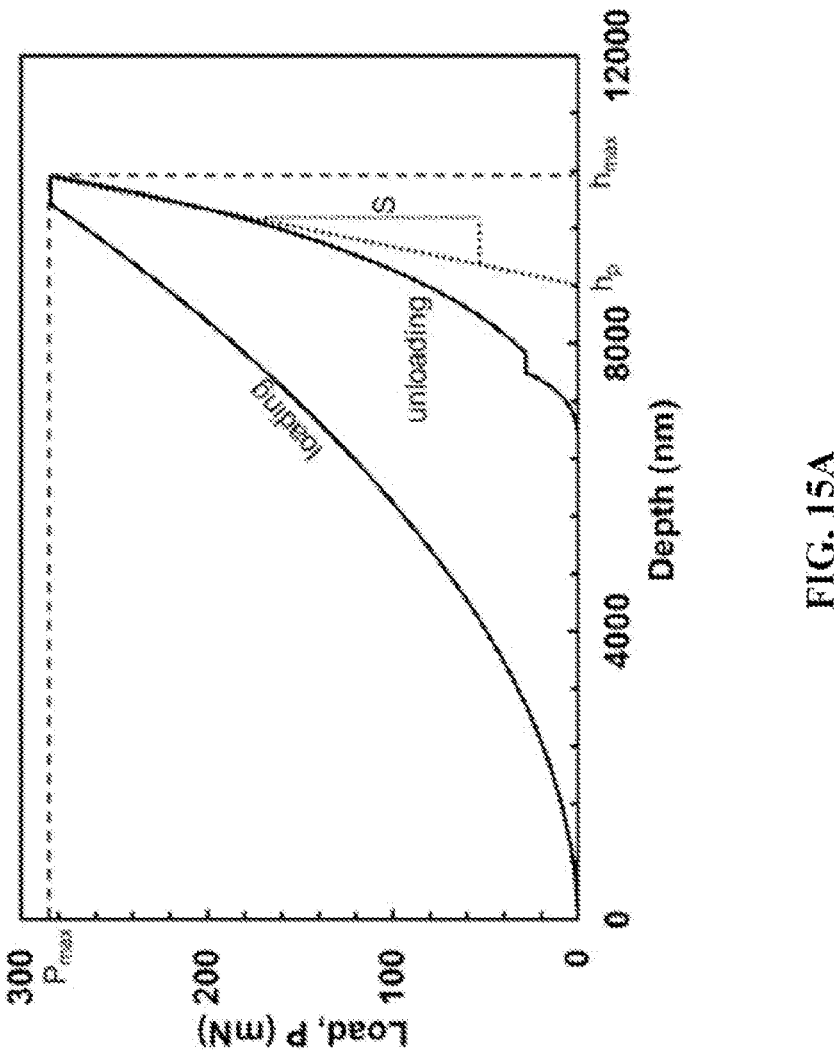
FIGS. 15A-15E show microindentation test of planar 4j composite samples.
Figure 15B:
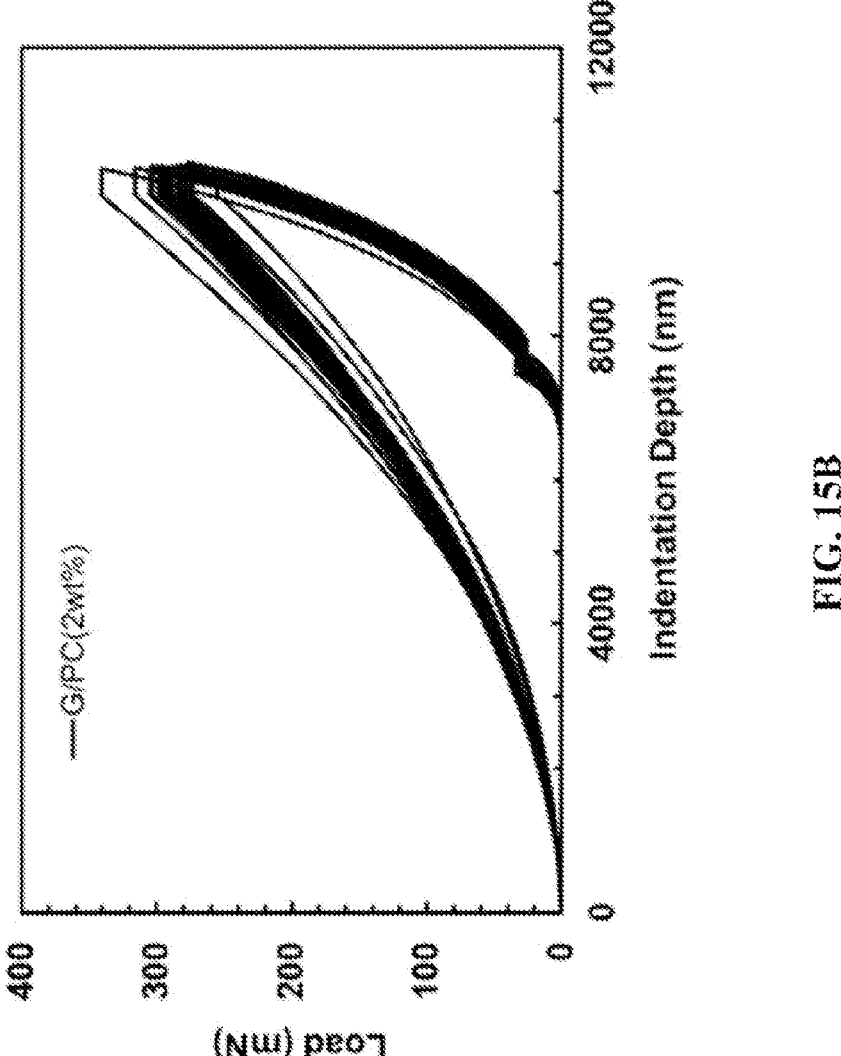
Figure 15D:
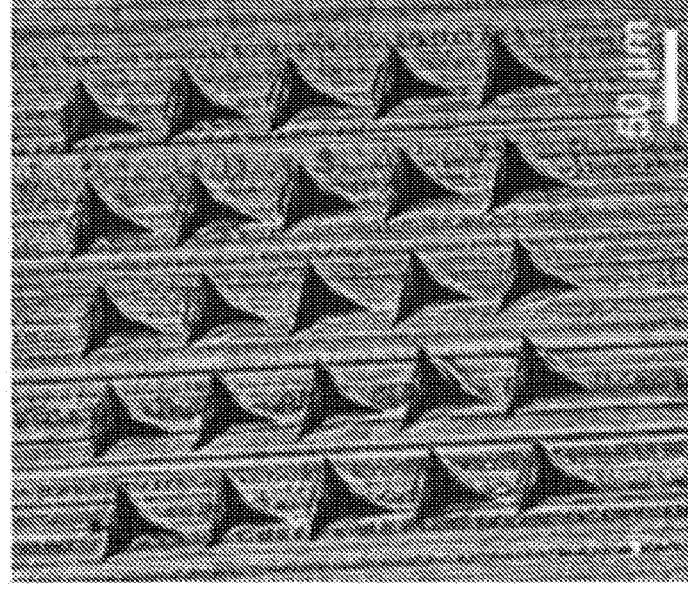
Figure 15C:
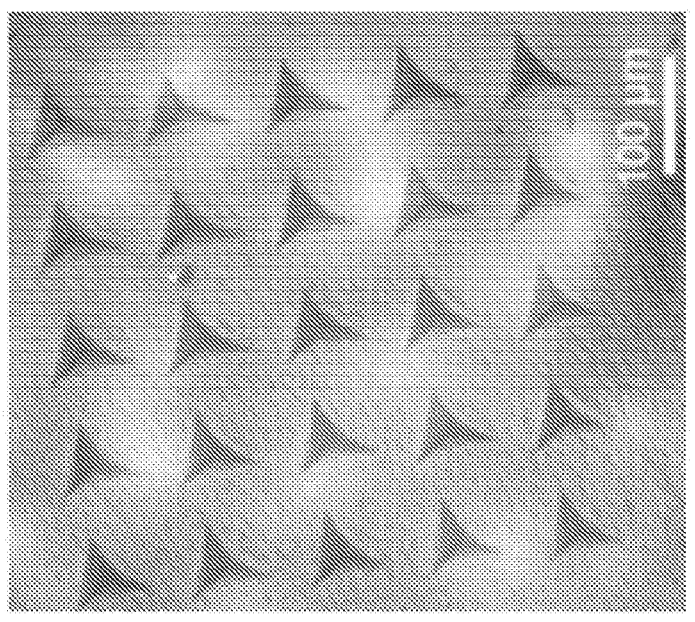
Figure 15E:
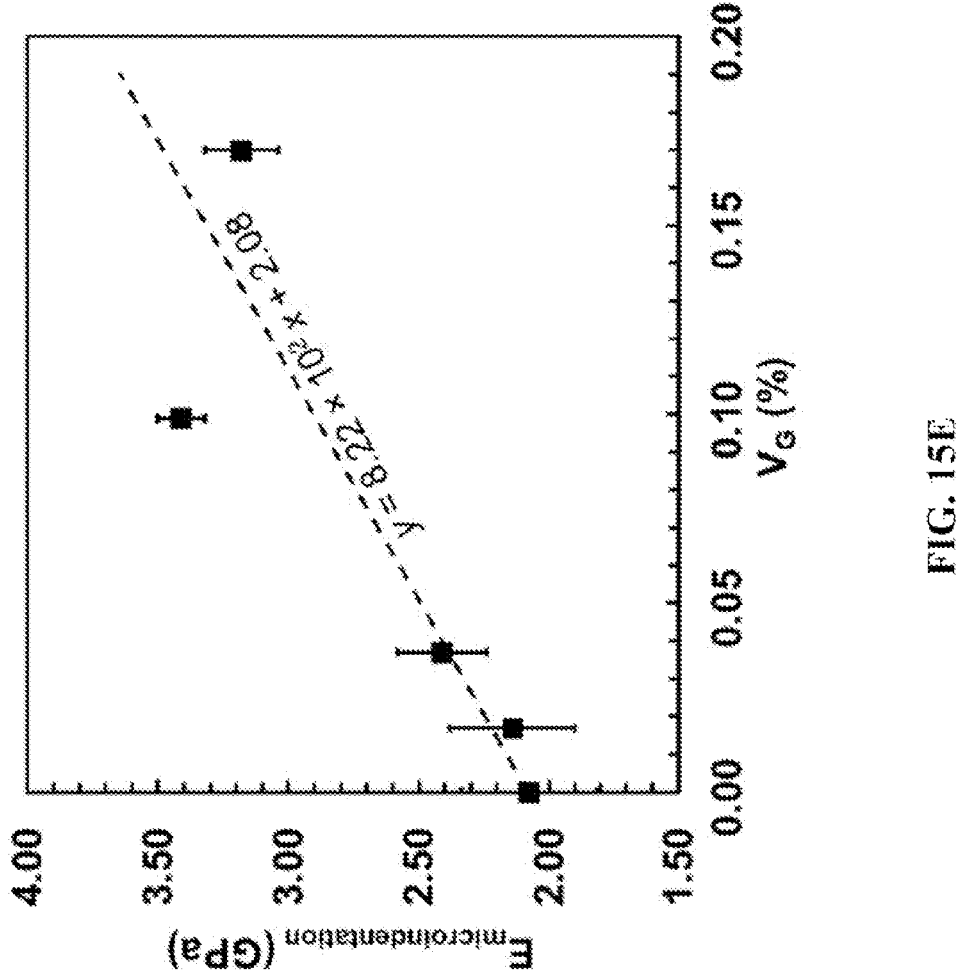
Figure 16A:
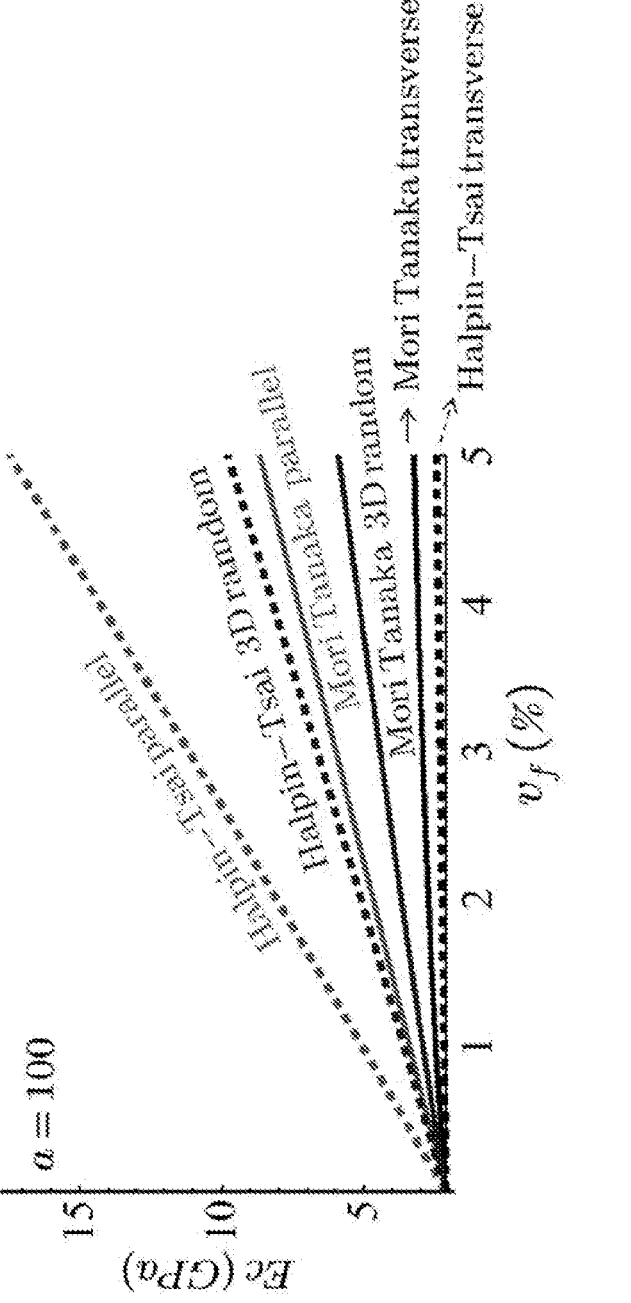
FIGS. 16A-16C show the theoretical values of the elastic modulus of G/PC nanocomposite ($E_c$) at different graphene volume fractions $v_f$ and graphene aspect ratio a. The dash lines for a=100 (FIG. 16A), a=10,000 (FIG. 16B), and a=1000,000 (FIG. 16C) are predicated by Halpin-Tsai equation and solid lines by Mori-Tanaka theory.
Figures 16B, 16C:
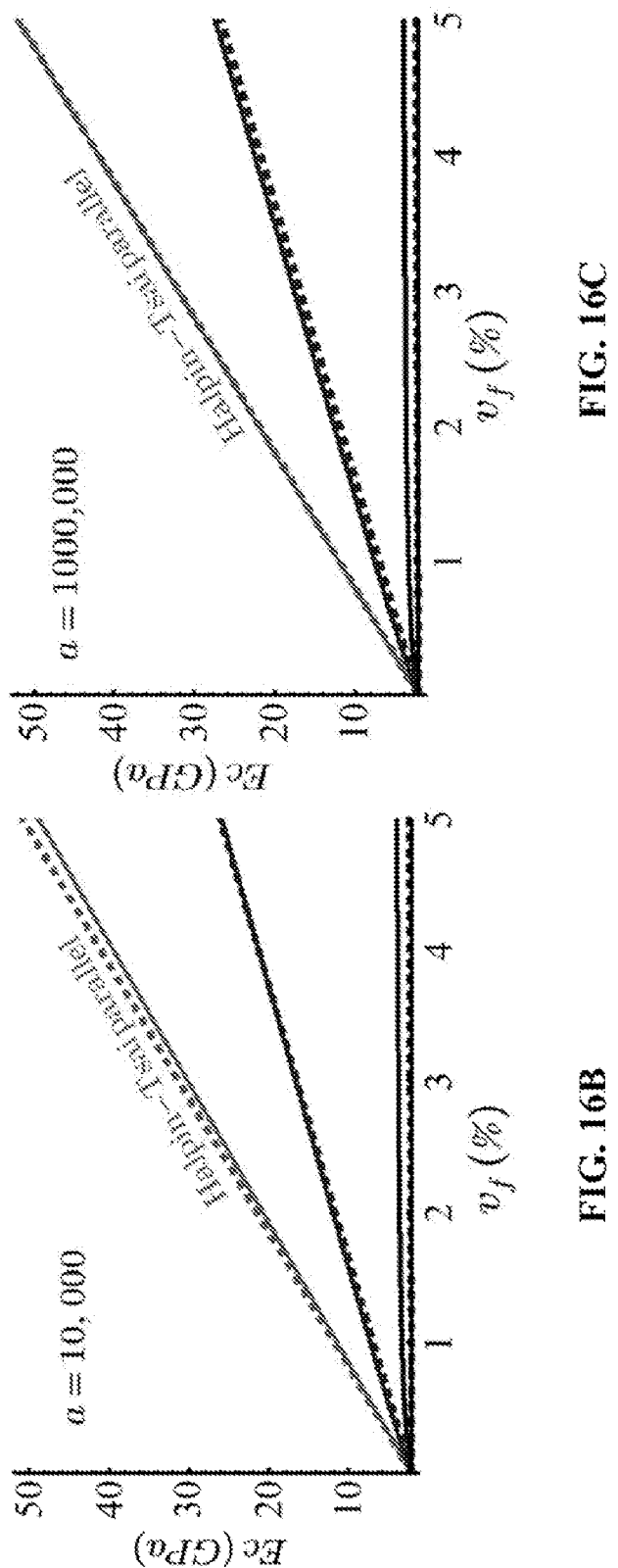

7, 1171 (2013), each of which is incorporated by reference in its entirety. Uniaxial tension (FIGS. 14A-14C) and micro-indentation results (FIGS. 15A-15E) demonstrate similar elastic modulus increase with a linear dependence on V$_G$. For comparison, a minimum of 2%<V$_G$<5%, 10 times more than 4$^j$ composites, is required to achieve comparable stiffness of PC nanocomposites in the limit of 3D random orientation for graphene oxide (GO) or derivatives with typical aspect ratios a=20-50 (see J. R. Potts, S. Murali, Y. Zhu, X. Zhao, R. S. Ruoff, *Macromolecules* 44, 6488 (2011), P. Steurer, R. Wissert, R. Thomann, R. Mülhaupt, *Macromol. Rapid Commun.* 30, 316 (2009), H. Kim, C. W. Macosko, *Polymer* 50, 3797 (2009), and B. Shen, W. Zhai, M. Tao, D. Lu, W. Zheng, *Compos. Sci. Technol.* 86, 109 (2013), each of which is incorporated by reference in its entirety) (FIG. 3C). Nanoplatelets with smaller a values contribute less to reinforcement (FIGS. 16A-16C); GOx (or derivatives) with multi-layer structures generally have poor interlayer bonding (see H. Kim, A. A. Abdala, C. W. Macosko, *Macromolecules* 43, 6515 (2010), and J. R. Potts, D. R. Dreyer, C. W. Bielawski, R. S. Ruoff, *Polymer* 52, 5 (2011), each of which is incorporated by reference in its entirety), which further minimizes the reinforcement. The atomic thinness of mono-layer CVDG and its near-infinite a maximize this reinforcement (FIG. 3C). See J. R. Potts, S. Murali, Y. Zhu, X. Zhao, R. S. Ruoff, *Macromolecules* 44, 6488 (2011), P. Steurer, R. Wissert, R. Thomann, R. Mülhaupt, *Macromol. Rapid Commun.* 30, 316 (2009), H. Kim, C. W. Macosko, *Polymer* 50, 3797 (2009), and B. Shen, W. Zhai, M. Tao, D. Lu, W. Zheng, *Compos. Sci. Technol.* 86, 109 (2013), each of which is incorporated by reference in its entirety. The dash lines are predicted by Mori-Tanaka theory.

Figure 18:
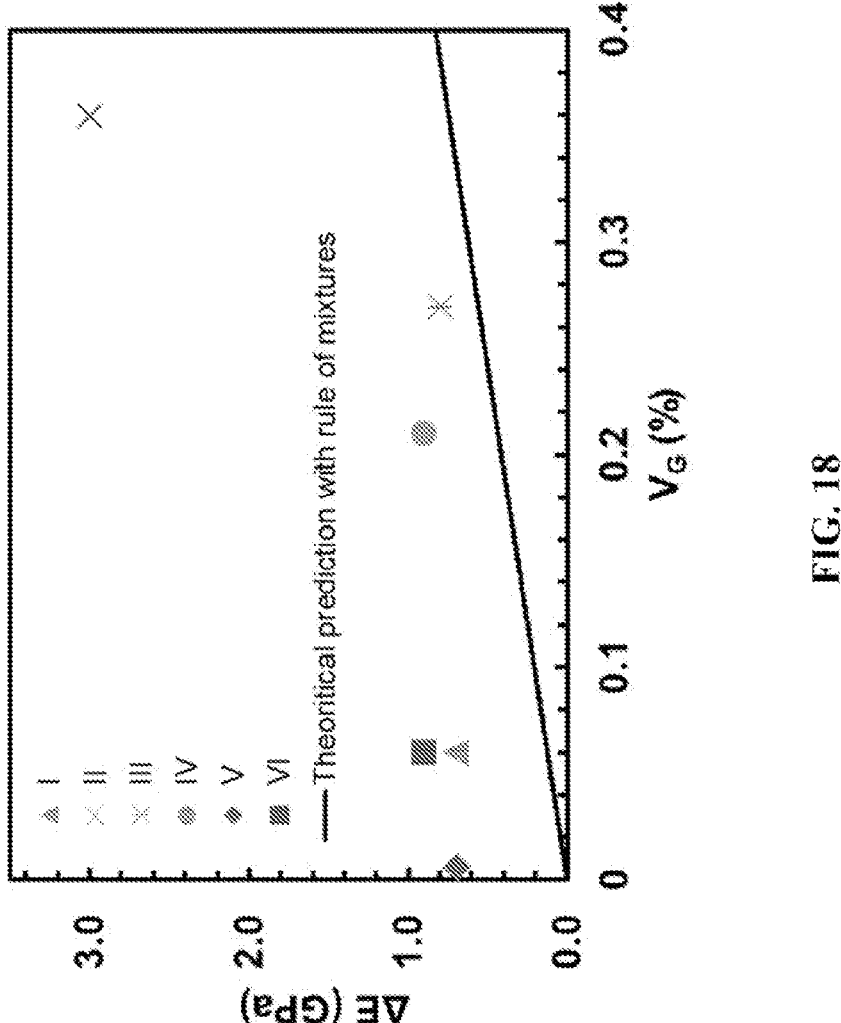
FIG. 18 shows plot of various $\Delta E$ data against $V_G$, data points I-IV from the papers, respectively.

It was verified that the PC matrix of this composite is not itself stiffening, evidenced by the reduction of the glass transition temperature (T$_g$) from 151.3 to 141.8° C. at higher V$_G$s (FIGS. 14A-14C) and no detectable increase in the crystallinity of PC (FIG. 3A). This reinforcement then, comes from the direct load transfer to graphene filler itself (see X. Li, G. B. McKenna, *ACS Macro Lett.* 1, 388 (2012), which is incorporated by reference in its entirety), distinguishing it from cases where the inclusion (e.g., GO) stiffens the polymer matrix, and increases T$_g$ by restricting polymer chain mobility near the polymer-inclusion interface (FIG. 18). See H. Kim, A. A. Abdala, C. W. Macosko, *Macromolecules* 43, 6515 (2010), and Ramanathan T et al., *Nat. Nanotechnol.* 3, 327 (2008), each of which is incorporated by reference in its entirety. The theoretical prediction curve is based on rule of mixtures with the efficient modulus of monolayer GOx=207.6 GPa determined by atomic force microscope. See Ramanathan T et al., *Nat. Nanotechnol.* 3, 327 (2008), M. A. Rafiee et al., *ACS Nano* 3, 3884 (2009), B. Ramezanzadeh, E. Ghasemi, M. Mandavian, E. Changizi, M. H. Mohamadzadeh Moghadam, *Chem. Eng. J.* 281, 869 (2015), Y. Zhu, H. Wang, J. Zhu, L. Chang, L. Ye, *Appl. Surf. Sci.* 349, 27 (2015), S. B. Kadambi, K. Pramoda, U. Ramamurty, C. N. R. Rao, *ACS Appl. Mater. Interfaces* 7, 17016 (2015), S. Roy et al., *ACS Appl. Mater. Interfaces* 7, 3142 (2015), and J. W. Suk, R. D. Piner, J. An, R. S. Ruoff, *ACS Nano* 4, 6557 (2010), each of which is incorporated by reference in its entirety.

To date, it has been demonstrated composites with V$_G$ as high as 0.185%, but the 4$^j$ and shear scrolling methods allow one to reach as high as 2.5% (Table 1), translating to ΔE (or ΔE')=9.0-20.6 GPa (FIG. 3C). Planar 4$^j$ samples at V$_G$$\approx$0.185% also show higher E" peak values (0.50 GPa) compared to those at V$_G$$\approx$0.082% (0.40 GPa) and the PC control (0.26 GPa) (FIG. 3A). These samples possess an enhanced energy dissipation mechanism from in-plane translation and frictional sliding at the layer interfaces (FIG. 14A and see N. A. Koratkar et al., *Appl. Phys. Lett.* 87, 063102 (2005), which is incorporated by reference in its entirety). Both E' and E" increase with $V_G$, promising materials of stiffness and damping exceeding that of the matrix polymer at negligible increases in weight. See J. Meaud et al., *ACS Nano* 8, 3468 (2014), which is incorporated by reference in its entirety.

Figure 3D:
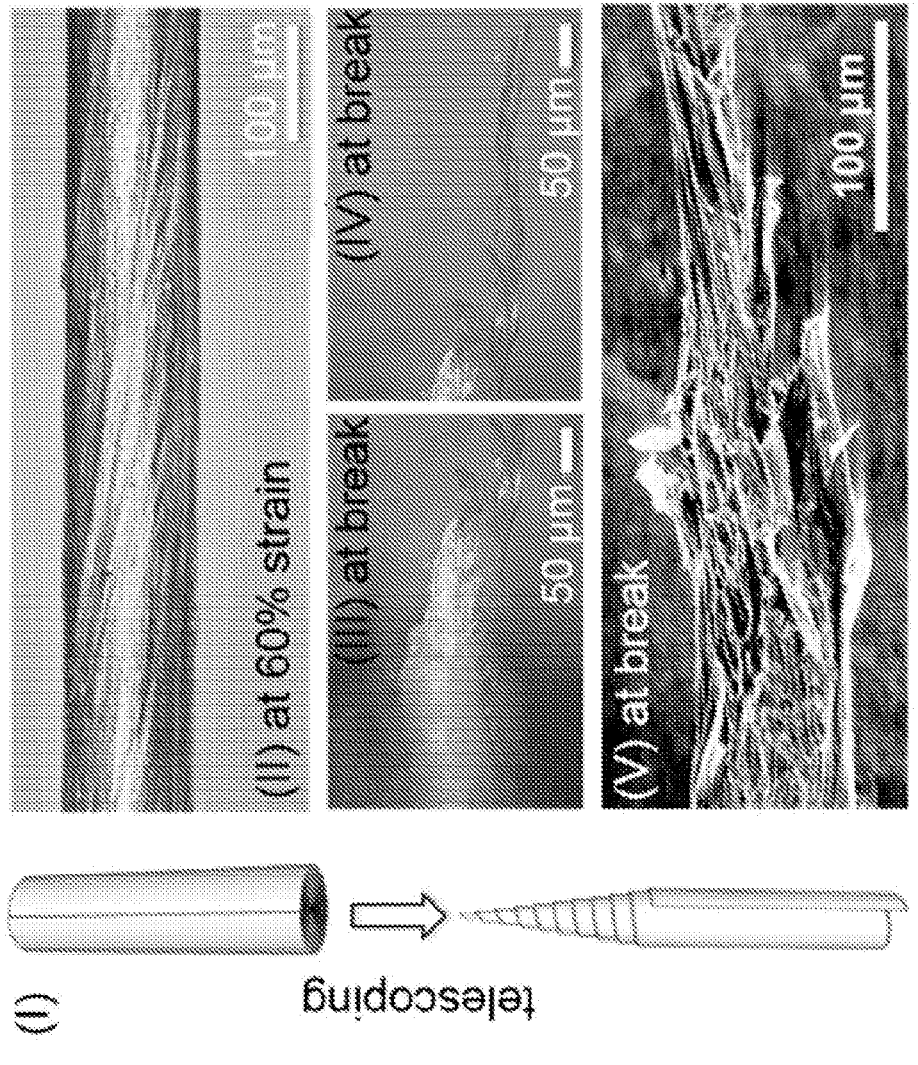
Figure 14A:
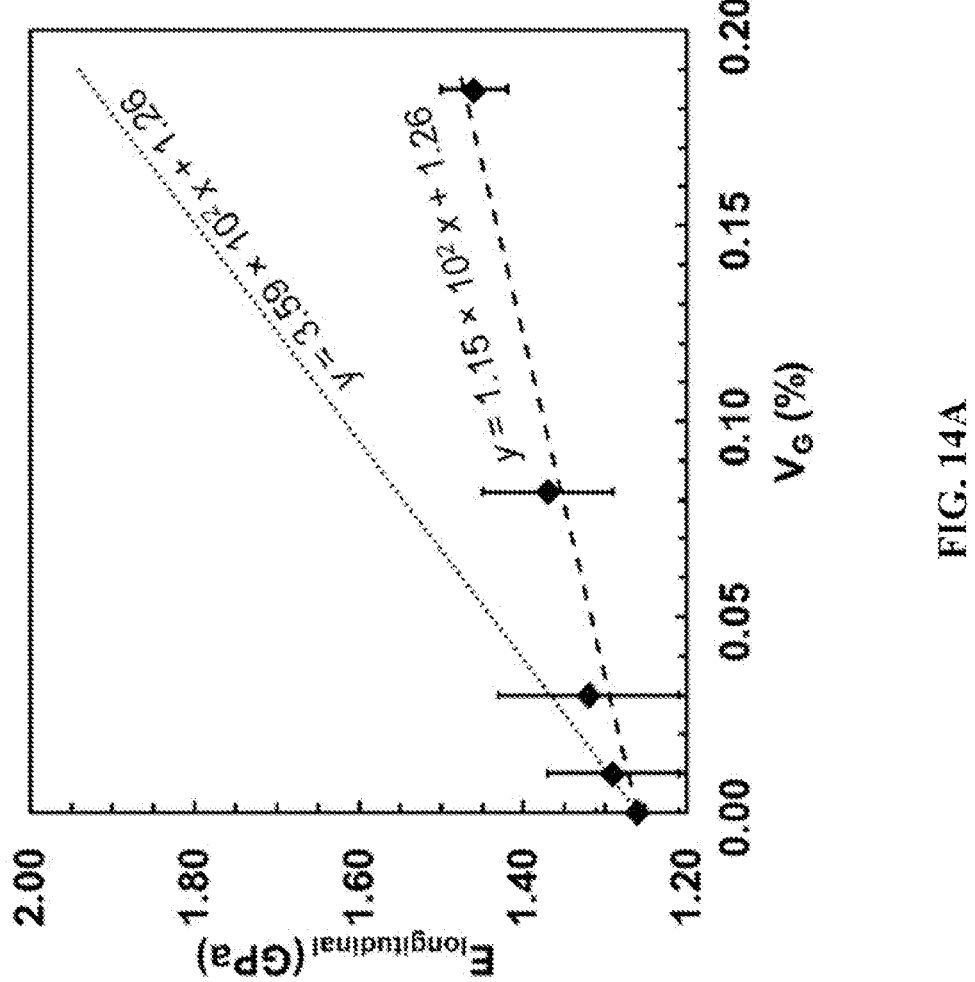
FIGS. 14A-14C show uniaxial tensile properties of the layered G/PC nanocomposites.

The spiral fibers also demonstrate interesting mechanical properties. Two Archimedean scroll fibers 1 ($V_G \approx 0.185\%$) and fiber 2 (0.082%) exhibit higher E' of 2.07 GPa and 1.62 GPa, respectively, compared to PC controls at 1.14 GPa over 30 to 150° C. (FIG. 3B). However, the stiffness of these scroll fiber composites was generally lower than that of the planar 4j composites. The scrolled structures of the fibers demonstrate a telescoping compliance mechanism (I of FIG. 3D), that involves internal axial rotation in addition to the interlayer translation shown in the planar $4^j$ systems (FIG. 14A). These fibers still exhibited measurable increases in stiffness $\Delta E'$ of 0.38 and 0.93 GPa, however, and larger effective $E_G$ of the CVDG at 500 GPa. This telescoping compliance may necessarily reduce in-plane ripples to realize this increase. The scroll fibers also helically telescope in tension, necessarily reducing the diameter and densifying the structure uniformly (FIGS. 3D (II) and 19A). Note that axial rotation, in addition to translation, increases the path length per unit axial strain, hence increasing the E" and energy dissipation through interfacial friction, increasing at higher $V_G$ (FIG. 3B).

Figure 3E:
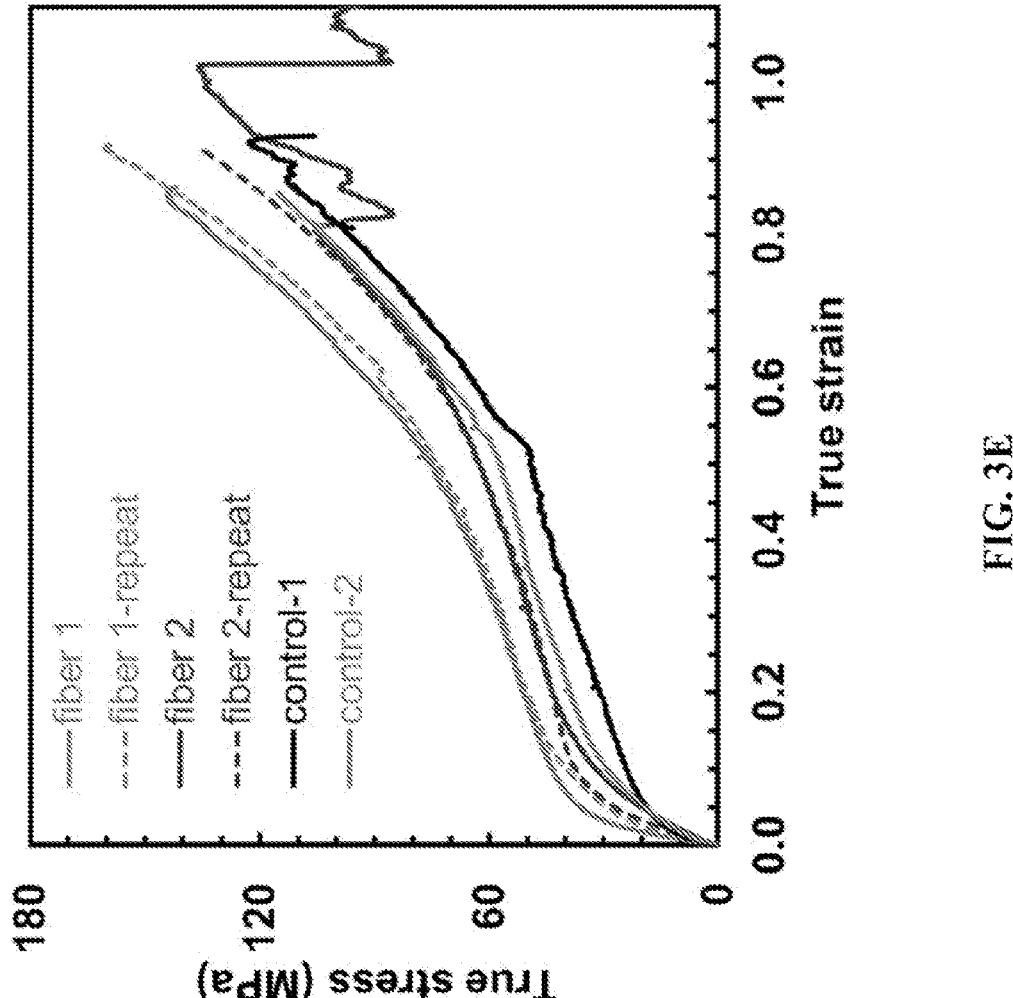
Figure 19A:
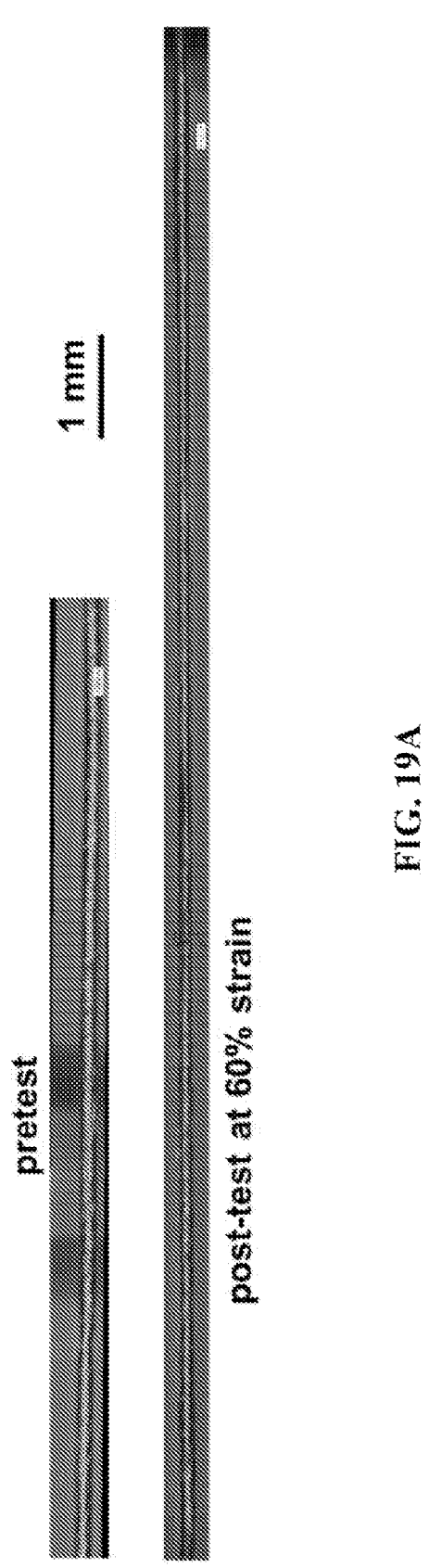
FIGS. 19A-19F show mechanical properties study of the G/PC nanocomposite fiber.
Figures 19B, 19C:
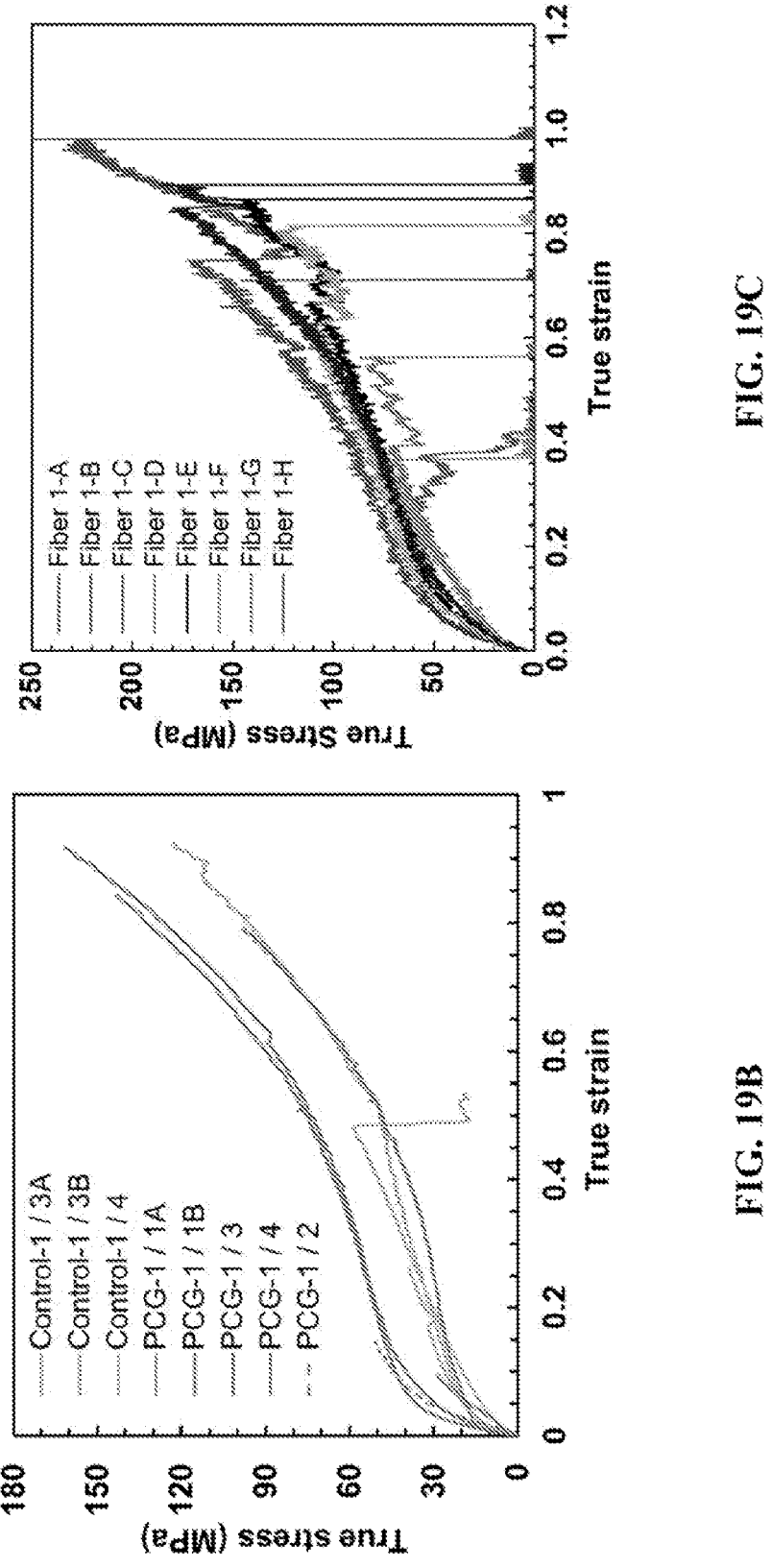
Figures 19D, 19E:
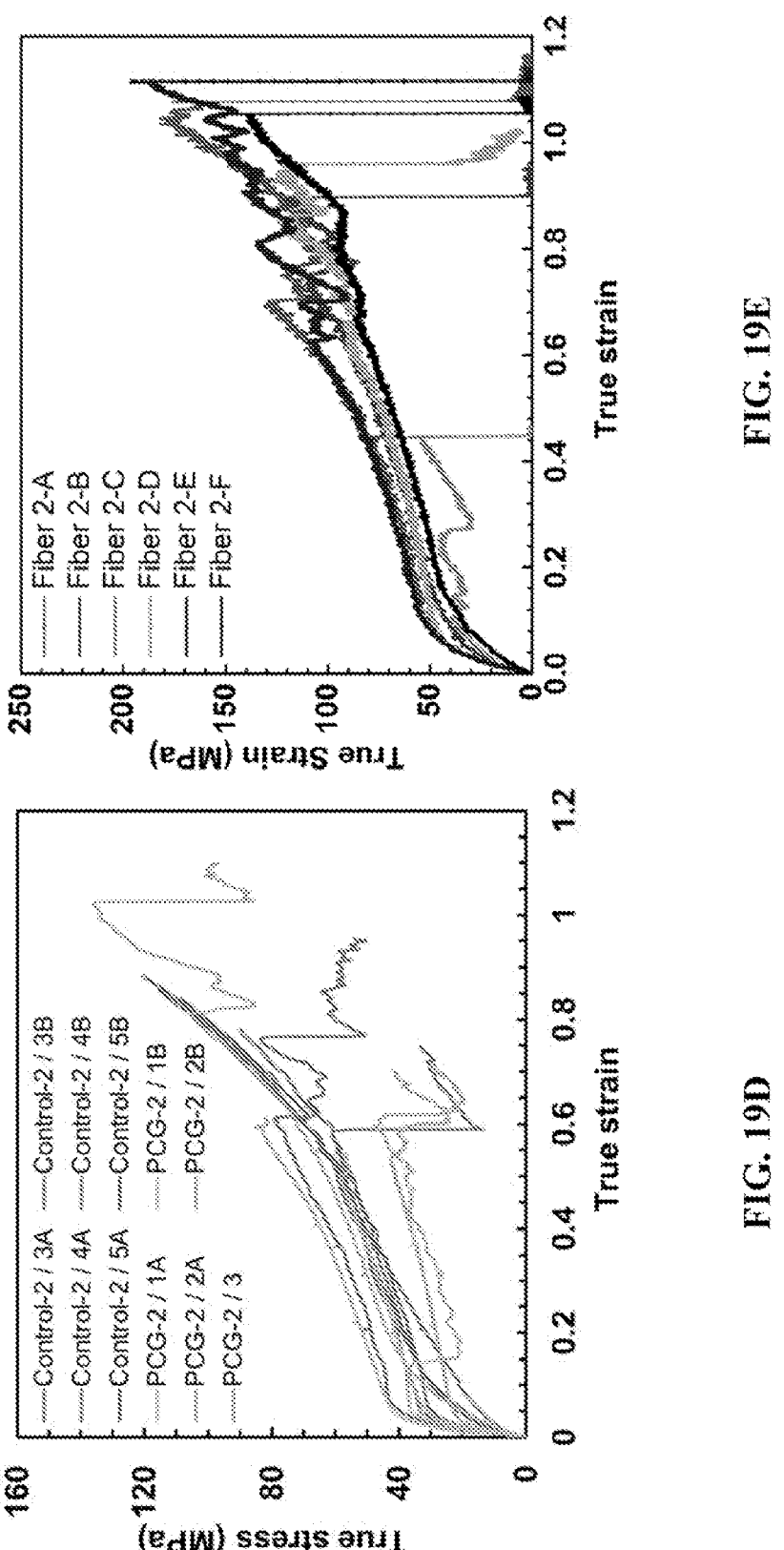
Figure 19F:
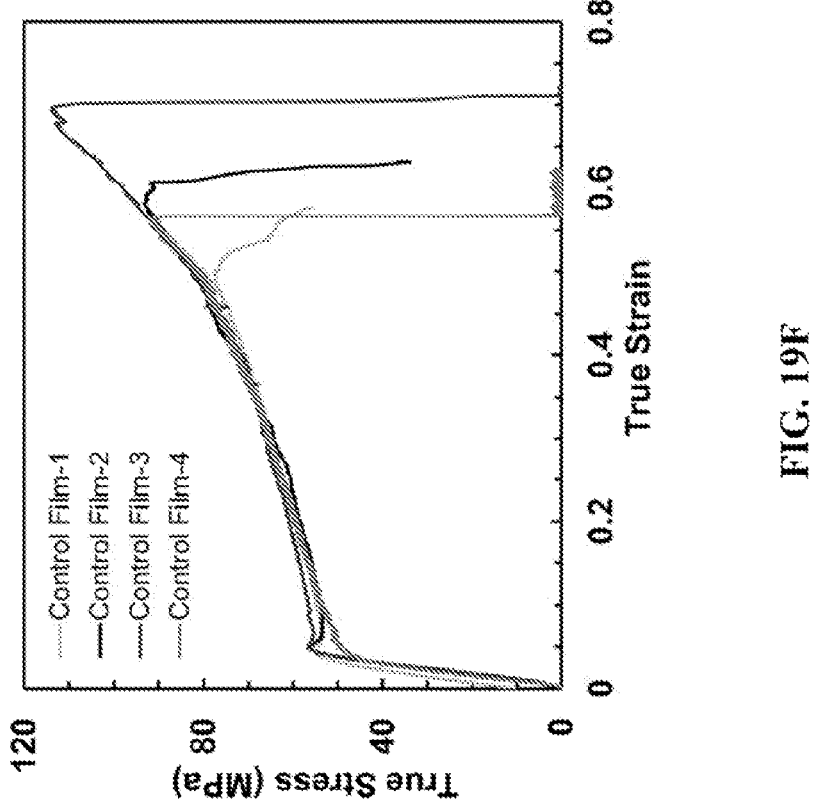

These fibers also show an extraordinary elongation at break ($\varepsilon_{max,fiber}$) up to 1.10 (FIG. 3E) compared to $\varepsilon_{max}$=0.75 for a monolithic PC film (FIG. 19B and see M. J. Kendall, C. R. Siviour, *Philos. Trans. R. Soc., A* 372, 20130202 (2014), which is incorporated by reference in its entirety); and higher ultimate strengths of 160 MPa (fiber 1) and 135 MPa (fiber 2), compared to 120 MPa for the PC films (FIG. 19B) and fiber (FIG. 3E). A helical telescoping/twisting of the scrolled layers can explain these, which are generally found in natural structural materials to provide higher strength and toughness. See S. E. Naleway, M. M. Porter, J. McKittrick, M. A. Meyers, *Adv. Mater.* 27, 5455 (2015), which is incorporated by reference in its entirety. For an Archimedean spiral described by radius r, the cross section follows r=tθ with t the interlayer distance between successive turnings through the angle θ. The scroll fiber is unique requiring that failure traverses the entire path length $S_\theta$ of the spiral inclusion (graphene), given by $$S_\theta = \frac{1}{2}t\left[\theta\sqrt{1+\theta^2} + \ln\left(\theta + \sqrt{1+\theta^2}\right)\right] \qquad (2)$$

where $S_\theta$ is identically the starting width of the graphene sheet (2.2 cm). For a fiber of diameter 131±3 μm as in FIG. 1G, eq. 3 predicts a t of 390±20 nm in agreement with ellipsometer measurement values of 390±4 nm (Table 1). Note that the scroll architecture mandates that all of m=$S_\theta$/ $b_{c-c}$ (where $b_{c-c}$ is the carbon-carbon bond length, 0.142 nm) carbon-carbon bonds in the graphene rupture for complete failure or collapse, a process that takes place over a large strain range due to the semi-infinite nature of the graphene herein. This can be seen in the images of the break sites with visible spiral ripping in III-V of FIG. 3D. The spiral geometry predicts that for an initial l (length)×$S_\theta$ graphene sheet, the failure strain $\varepsilon_{max,fiber}$ is, $$\varepsilon_{max,fiber} = \frac{\sqrt{l^2 + S_\theta^2} - l}{l} + \varepsilon_{max,film} \qquad (3)$$

where $\varepsilon_{max,film}$ is the failure strain of the planar composite film. For a typical scroll fiber in this work, with l=2 cm, $S_\theta$=2.2 cm, and $\varepsilon_{max,film}$=0.75, $\varepsilon_{max,fiber}$=1.24 is calculated theoretically, higher than the maximum experimental value of 1.10 (FIG. 3E).

Figures 21A, 21B:
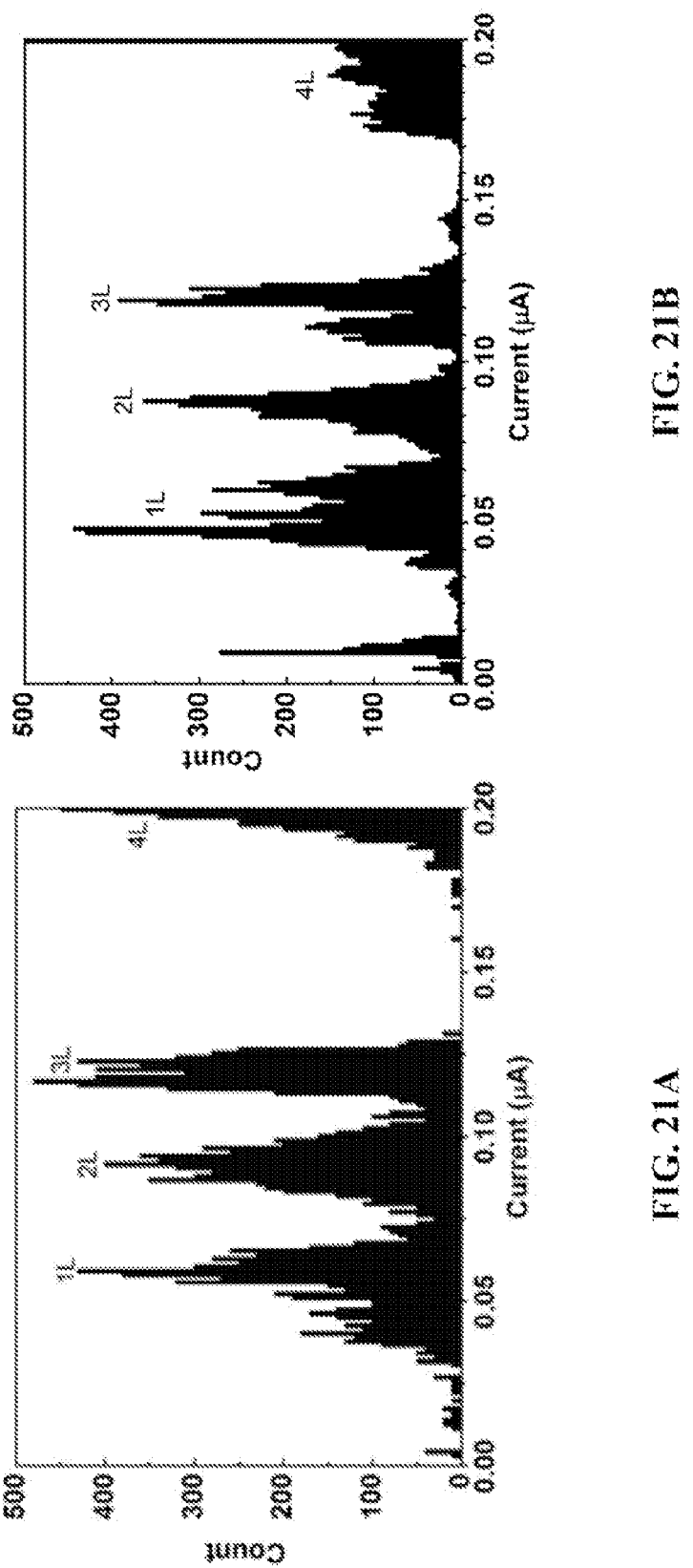
FIGS. 21A-21B show the histogram profiles of the value distribution (count) of electric current signals of the two repeated samples (G/PC ($V_G{\approx}0.003\%$), 4 layers). Their electric current curve versus depth trace during the microprobe movement (probe speed=1.00 μm/s, voltage=1.0 mV) are included in FIG. 4C (blue and black, respectively).
Figures 21C, 21D:
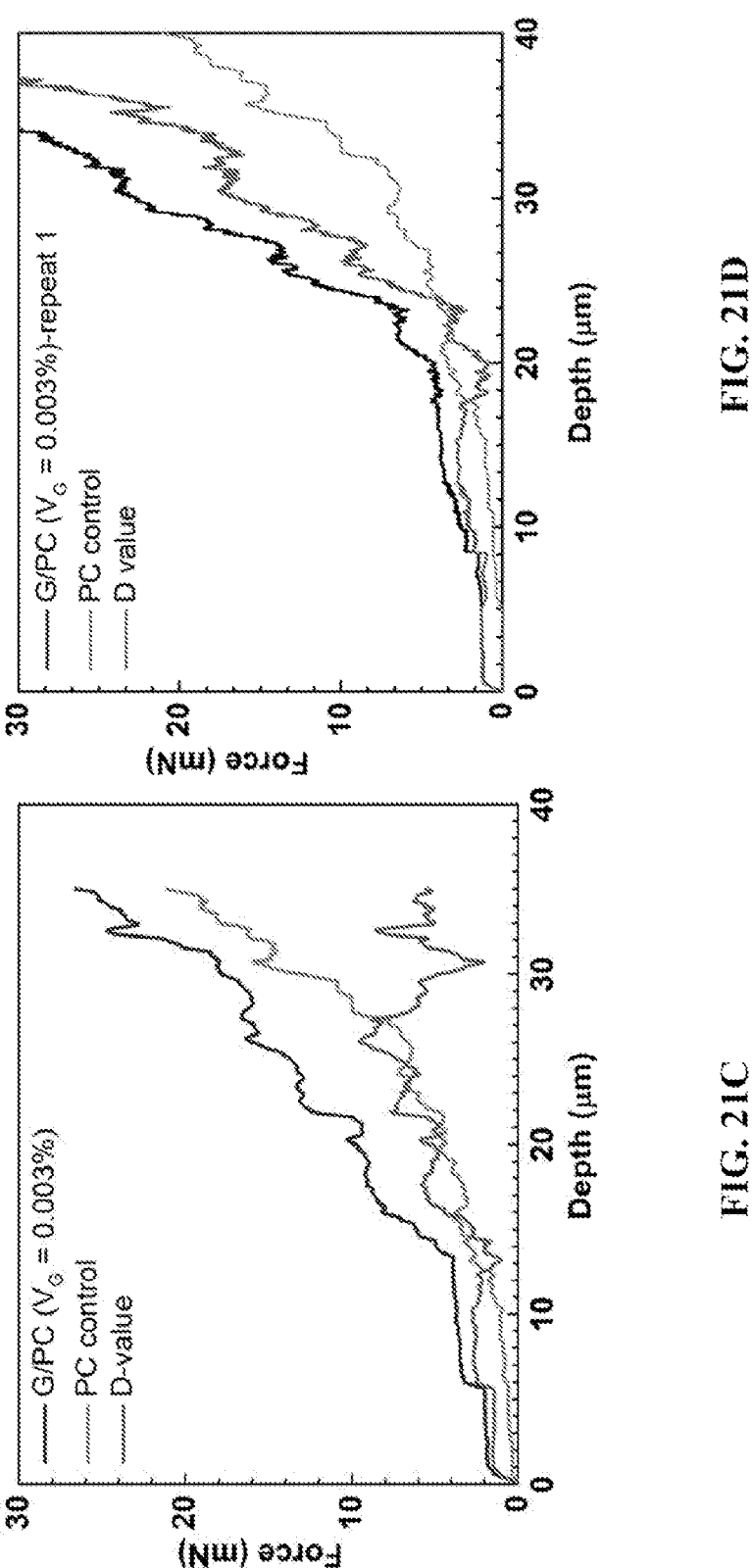
FIG. 21C shows the applied force on composite film (red, G/PC ($V_G{\approx}0.003\%$), 4 layer) measured by force sensor versus the depth trace during the probe indentation, the force-depth curve of a control sample (PC control, gray) and the difference value (D-value) curve (light blue) between the composite and the control were also included.
FIGS. 21D-21E show the force data from the two repeated samples.
Figure 21E:
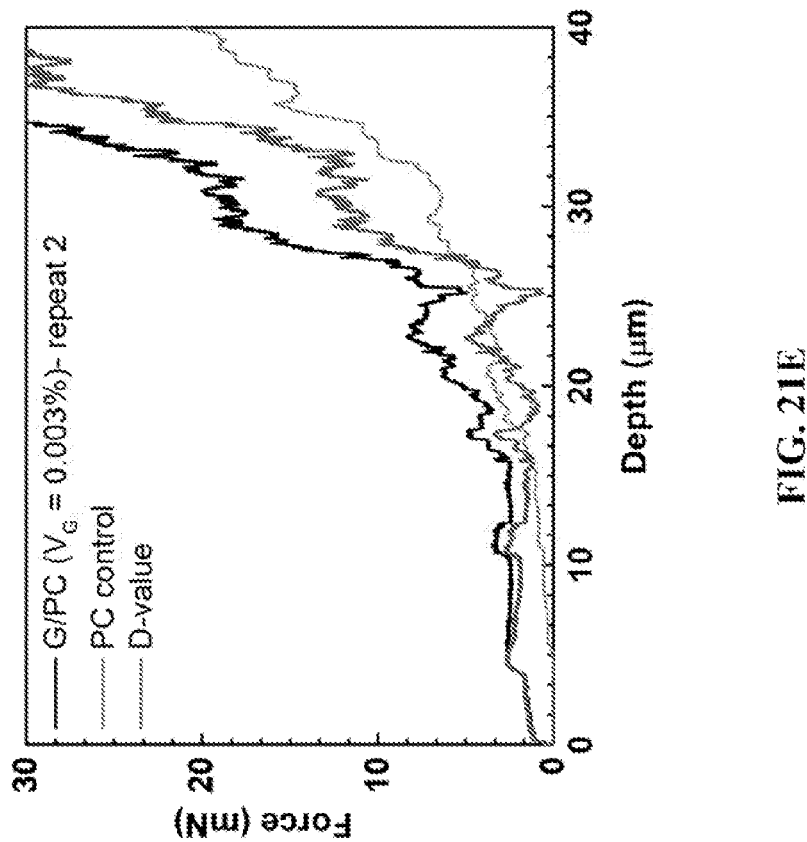

Lastly, this approach of the Platelet Limit offers interesting opportunities to modify the properties of matrices with exceedingly small amounts of an inclusion. PC is transparent but electrically insulating. Graphene electrical continuity was maintained during stacking and folding as demonstrated by the highly anisotropic electrical conduction in planar $4^j$ samples at a mere $V_G \approx 0.003\%$ while retaining transparency. Percolation values of 0.14 to 1.3% were reported for various random composites of GO/PC (see J. R. Potts, S. Murali, Y. Zhu, X. Zhao, R. S. Ruoff, *Macromolecules* 44, 6488 (2011), P. Steurer, R. Wissert, R. Thomann, R. Mulhaupt, *Macromol. Rapid Commun.* 30, 316 (2009), H. Kim, C. W. Macosko, *Polymer* 50, 3797 (2009), and E. O. Polat et al., *Sci. Rep.* 5, 16744 (2015), each of which is incorporated by reference in its entirety), for example. A tungsten microprobe (FIGS. 4A and 16A-16C) inserted perpendicularly to the graphene layer direction at 1.00 μm/s into the grounded composite while maintaining circuit continuity (FIG. 4B) shows discrete current steps as each successive layer is contacted (FIG. 4C) reaching a maximum of about 0.2 μA after the contact of the fourth layer of graphene. As the conducting probe contacts each successive layer of graphene, conducting through the probe discretely increases. The velocity of microprobe was kept at 1.00 μm/s (down) and −1.00 μm/s (up) alternately with a time span of 10 seconds and voltage=1.0 mV. Light blue color areas indicate the contacting durations between the microprobe and the composite surface. Discretized conduction is seen in the all-points histogram in FIGS. 4D and 21A-21B, with FIGS. 4E-F showing the SEM images of the deformation and penetration site with a tapered hole and peripheral diameter=19.5±0.5 μm Overall, 4j composites have anisotropic conduction with σ=4.17 S/cm in plane at $V_G \approx 0.185\%$ while no continuity orthogonal to alignment, with similar results for scroll fiber composites. This ability to individually address each layer electrically within the composite can allow for complex circuits to be formed therein.

The composition disclosed herein highlight new material properties available at this extreme platelet limit for nanocomposites. The $4^j$ stacking and shear scrolling methods offer straightforward, simple processing steps compared to more complex methods designed to achieve good dispersion at scale. The synthesis and transfer of CVD graphene is also advancing rapidly with recent increases in scale. See E. O. Polat et al., *Sci. Rep.* 5, 16744 (2015), and W. C. Oliver, G. M. Pharr, *J. Mater. Res.* 7, 1564 (1992), each of which is incorporated by reference in its entirety. Scrolled fiber architecture promise high stiffness, strength, and anisotropic conductivity while allowing many different host polymer matrices throughout the interior, distinct from a pure carbon fiber architecture. There exists a substantial opportunity to generate composite materials with new combinations of mechanical reinforcement, electrical and optical properties at miniscule additions of a semi-infinite nanoplatelet filler.

EXAMPLES

1. Chemical Vapor Deposition (CVD) Growth of Graphene (G)

Large-area monolayer graphene films were grown by a modified CVD method on copper foils (10). See A. C. Ferrari et al., *Phys. Rev. Lett.* 97, 187401 (2006), which is incorporated by reference in its entirety. Typically, a ~4.4 cm$^2$ (2.0×2.2 cm) Cu foil (Alfa Aesar, 99.8%, 25 μm thick, for graphene growth) was placed at the center of a 1-inch-diameter fused quartz tube in a tube furnace. The furnace tube was evacuated and heated to 1000° C. under a 30 sccm H$_2$ gas flow with a pressure of ~560 mTorr. After annealing for 30 min under these conditions, a CH$_4$ gas flow of 0.50 sccm was introduced and the temperature in the furnace tube was maintained for 15 min. The CH$_4$ gas flow was stopped after the growth period and the furnace was kept at 1000° C. for another 5 min. After that, the furnace was turned off and the Cu foil was cooled to room temperature under H$_2$ gas flow and removed from the tube furnace.

2. Spin Coating and Etching of Copper Substrate

Polycarbonate (PC) beads (MW=60,000 Da, Scientific Polymer Products, Inc.) were dissolved in chloroform with the assistance of gentle stirring and heating to 60° C. and various PC solutions with concentrations of 14, 8, 2, 1, and 0.1 wt % were prepared and used in the spin-coating process. Particularly, PC solution was spin-coated (2700 rpm, 1 min) onto the CVDG/Cu foil (2.0×2.2 cm typically) supported on a glass substrate. After drying at room temperature for 10 min, the PC-coated CVDG/copper was put into a 100° C. oven and annealed for 10 min, then removed out and cooled down to room temperature. The Cu foil was etched out by copper etchant ammonium persulfate (APS-100, TRANSENE CO INC) at 30° C. overnight with G/PC film suspended in the blue etchant solution. The film was transferred out from the solution by using a Si/SiO$_2$ wafer and rinsed with Milli-Q water four times for 10 min each time. After that, clean G/PC film was floated on the Milli-Q water and ready for use in the next step. This process can be conducted simultaneously for multiple copper foils and a number of PC/G films can be obtained at the same time.

3. Preparing i-Layer G/PC Composite

Two stacking methods can be used to prepare an i-layer G/PC film depending on the film thickness: G/PC films spin-casted by 14, 8, or 4 wt % PC solutions are strong enough to be free-standing and can be stacked after drying. Specifically, G/PC films from Step 2 were transferred onto a Si/SiO$_2$ wafer and dried at room temperature for 20 min, then dried in an oven at 100° C. under vacuum for 6 hours to remove any possible moisture. After drying, multiple (i, i=4, 9, or 10) free-standing films were stacked layer-by-layer. The assembly with i layers of G/PC film was sandwiched between two mirror-like, surface-polished iron plates (4.0×4.5 cm, wrapped with ultra-clean aluminum foil), which were further sandwiched between two larger iron plates (10.0×12.0 cm) and placed on a Hydraulic Press (4120, Carver, Inc.) Hot-pressing at 150-155° C. with a force of =67000 Newtons (equals to a compressive pressure of 37 MPa) was conducted for 10 min with the formation of the i-layer composite film. The thickness, graphene content, and transmittance of the resulted composite sheet were tested by scanning electron microscope (SEM), Raman spectroscopy, and UV-Vis-NIR spectrophotometer, respectively.

G/PC films spin-casted by 2, 1, and 0.1 wt % PC solutions are too thin to be free-standing after drying, and a stacking in water was conducted. Specifically, a piece of these thin films was first transferred to a Si/SiO$_2$ wafer whose surface has been covered with a very thin PC layer (i.e. spin-coated with 0.1 wt % PC solution). The wafer-supported film was dried under smooth nitrogen blowing at room temperature for 5 min and then attached to the wafer surface tightly after drying. This film-covered Si/SiO$_2$ wafer was used as the substrate again to capture another piece of thin G/PC film in water and stack it on the top of the previous film so that a 2-layer G/PC film was formed. The drying, stacking process was repeated multiple times and an i-layer (i=9, 10, or 20) composite film was prepared. The i-layer film with an increased thickness can be peeled off from the substrate in water smoothly. The composite film was dried at room temperature for 30 min, and then dried in an oven at 100° C. under vacuum for 48 h. After drying, a hot-pressing treatment of the film (same as above) was further conducted.

To prepare the PC control films, 8-14 wt % PC solution was used and a repeated (4-6 times) spin-coating process on a glass substrate was adopted. To prepare the thin PC films for the fabrication of scrolled fiber below, Hi-Grade Mica (Grade V2, 25×25 mm, ILD PELLA INC) was used as the substrate. The thin film spin-casted by 2 wt % or 1 wt % PC solution can be peeled off of the Mica smoothly in water.

4. The 4^j Method to Prepare the Aligned G/PC Composite

The 9, 10 or 20-layer sheet from step 3 was cut into four pieces with a razor blade equally (for thick composite sheet) or folded into four equal segments via tweezers without cutting (for thin sheet), resulting in 4 pieces/parts of G/PC composite sheet with a size=1.0×1.1 cm. They were further stacked and hot-pressed with the same process described in step 3. SEM, Raman spectroscopy, and UV-Vis spectrophotometer can be used to characterize the resulting sheet with increased thickness. This segmentation, stacking, hot-pressing procedure was repeated another time and a composite sheet with 144, 160 or 320 layers of G/PC films was obtained.

5. The Fabrication of the Scrolled Composite Fiber Via Transverse Shear Method The scroll fiber is prepared with a transverse shear method. Specifically, a single layer composite film, G/PC (2 wt %) with a size of 2.0×2.2 cm for example, was transferred on to Si/SiO$_2$ wafer (3.0×8.0 cm) with the graphene layer on the top side. A glass capillary was used to create starting folds at one end of the film (≈2 mm length). After that, another piece of Si/SiO$_2$ was used to sandwich the composite film partially (FIG. 1E) from the top side with a small inclination angle of approximately 10°. The top wafer was then moved forward smoothly (<1 cm/s) while the bottom one was kept stationary to scroll the film with the above folds serving as a starting point. The resulted scroll was dried at 100° C. under vacuum overnight before any characterization.

6. Layered Composite Based on Highly Ordered Pyrolytic Graphite (HPOG)

A 20×20×1 mm HOPG was cut into small pieces (ca. 5×5×1 mm) with 20-40 mg weight each. Iodine monochloride (ICl) was used as intercalant. Intercalation was made via vapor phase-intercalation method. ICl was introduced in a flask together with an open vial that had one piece of HOPG inside to avoid any contact with the liquid. The flask was sealed by a Teflon cap and warmed up to 35° C. for 2 days. The as prepared ICl-intercalated graphene was immediately placed in a quartz tube under 800° C. Ar conditions to obtain expanded graphene (EG). The expansion ratio was over 300 times along the cross-plane direction and the in-plane thickness of the worm like material was approximately 5 mm (depending on the starting size of HOPG piece). 5-6 mg of EG was weighted and transferred into a 10-mL Schlenk tube sealed with a rubber plug. 3 mL of styrene (monomer) with 0.5 wt % benzoyl peroxide (BPO, initiator) was added to the tube via a syringe. Three freeze-pump-thaw cycles were applied to remove any air in the solvent and EG. After that, the tube was placed into an oil bath of 100° C. to start the radical polymerization which took a time period of 24 hrs to complete. Then the tube was cracked to get the solid polymer product out and the EG/polystyrene composite was obtained by cutting off product portions without EG. The content of EG in the extracted composite product was calculated by weighting method and was approximately 1.2 wt % (ca. 0.6 vol %).

7. Characterization and Measurement

The optical images of fibers were acquired from Keyence VK-X200 laser microscope with sub-micron resolution, image stitching capability for long fibers, and capability to perform imaging in-situ during fiber loading, or ZEISS Axio Scope A1. The SEM visualization of the microtome-cut cross section and the microprobe-poked holes of the G/PC composite films were performed on a Zeiss FESEM Ultra Plus system or SEM 6010LA JEOL under high vacuum and operation voltage of 10 kV. The transmittance measurements were carried on with Uv-Vis-NIR spectrophotometer (Cary 5000, Agilent). Raman spectroscopy was performed on a Horiba Jobin Yvon LabRAM HR800 system using a 532 nm excitation laser, 10× objective lens with ~10 μm diameter spot size, and 1800 lines/mm grating. The thickness measurement with Spectroscopic Ellipsometer (Model XLS-100, J. A. Woollam Co., INC) was performed on the composite film deposed on $Si/SiO_2$ (100 nm) over the wavelength range of 400-800 nm at room temperature, the incidence angle was 70° and the spectra data was fit with a three phase model (Si, $SiO_2$, and film) to calculate the sample thickness. The electrical resistance of the planar composite strip and fiber samples was measured by Keithley 2002 MULTI METER with conductive silver paste as electrode materials at room temperature.

A dynamic mechanical analyzer (DMA Q800, TA Instruments) was used to characterize the mechanical and thermal properties of the planar composite and fibers at low strains. The multilayer planar composite film (40 layer, 10×11 mm) with $V_G \approx 0.082\%$ (spin-coated with 2 wt % PC solution) and $V_G \approx 0.185\%$ (by 1 wt % PC solution) were cut by razor blade to rectangular strips with width≈2 mm and length=11 mm for testing. The clamp for thin film tension was used. The gauge length after clamping was approximately 5.5-6.0 mm, and the amplitude was set to be 20 μm to make the strain amplitude a constant=0.34%. A preload=0.01 N and a frequency=1 Hz were used. The temperature was ramped from 30° C. to 180° C. at 3° C./min. In the DMA multi-strain mode to study the effect of strain, the frequency was 1 Hz and the temperature=30° C., the amplitude was raised from 3 μm to 60 μm with 20 data points included. For the DMA test of fibers, the fiber with length≈20 mm was first mounted onto cardboard via epoxy resin and the gauge length≈10 mm. The clamp for thin film tension was used and similar testing conditions including a fixed strain of 0.34%, preload=0.01 N, and frequency=1 Hz were used during the temperature sweeping. A frequency=1 Hz, temperature=30° C., the amplitude=3-200 μm in the multi-strain mode were used.

Uniaxial tensile testing of the multilayer composite films was conducted on an 8848 MicroTester (Instron, Corp.).

Figure 22:
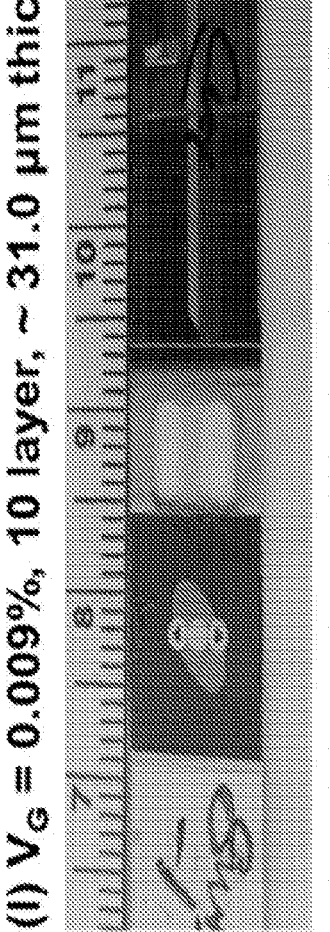
FIG. 22 shows typical images of the cardboard mounted composite sample for tensile test, three samples including (I) $V_G{\approx}0.009\%$, 10 layer, ~31.0 μm thick, (II) $V_G{\approx}0.082\%$, 40 layer, ~17.1 μm thick, and (III) $V_G{\approx}0.185\%$, 80 layer, 14.5 μm thick were listed as examples.
Figure 22:
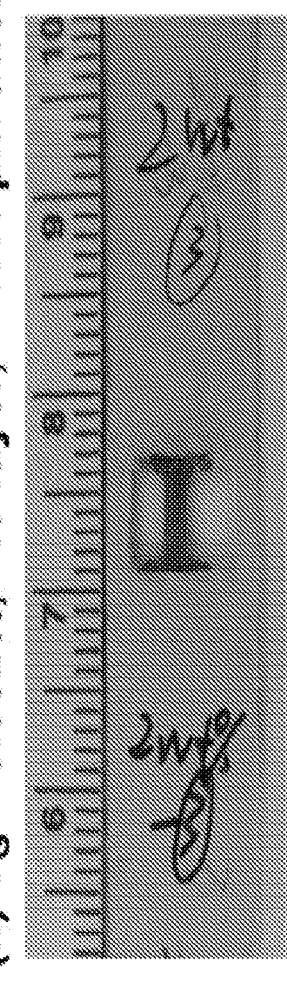
Figure 22:
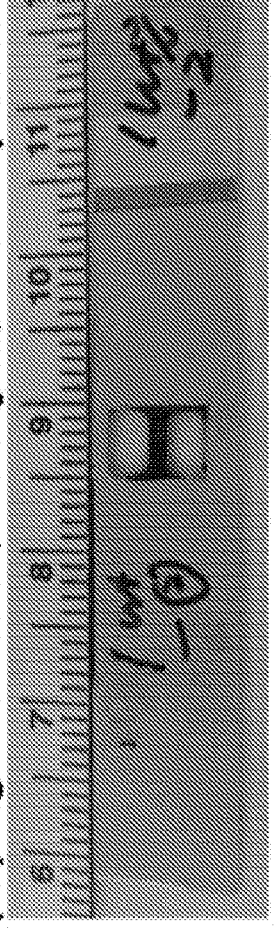

Multilayer composite films including G/PC (spin-coated by 8 wt % PC solution) (2.0×2.2 cm, 4 or 10-layered samples with thickness of 13-15 and 30-32 μm, respectively), G/PC (4 wt %) (2.0×2.2 cm, 10-layered samples with thickness≈11-12 μm), G/PC (2 wt %) (2.0×2.2 cm, 10 layers samples with thickness≈4-4.5 μm and 1.0×1.1 cm, 40 layers samples with thickness≈17.1 μm), G/PC (1 wt %) (2.0×2.2 cm, 10 layers samples with thickness=1.9-2.0 μm and 1.0×1.1 cm, 80 layers samples with thickness≈14.5 μm), and control sample films (2.0×2.2 cm) with various thickness in range of 7.1-27.1 μm were used in the test. These films were cut into dog-bone specimens with a razor blade and mounted/sandwiched onto two parallel cardboards via epoxy (drying at room temperature >24 hrs before tension test). The two cardboards are frames with equal sized windows that control the gauge length. The specimens have typical gauge lengths (used for strain in all cases) 5.0 mm and widths≈2.0 mm (FIG. 22). The test was carried out at room temperature with a displacement rate of 0.010 mm/s (strain rate=0.002 s$^{-1}$) and a 10-N capacity load cell. More than 10 specimens for both PC control and G/PC (8 wt %), 9 specimens for G/PC (4 wt %), and 5 specimens for both G/PC (2 wt %) and G/PC (1 wt %) have been measured to obtain the average values of the Young's modulus of each sample in strain range of 0.5-2.5%.

For the tension testing of composite fibers and pure PC fibers, the fibers were adhesively mounted onto laser-cut or hand-cut (using razor-blade) cardstock templates with ~5 or ~10 mm gage length, templates were then loaded into a Bose Electroforce TestBench load frame with 2.45 N-force load cell, an Instron 1122 load frame with a 22.2 N load cell, or 8848 MicroTester with a 10 N load cell. Samples were all pulled at 0.0125 mm/s or 0.025 mm/s (~0.0025 s$^{-1}$ strain rate). Three fibers were tested for the control-1 case (scrolled PC fibers from 1 wt % spin-cast PC, with no graphene), and at least five fibers were measured for each additional sample type (fiber-1, control-2, and fiber-2) to obtain the average values of the Young's modulus (0.5-2.5% strain), nominal strength, and strain to failure (Table 2).

TABLE 2

Summary data for fiber tensile testing in FIG. 19. Effective modulus values are calculated over the true strain interval of 0.5-2.5%.

| | Max true strain (%) | Max true stress (MPa) | Effective modulus (GPa) |
|---|---|---|---|
| Control-1 (N = 3) | | | |
| AVG | 57.31% | 73.56 | 0.41 |
| MIN | 26.28% | 38.80 | 0.30 |
| MAX | 92.35% | 123.10 | 0.47 |
| STDDEV | 33.22% | 44.05 | 0.09 |
| PCG Fiber-1 (N = 5) | | | |
| AVG | 55.83% | 96.48 | 0.63 |
| MIN | 9.58% | 28.59 | 0.30 |
| MAX | 91.73% | 161.72 | 0.94 |
| STDDEV | 40.27% | 57.38 | 0.26 |
| Control-2 (N = 6) | | | |
| AVG | 84.38% | 96.65 | 0.68 |
| MIN | 74.73% | 61.31 | 0.33 |
| MAX | 95.42% | 120.71 | 1.08 |
| STDDEV | 7.40% | 22.51 | 0.29 |
| PCG Fiber-2 (N = 5) | | | |
| AVG | 73.41% | 74.10 | 0.85 |
| MIN | 54.27% | 42.75 | 0.42 |

TABLE 2-continued

Summary data for fiber tensile testing in FIG. 19. Effective modulus
values are calculated over the true strain interval of 0.5-2.5%.

|  | Max true strain (%) | Max true stress (MPa) | Effective modulus (GPa) |
|---|---|---|---|
| MAX | 109.85% | 136.07 | 1.32 |
| STDDEV | 21.55% | 38.38 | 0.34 |

Differential scanning calorimetry (DSC) measurements were performed on a Discovery DSC of TA Instruments. A Tzero Aluminum pan was used as reference and samples around 1~2 mg were heated from room temperature to 200° C. at 10° C./min and then cooled to 40° C. at 10° C./min, the data of the second heating ramp from 40 to 200° C. at 10° C./min was collected to analyze the glass transition temperatures ($T_g$), which was read as the middle of the change in heat capacity. In the test, samples including control-PC (bulk), G/PC (the film unit was spin coated by 8 wt % PC solution, 10 layers, $V_G{\approx}0.009\%$), G/PC (spin-coated by 4 wt % PC solution, 144 layers, $V_G{\approx}0.030\%$), G/PC (2 wt %, 40 and 320-layer samples have the same DSC curve, $V_G{\approx}0.082\%$), control-PC (2 wt %, 40 layer), G/PC (1 wt %, 160 layer, $V_G{\approx}0.185\%$), and control-PC (1 wt %, 160 layer) were used. G/PC (2 wt %) and control-PC (2 wt %) have the same interlayer thickness around 390 nm, G/PC (1 wt %) and control-PC (1 wt %) have the same interlayer thickness of approximately 180 nm.

Figure 6B:
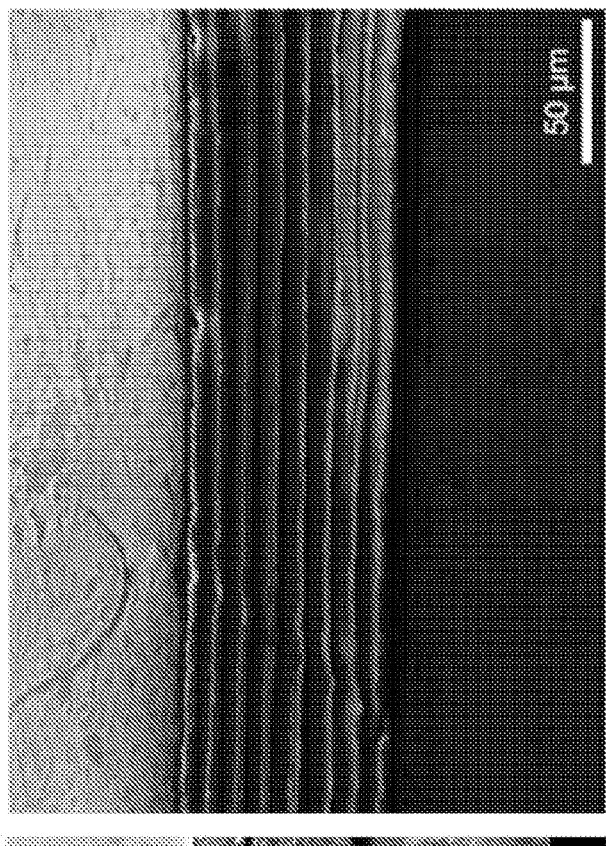
FIGS. 6A-6H show various multilayer G/PC bulk composites with different interlayer thickness and graphene content.
Figure 6B:
Figure 6A:
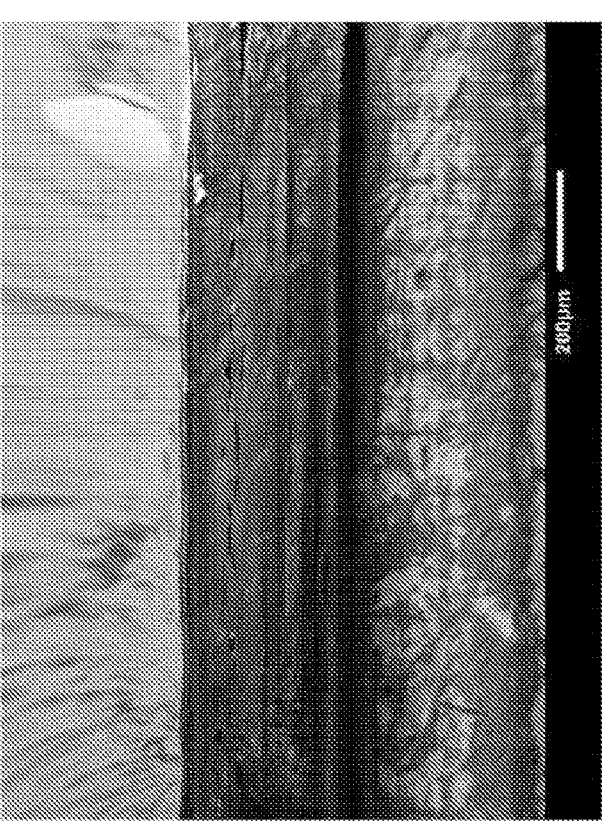
Figure 6D:
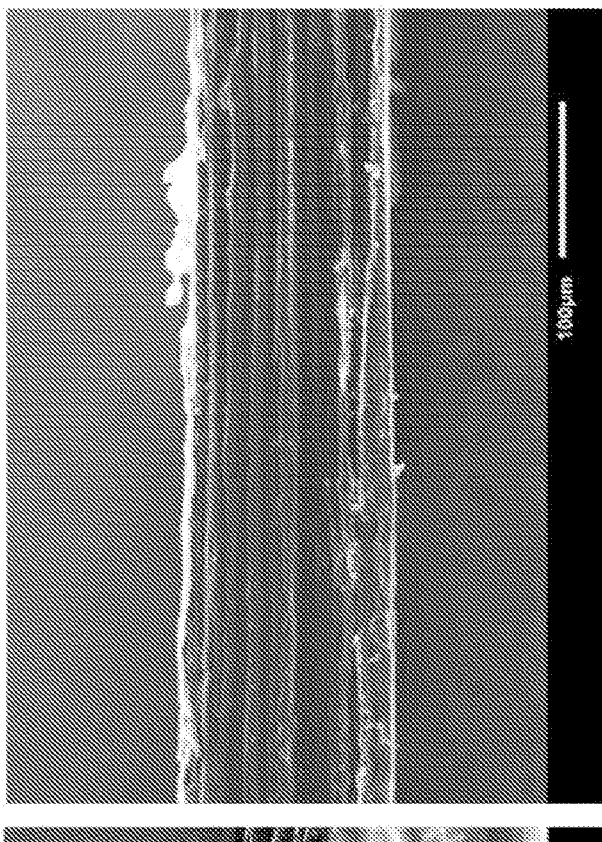
Figure 6D:
Figure 6C:
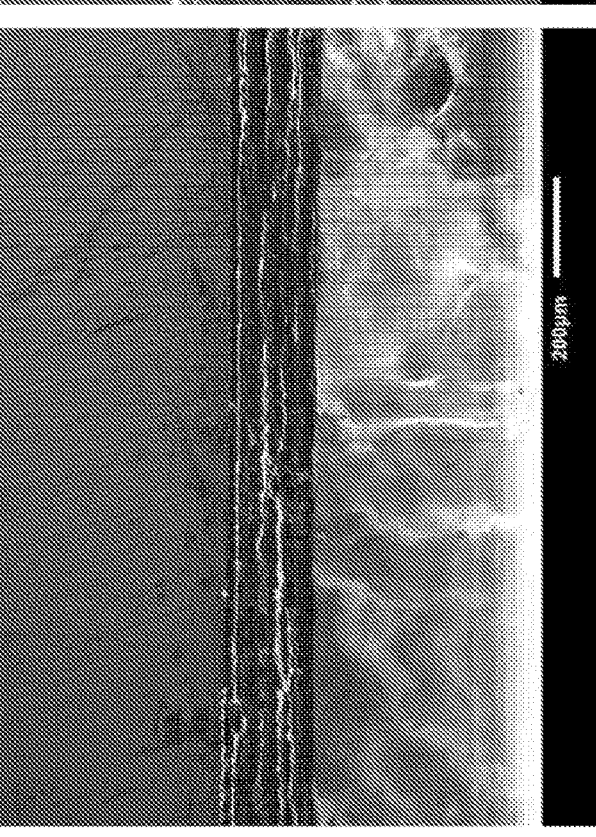
Figure 6F:
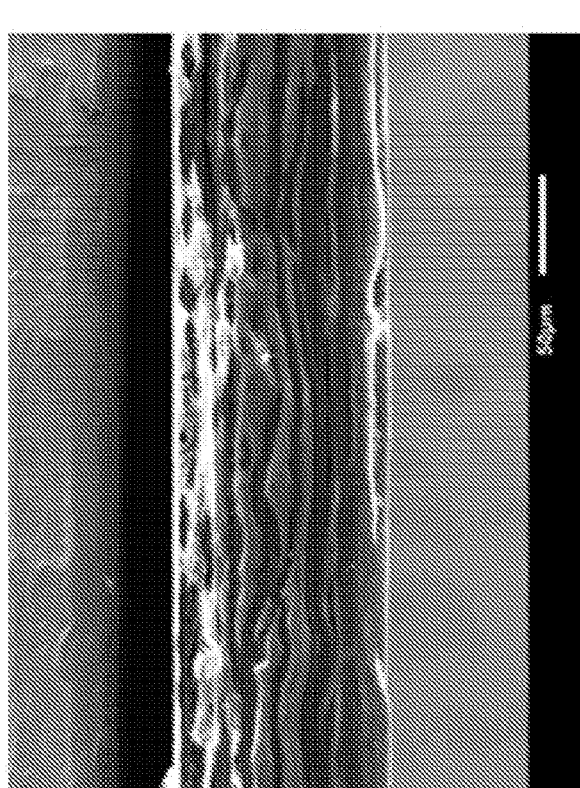
Figure 6E:
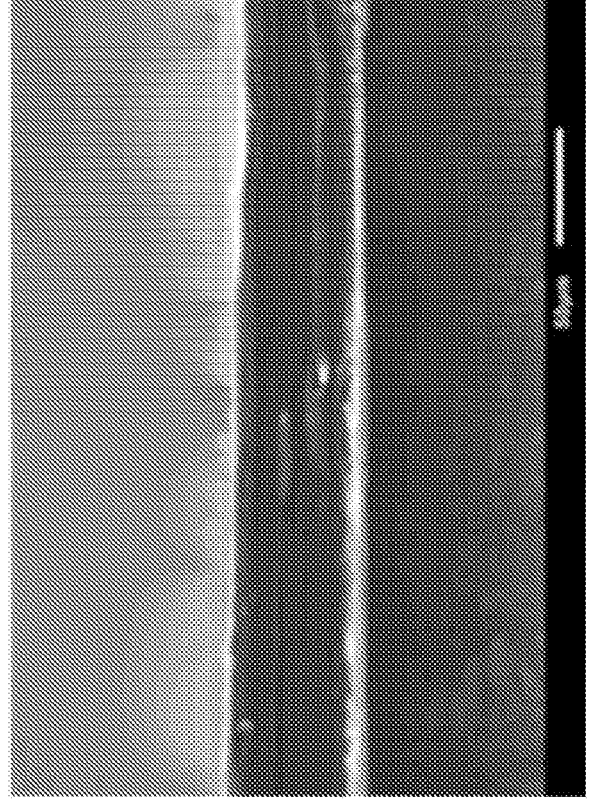
Figure 6H:
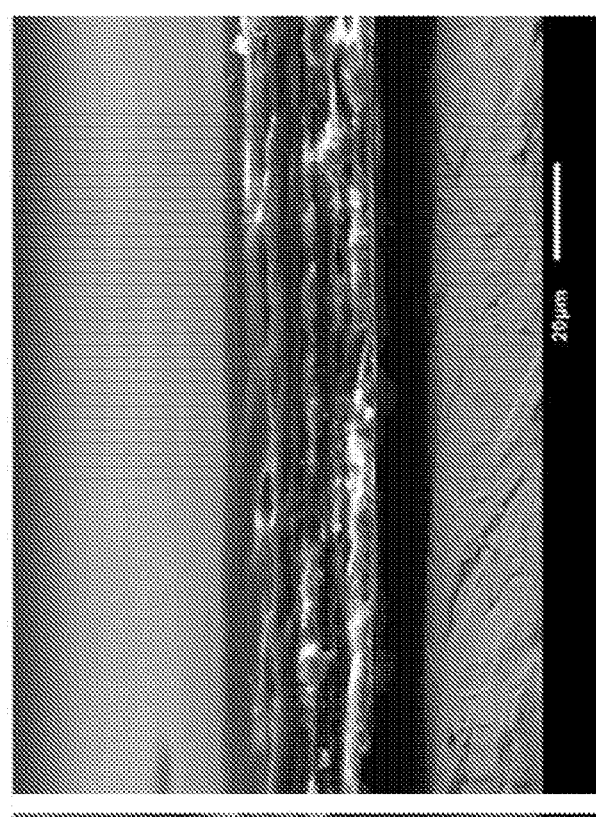
Figure 6G:
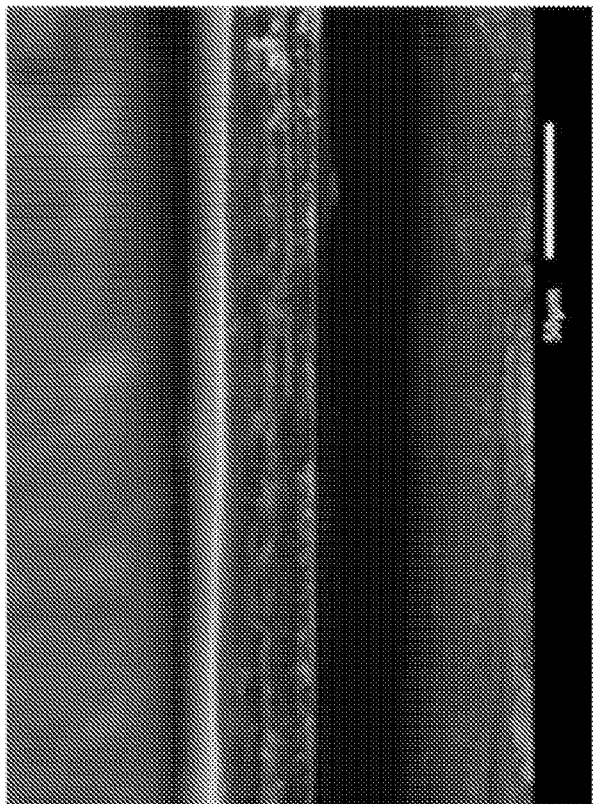

Microindentation experiments were conducted using a NanoTest NTX system (Micro Materials, Ltd) at room temperature, which is capable of measuring and applying loads and depths ranging from 10 microNewtons to 20 Newtons and up to 30 micrometers, respectively. A Berkovich diamond pyramidal probe with a nominal radius of curvature=150 nm was used. FIG. 15A shows a typical load-depth hysteresis from the microindentation test of the G/PC composite sample (320 layers, 110 μm thick based on scanning electron microscopy (FIG. 6F). In FIGS. 6A-6H, the mass fraction in the bracket means the concentration of PC solution used for spin-coating. G/PC (14 wt %), G/PC (8 wt %), G/PC (4 wt %), G/PC (2 wt %), and G/PC (1 wt %) have graphene volume fraction of 0.003%, 0.009%, 0.030%, 0.082%, and 0.185%, respectively. Sample (A) is a control sample prepared by $4^j$ stacking method and its starting unit is the G/PC film spin-coated by 8 wt % PC solution with mica as substrate. The load function profile was trapezoidal with 20 sec loading, 10 sec holding at peak load to minimize creep that may affect the unloading behavior, and 20 sec unloading. The indentation is load-controlled and the maximum indentation depth for each sample was chosen to be at least ten times smaller than the total thickness of the sample to avoid the finite thickness effect. For each sample, 25 indentations were conducted over a square grid array (5×5), and the distance between the adjacent indentations was kept at 50-100 μm to avoid mutual interferences. Various samples (FIGS. 1B-1D and 6) including PC control (~326 μm), G/PC composite (144 layers, ~290 μm), G/PC composite (144 layers, ~132 μm), G/PC composite (320 layers, ~110 μm), and G/PC composite (320 layers, ~65 μm) were tested. FIG. 15B shows 25 indentation hystereses obtained for the composite sample (320 layers, ~110 μm) to illustrate data reproducibility. The morphology of the resulting indentations is illustrated in FIGS. 15C-15D, with the PC matrix control sample and composite sample G/PC (320 layers, ~65 μm) as examples, respectively. The Young's elastic modulus (E) of the sample can be determined by the following two equations based on Oliver-Pharr indentation method (see W. C. Oliver, G. M. Pharr, *J. Mater. Res.* 7, 1564 (1992), which is incorporated by reference in its entirety):

$$S = \frac{dP}{dh} = \frac{2}{\sqrt{\pi}} E_r \sqrt{A} \tag{1}$$

$$\frac{1}{E_r} = \frac{(1 - v_s^2)}{E_s} + \frac{(1 - v_i^2)}{E_i} \tag{2}$$

S is the stiffness of the upper portion of the unloading curve, as FIG. 15B shows. $E_r$ is the reduced elastic modulus; A is the projected area of the elastic contact and is $$24.56 h_{max}^2$$

for an ideal Berkovich indenter geometry. $E_s$ and $v_s$ are the Young's modulus and Poisson's ratio of the sample, respectively; and $E_i$ and $v_i$ are the Young's modulus and Poisson's ratio of the indenter, respectively, where $E_i=1141$ GPa and $v_i=0.07$ are assumed for the diamond indenter.

Figure 20B:
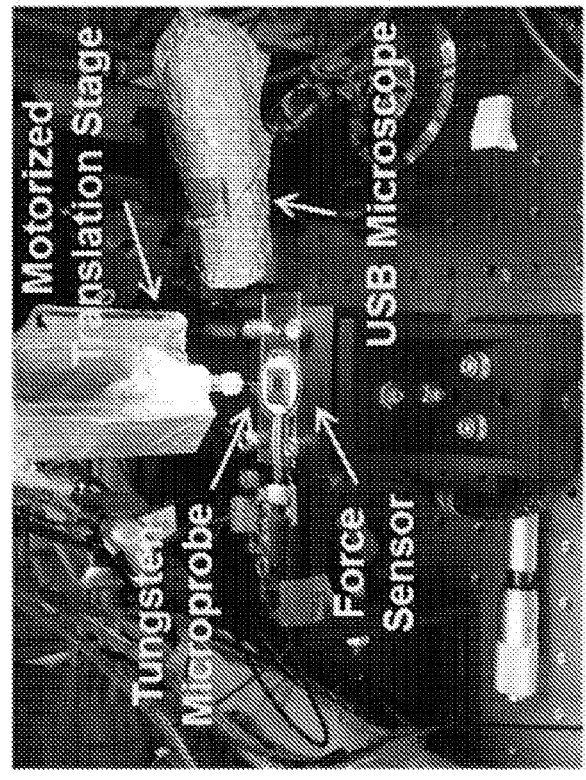
FIGS. 20A-20D show the apparatus setup of the microprobe test system.
Figure 20A:
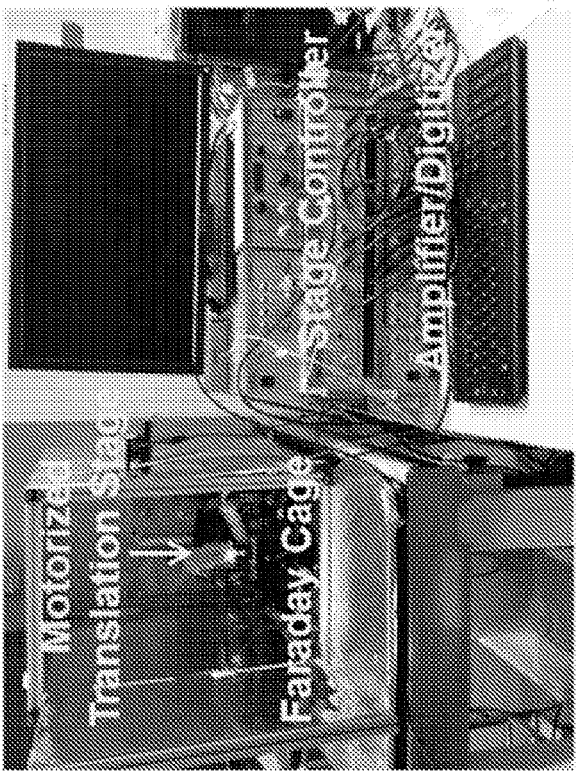
Figure 20D:
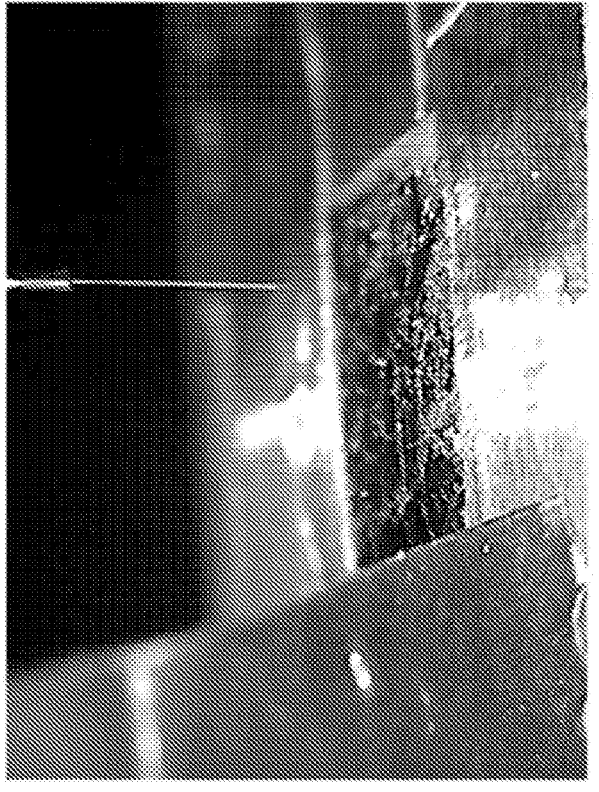
Figure 20C:
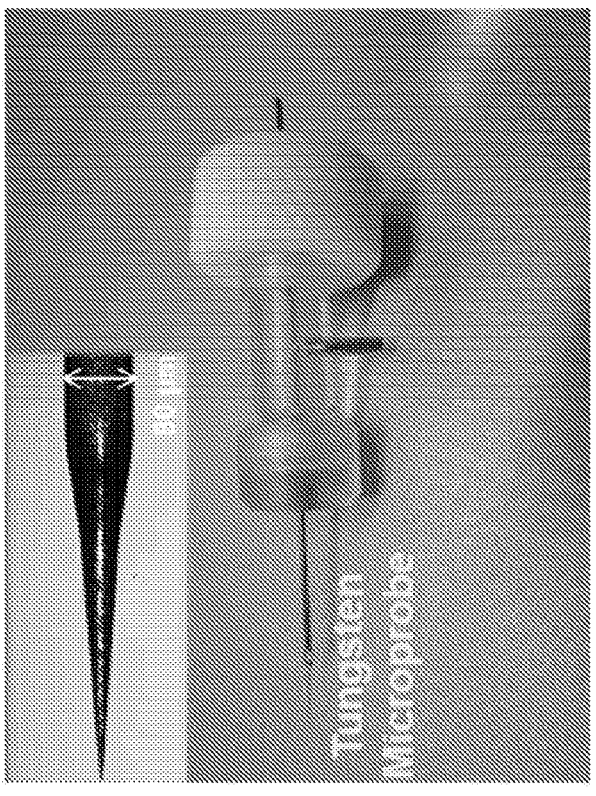

The microprobe penetration tests (as schemed in FIGS. 4A and 20) and the simultaneous real-time measurements of applied force and current were performed on a motorized translation stage (Thorlabs, MT series) with a Multiclamp 700B amplifier and Digidata 1440A digitizer (purchased from Molecular Devices Inc.). The piezo-nanopositioner system was integrated with a custom high-sensitivity force sensor system (FlexiForce Quick Start Board and A401 model, Tekscan Inc.). In FIG. 20A, a motorized translation stage (Thorlabs, MT series) with 50 nm resolution was used as the positioning stage for the microprobe penetration. The microprobe holder is connected to the amplifier headstage containing the electronics. The electric current signal was collected with a Multiclamp 700B amplifier and Digidata 1440A digitizer (Molecular Devices Inc.). The applied force was collected with a custom high-sensitivity force sensor system (FlexiForce Quick Start Board and A401 model, Tekscan Inc.). The entire setup was mounted on a Kinetic Systems workstation with active air suspension (9100 Series) to minimize vibrations. The piezo-nanopositioner, amplifier, digitizer and force sensor were controlled from a computer. A Clampex data acquisition software (version 10.3) was used to record the data of electric current, applied force, position of the microprobe and time trace at a 20 kHz sampling rate. For the microprobe penetration of composite films, a tungsten microprobe (Model 7XH, SE Technologies Corp.) with a shaft diameter of 80 μm and a tip diameter as low as 100 nm was mounted on the piezo-nanopositioner, as shown in the optical microscope image (FIG. 20C). The aligned G/PC composite films were cut to squares of 6.0 mm size and fixed on silicon wafers with conductive paste and copper tape adhered around the film edges for measuring transverse electric conduction. The applied voltage was kept at 1.0 mV and the velocity of the microprobe was maintained at 1.00 μm/s during the moving process of the tungsten microprobe. The signals of electric current, applied force, position of the microprobe and time trace were simultaneously recorded by Clampex data acquisition software (Molecular Devices Inc.).

1. Physical Model for Raman Spectra Characterization of Layered Composites

Figure 7C:
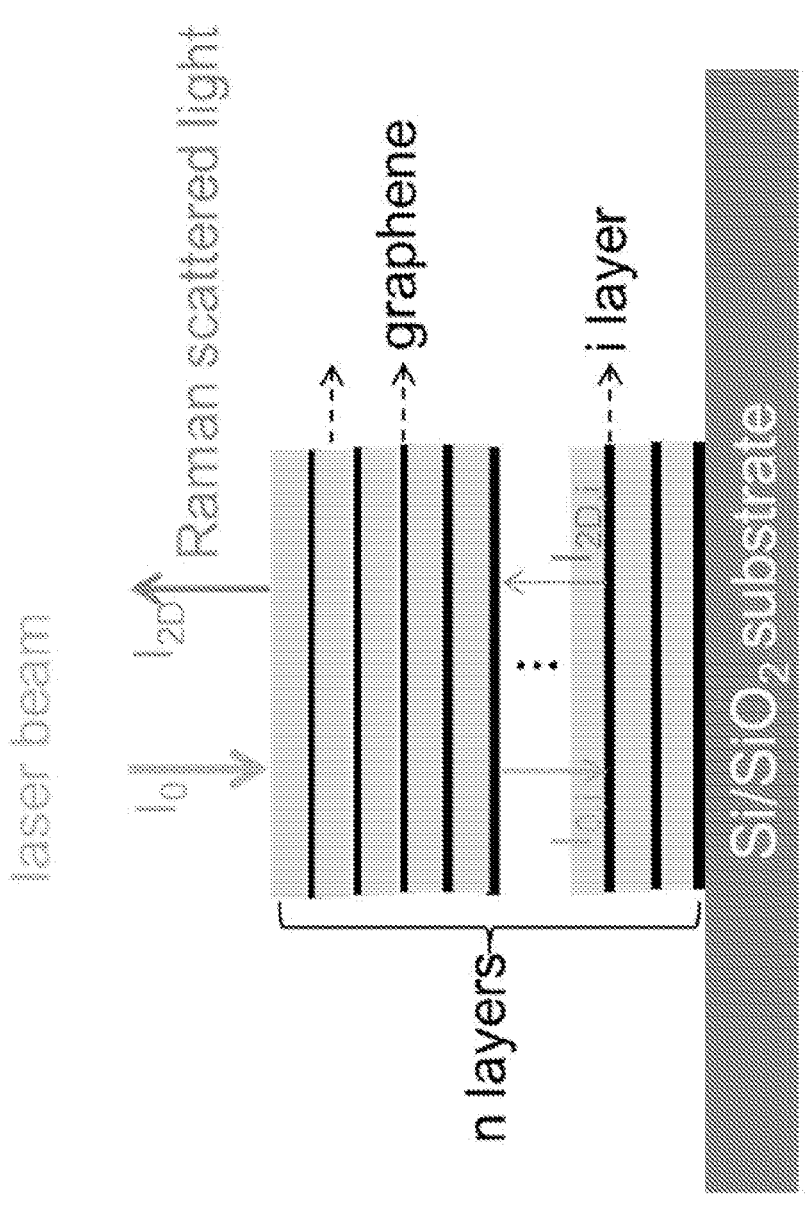

As the n-layer composite of FIG. 7C shows, the intensity of the incident laser beam ($\lambda$=532 nm) is $I_0$ and the intensity of the scattered light at a given wavelength from graphene, e.g. the 2D peak at 2680 $cm^{-1}$ is $I_{2D}$. Assuming each G/PC layer is identical, the length for the incident light traveling from the air to the $i^{th}$ layer graphene or for the scattered light leaving from the $i^{th}$ layer graphene to the air is, $$l_i = i \times t_p + (i-1) \times t_G \tag{3}$$

where $t_p$ is the thickness of the polymer layer, $t_G$ is the thickness of graphene sheet. For the n-layer composite, the total traveling length ($l_{total}$) for the incident light to arrive at each graphene sheet (or for the scattered light departing from each graphene sheet to air) is, $$l_{total} = \sum_{i=1}^{n} [i \times t_p + (i-1) \times t_G] = \frac{1}{2}n(n+1)t_p + \frac{1}{2}n(n-1)t_G \tag{4}$$

This traveling length can be normalized by dividing the layer number, so a characteristic light traveling length ($l_{coverage}$) for the n-layer composite is, $$l_{average} = l_{total}/n = \frac{1}{2}(n+1)t_p + \frac{1}{2}(n-1)t_G \quad (n \geq 1) \tag{5}$$

Assuming the intensity of the incident light is $$I'_0$$

for the graphene layer at a thickness of $l_{average}$ and the intensity of the scattered light is $$I'_{2D}$$

at this graphene layer, $$I'_{2D}$$

should be directly proportional to $$I'_0$$

with a specific coefficient of $k_0$ (~$10^{-6}$).

$$I'_{2D} = k_0 I'_0 \tag{6}$$

For a n-layer composite, according to Lambert-Beer law, the following equations are simply, $$lg\frac{I_0}{I'_0} = \kappa_{p,532nm} \times \frac{1}{2}(n+1)t_p + \kappa_{G,532nm} \times \frac{1}{2}(n-1)t_G \tag{7}$$

$$lg\frac{I'_{2D}}{I_{2D}/n} = \kappa_{p,2D} \times \frac{1}{2}(n+1)t_p + \kappa_{G,2D} \times \frac{1}{2}(n-1)t_G \tag{8}$$

where $\kappa_{p,532}$ nm and $\kappa_{G,532\ nm}$ are the extinction coefficients of the 532 nm laser beam in PC and graphene, respectively, $\kappa_{p,2D}$ and $\kappa_{G,2D}$ are the extinction coefficients of the 2D signal of graphene at 2680 $cm^{-1}$ (~3731.3 nm) in PC and graphene, respectively.

Combining eqs. 5-8, $$lg\frac{I_0 I'_{2D}}{(I_{2D}/n)I'_0} = \frac{1}{2}(\kappa_{p,532nm}t_p + \kappa_{G,532nm}t_G + \kappa_{p,2D}t_p + \kappa_{G,2D}t_G)n + \tag{9}$$
$$\frac{1}{2}(\kappa_{p,532nm}t_p - \kappa_{G,532nm}t_G + \kappa_{p,2D}t_p - \kappa_{G,2D}t_G)$$

$$-lg(I_{2D}/n) = kn + c \tag{10}$$

$$k = at_p + bt_G$$

$$a = \frac{1}{2}(\kappa_{p,532nm} + \kappa_{p,2D})$$

$$b = \frac{1}{2}(\kappa_{G,532nm} + \kappa_{G,2D})$$

$$c = \frac{1}{2}(\kappa_{p,532nm}t_p - \kappa_{G,523nm}t_G + \kappa_{p,2D}t_p - \kappa_{G,2D}t_G) - lgk_0 - lgI_0$$

2. Understanding the Interlayer Sliding in Uniaxial Tensile Test

Figure 14B:
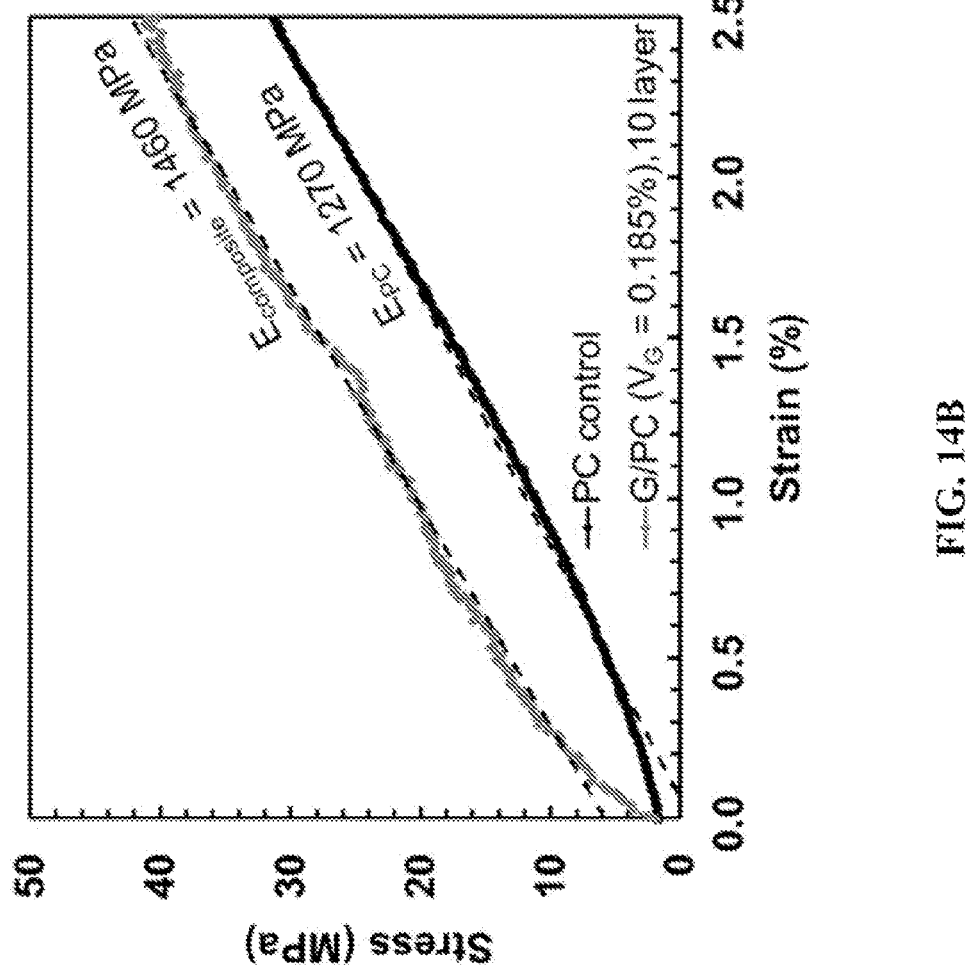
Figure 14C:
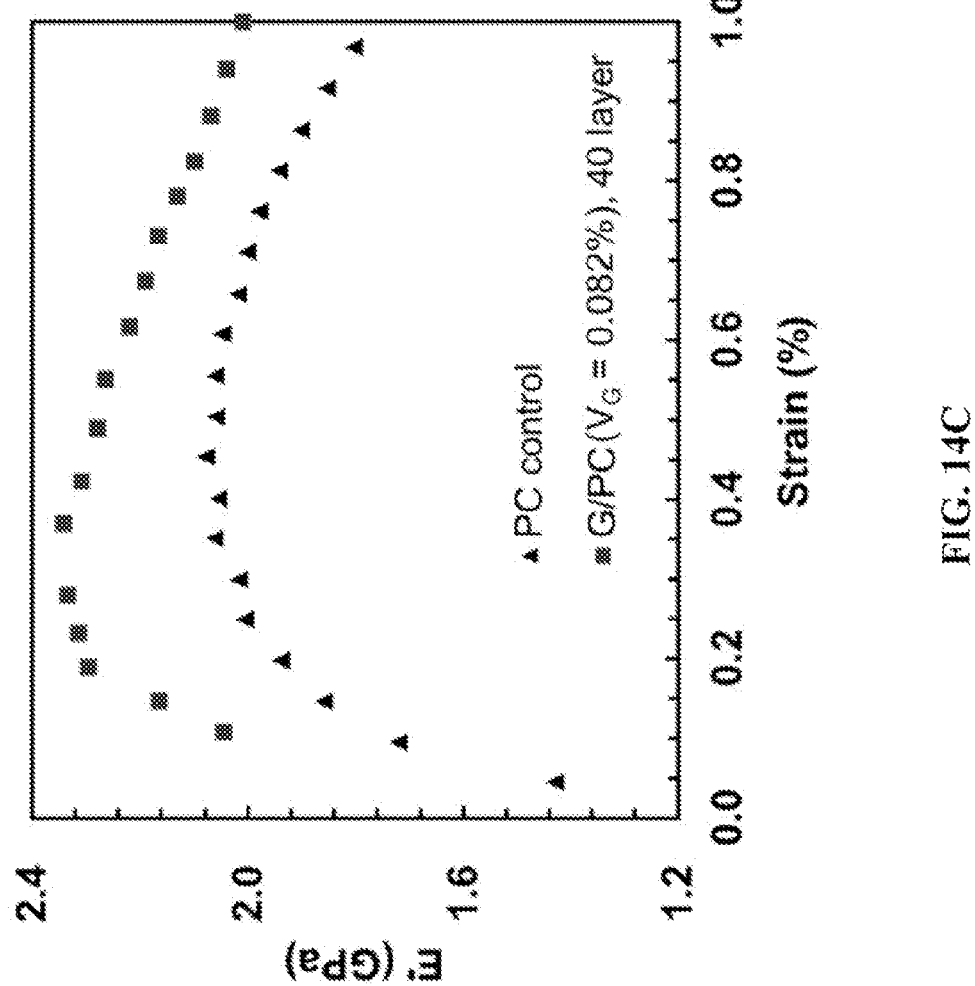
Figures 17A, 17B:
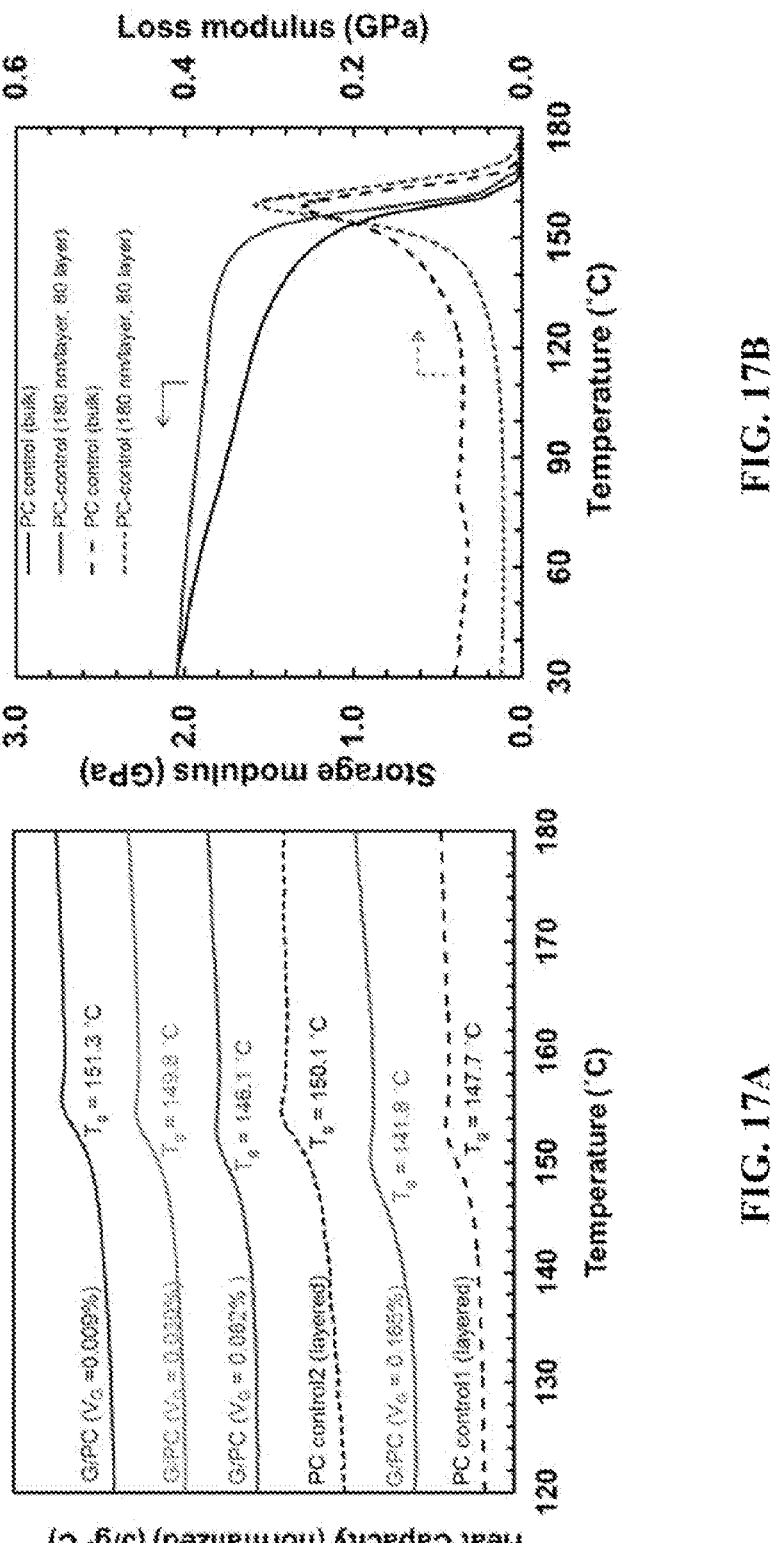
FIGS. 17A-17B show thermal properties study of the layered composites.

The tensile modulus of the composite in the longitudinal direction ($E_{longitudinal}$) (parallel to the graphene plane) linearly increases with $V_G$ and $\Delta E_{longitudinal}$=0.21 GPa at $V_G\approx0.185\%$, overall the graphene is more compliant in this mode at 117 GPa as this motion traverses larger ranges of strain in the sample, sensitizing it to tensile failure in stress transfer from PC to graphene, i.e., in plane slippage between graphene and PC layer occurs in tension for the composites. (FIG. 14A). Accordingly, the $E_{longitudinal}$ of a 10 layer $4^j$ sample based on the slope of the engineering strain-stress curve at less than 0.5% strain is 1.94 GPa and higher than the value of 1.46 GPa at higher strains (0.5-2.5%) and a lower strain rate of 0.002 $s^{-1}$ (FIG. 14B). Also, E' decreases compared to the matrix at higher layer numbers with 40 layers at 0.32 GPa for strain less than 0.40% but dropping to 0.15 GPa above 0.5% (FIG. 14C). These results agree with the observed critical strain for onset of interfacial sliding ($\varepsilon_c$) of 0.4% for monolayer graphene on glassy poly(methyl methacrylate) and 0.3% on polyethylene terephthalate, both measured by in-situ Raman, and also 0.2% for CVDG between poly(ethyl methacrylate) layers based on nanobubble inflation. See L. Gong et al., *Adv. Mater.* 22, 2694 (2010), and T. Jiang, R. Huang, Y. Zhu, *Adv. Funct. Mater.* 24, 396 (2014), X. Li, J. Warzywoda, G. B. McKenna, *Polymer* 55, 4976 (2014), each of which is incorporated by reference in its entirety. In these systems, just as in the $4^j$ samples, the interlayer sliding is expected based on the relatively weak interfacial binding between the untreated graphene and the PC matrix, as evidenced by the reduced $T_g$ of the nanocompoistes in FIG. 17. When nanoconfining a thermoplastic polymer into a thin film with a thickness <100 nm will align the polymer chains and increase the modulus in the rubbery regime at T>T$_g$ (58, 59). The thermoplastic modulus of the 80-layer control sample in this work (interlayer thickness 180 nm, similar to the composite sample with the highest V$_G$ of 0.185%) is higher than the PC control (bulk) at 140-150° C., illustrating such nanoconfinement effect. The two samples, however, have a same elastic modulus (or storage modulus) in the glassy state of 30° C. Such sliding, however, can be suppressed via interface modification, i.e. introducing functional groups to promote the binding between graphene and polymer layer.

3. Understanding the Microindentation Results

In the microindentation, the loading is spatially localized and the imposed stress of the Berkovich tip is multidirectional, but the compressive force is applied perpendicular to the graphene layers such that layer bending is anticipated. The continuous, one-atom thick inclusion possesses very low modulus in bending, which scales cubically in thickness, approaching an ideal 2D membrane. See C. Lee, X. Wei, J. W. Kysar, J. Hone, *Science* 321, 385 (2008), which is incorporated by reference in its entirety. In this mode, E increases from 2.08 GPa at 0% graphene to 3.18 GPa at 0.185% with a difference around 1.10 GPa, and scales approximately. linearly with V$_G$, at effective rule-of-mixtures E$_G$=824 GPa (FIG. 15E). This appears consistent with the Young's modulus from indentation of GO films reaching a maximum when continuity of an intercalating water layer between the graphitic planes is reached. See Y. Gao et al., *Nat. Mater.* 14, 714 (2015), which is incorporated by reference in its entirety. E$_G$ measured by microindentaion is higher than that (117 GPa) by the uniaxial tension above, the reason could be that each microindentation samples multiaxial deformation in a localized position near the sample surface and the composite modulus is determined from an unloading curve only involving elastic recovery, while in uniaxial tension, E$_{longitudinal}$ was determined from a forward loading curve and the whole composite sustains the load along the graphene layers and graphene-polymer interface.

4. The Mechanical Model of Unidirectional and 3D Random Platelet Filled Composites For nanocomposites with anisotropic platelet fillers, both the Halpin-Tsai equation and the Mori-Tanaka theory can describe the Young's modulus of the composites with either unidirectionally or 3D randomly orientated nanoplatelets. See J. C. H. Affdl, J. L. Kardos, *Polym. Eng. Sci.* 16, 344 (1976), T. Mori, K. Tanaka, *Acta Metall.* 21, 571 (1973), and G. P. Tandon, G. J. Weng, *Polym. Compos.* 5, 327 (1984), each of which is incorporated by reference in its entirety. The Halpin-Tsai equation considers rectangular plates while Mori-Tanaka theory treats the fillers as ellipsoidal particles. See T. D. Fornes, D. R. Paul, *Polymer* 44, 4993 (2003), which is incorporated by reference in its entirety. To model the composite stiffness with these equations and theory, primary assumptions include that the filler and matrix are well bonded, the matrix is isotropic, and no particle-particles interaction. See T. D. Fornes, D. R. Paul, *Polymer* 44, 4993 (2003), which is incorporated by reference in its entirety.

4.1. Halpin-Tsai Equation

For parallel aligned nanoplatelets, the Young's modulus in longitudinal direction (E$_\parallel$) is $$E_\parallel = \left(\frac{1 + 2a\eta_\parallel v_f}{1 - \eta_\parallel v_f}\right)E_m \tag{11}$$

-continued $$\eta_\parallel = \frac{E_f / E_m - 1}{E_f / E_m + 2a}$$

where E$_f$ and E$_m$ are the Young's modulus of the nanoplatelet fillers and polymer matrix, respectively. v$_f$ is the volume fraction of the fillers, and a is the aspect ratio of the filler (a=width/thickness). When a→∞, equation 11 reduces to the rule of mixtures, $$E_\parallel = E_f v_f + E_m(1 - v_f) \tag{12}$$

The Young's modulus in the transverse direction (E$_\perp$) is insensitive to the platelet aspect ratio, $$E_\perp = \left(\frac{1 + 2\eta_\perp v_f}{1 - \eta_\perp v_f}\right)E_m \tag{13}$$

$$\eta_\perp = \frac{E_f / E_m - 1}{E_f / E_m + 2}$$

If the nanoplatelets are 3D randomly orientated, the modulus contribution of both longitudinal and transverse mode are considered with the introduction of two coefficients m and n, $$E_{3D} = mE_\parallel + nE_\perp \tag{14}$$

m=0.49 and n=0.51 approximately according to the laminate theory. See T. D. Fornes, D. R. Paul, *Polymer* 44, 4993 (2003), and M. Van Es, F. Xiqiao, J. Van Turnhout, E. Van der Giessen, in *Specialty Polymer Additives: Principles and Applications.* (Blackwell Science, CA Malden, MA (2001) Chapter 21, 2001), vol. 484, chap. 21, each of which is incorporated by reference in its entirety.

4.2. Mori-Tanaka Theory

Mori-Tanaka average stress theory was derived on the principles of Eshelby's inclusion model and considers a non-dilute composite with many identical particles. See T. Mori, K. Tanaka, *Acta Metall.* 21, 571 (1973), which is incorporated by reference in its entirety. Complete analytical equations for the elastic moduli of the polymer nanocomposite with aligned spheroidal inclusions have been developed by Tandon and Weng. See G. P. Tandon, G. J. Weng, *Polym. Compos.* 5, 327 (1984), which is incorporated by reference in its entirety.

$$E_\parallel = \left(\frac{A}{A + v_f(A_1 + 2c_m A_2)}\right)E_m \tag{15}$$

$$E_\perp = \left\{\frac{2A}{2A + v_f[-2c_m A_3 + (1 - c_m)A_4 + (1 + c_m)A_5 A]}\right\}E_m \tag{16}$$

where A, A$_1$-A$_5$ are functions of the Eshelby's tensor, the physical properties (the Young's modulus E$_m$ and Poisson's ratio c$_m$) and geometries of the filler and the matrix, v$_f$, and a. With E$_\parallel$ and E$_{195}$, E$_{3D}$ for the composite with 3D randomly orientated nanofillers can be calculated with eq. 14 above.

For PC matrix, the approximate elastic modulus is E$_m$=2.1 GPa and Poisson's ratio is c$_m$=0.38 (41-43). See C. A.

Harper, *Modern Plastics Handbook*. (McGraw-Hill Professional, New York, 2000), J. A. Brydson, *Plastics Materials, 7th ed*. (Butterworth-Heinemann, Oxford, 1999), and M. L. Berins, *SPI Plastics Engineering Handbook of the Society of the Plastics Industry, Inc., 5th ed*, (Springer Publishing, New York, 2000), each of which is incorporated by reference in its entirety. For the platelet filler of graphene, the approximate in-plane small-strain isotropic elastic modulus=1000 GPa and Poisson's ratio=0.186. See C. Lee, X. Wei, J. W. Kysar, J. Hone, *Science* 321, 385 (2008), and F. Liu, P. Ming, J. Li, *Phys. Rev. B* 76, 064120 (2007), each of which is incorporated by reference in its entirety. With the equations above, the elastic modulus of the graphene/polycarbonate composites ($E_c$) containing unidirectional and 3D random platelets with aspect ratio a values from (a) 100, (b) 10,000, to (c) 1000,000 were calculated and plotted in FIGS. 16A-16C. See J. C. H. Affdl, J. L. Kardos, *Polym. Eng. Sci.* 16, 344 (1976), T. Mori, K. Tanaka, *Acta Metall.* 21, 571 (1973), and G. P. Tandon, G. J. Weng, *Polym. Compos.* 5, 327 (1984), each of which is incorporated by reference in its entirety. The parallel and transverse $E_c$ for the unidirectional composite were labeled with red and black color, respectively, while $E_c$ for the 3D random composite with blue color. In the calculation, $E_m$=2.1 GPa and Poisson's ratio $c_m$=0.38 were used for PC. E=1000 GPa and Poisson's ratio=0.186 were used for graphene. See C. A. Harper, *Modern Plastics Handbook*. (McGraw-Hill Professional, New York, 2000), J. A. Brydson, *Plastics Materials, 7th ed*. (Butterworth-Heinemann, Oxford, 1999), M. L. Berins, *SPI Plastics Engineering Handbook of the Society of the Plastics Industry, Inc., 5th ed*., (Springer Publishing, New York, 2000), C. Lee, X. Wei, J. W. Kysar, J. Hone, *Science* 321, 385 (2008), and F. Liu, P. Ming, J. Li, *Phys. Rev. B* 76, 064120 (2007), each of which is incorporated by reference in its entirety. All the dashed lines are based on Halpin-Tsai equations while the solid lines on Mori-Tanaka theory. Obviously, $E_c$ in the parallel direction (or $E_{\parallel}$) for the unidirectional composite is higher than for the 3D random composite ($E_{3D}$), and much higher than $E_H$ in the transverse direction (or $E_{\perp}$) for the unidirectional composite. Both $E_{\parallel}$ and $E_{3D}$ increase with the enhanced a from 100, 10,000 to 1000,000 at a given $v_f$. Compared to Mori-Tanaka theory, Halpin-Tsai equation gives higher $E_{\parallel}$ and $E_{3D}$ at the same $v_f$ and a, but the difference becomes smaller at higher a and is vanishingly small at a=1000,000 (FIG. 16C).

5. Mechanical Reinforcement Mechanism of the Graphene Oxide-Based Nanocomposite Systems Materials on the basis of "ΔE" were compared rather than, for example, percentage change in E or E' ratio. This choice is made because of the drastic difference in modulus between the graphene reinforcement (1.0 TPa) compared to a typical polymer matrix (~0.5-5 GPa), and the desire to compare reinforcement efficiencies across multiple polymer systems in the literature. Modulus percentages or ratios will be very sensitive to the modulus of the polymer matrix, obscuring comparisons, whereas ΔE will be dominated by the reinforcing contributions of the graphene.

Adding a very small amount of nanocarbon fillers, graphene oxides (GOx) particularly, results in a significant enhancement of elastic modulus, for example, Brinson et al. reported 33% enhancement of Young's modulus E (ΔE=0.69 GPa) at only 0.01 wt % (or 0.006 vol %) graphene for poly(methyl methacrylate) (PMMA)/graphene oxide (GO) composite; Koratkar et al reported 31% enhancement of E (ΔE=0.90 GPa) at 0.06 vol % of graphene for epoxy nanocomposite; Ramezanzadeh et al reported ΔE=0.7 GPa for 0.1 wt % (0.06 vol %) addition of modified GO sheets to a polyurethane; and other groups reported ΔE=3.0 GPa for 0.5 wt % (0.36 vol %) addition of GO flakes to a poly(vinyl alcohol), ΔE=0.8 GPa for 0.4 wt % (0.27 vol %) addition of carbon nanohorns to a poly(vinyl alcohol), and ΔE=0.9 GPa for 0.35 wt % (0.21 vol %) addition of functionalized rGO flakes to a nylon 12. See Ramanathan T et al., *Nat. Nanotechnol.* 3, 327 (2008), M. A. Rafiee et al., *ACS Nano* 3, 3884 (2009), B. Ramezanzadeh, E. Ghasemi, M. Mandavian, E. Changizi, M. H. Mohamadzadeh Moghadam, *Chem. Eng. J.* 281, 869 (2015), Y. Zhu, H. Wang, J. Zhu, L. Chang, L. Ye, *Appl. Surf. Sci.* 349, 27 (2015), S. B. Kadambi, K. Pramoda, U. Ramamurty, C. N. R. Rao, *ACS Appl. Mater. Interfaces* 7, 17016 (2015), and S. Roy et al., *ACS Appl. Mater. Interfaces* 7, 3142 (2015), each of which is incorporated by reference in its entirety. Here all these ΔE results were plotted against the GOx or nanocarbon's volume fraction ($V_G$) in FIG. 18. These results all exceed the maximum theoretical reinforcement predicted by rule of mixture using an efficient modulus of monolayer GO=207.6 GPa (see J. W. Suk, R. D. Piner, J. An, R. S. Ruoff, *ACS Nano* 4, 6557 (2010), which is incorporated by reference in its entirety), and ΔE has no dependence on $V_G$. Such a surprising reinforcement in GO-based nanocomposite has been first questioned by Macosko group in 2010 (19) and have been well addressed and explained by McKenna group in 2012 (21). See H. Kim, A. A. Abdala, C. W. Macosko, *Macromolecules* 43, 6515 (2010) and X. Li, G. B. McKenna, *ACS Macro Lett.* 1, 388 (2012), each of which is incorporated by reference in its entirety. The description here shows the essential difference between the reinforcement in these GO nanocomposites and that in the composites disclosed here.

The thermal viscoelasticity of the glassy polymer matrix changes upon the addition of functionalized nanofillers like GOx, specifically, the glass transition temperature ($T_g$) of the polymer matrix increases due to the interaction between polymer chains and the functional nanofillers, e.g., via hydrogen bonding in PMMA/GO system, polyethylenimine-modified graphene/Nylon 12 system, or covalent bonding in polyisocyanate-modified GO/polyurethane system. See Ramanathan T et al., *Nat. Nanotechnol.* 3, 327 (2008), S. Roy et al., *ACS Appl. Mater. Interfaces* 7, 3142 (2015), and B. Ramezanzadeh, E. Ghasemi, M. Mandavian, E. Changizi, M. H. Mohamadzadeh Moghadam, *Chem. Eng. J.* 281, 869 (2015), each of which is incorporated by reference in its entirety. The functional nanofillers serve as "cross-linkers" in the matrix, leading to a reduced mobility of the polymer chains and thus $T_g$ increment of the matrix. For example, a $T_g$ increase of 17 K in PMMA/GO nanocomposites at 0.006 vol % GOx, a $T_g$ increase=10 K in epoxy/GOx nanocomposites at 0.06 vol % graphene, and a $T_g$ increase=7.3 K in GO/Nylon 12 nanocomposites at 0.25 wt % (or 0.12 vol %). See RamanathanT et al., *Nat. Nanotechnol.* 3, 327 (2008), M. A. Rafiee et al., *ACS Nano* 3, 3884 (2009), and S. Roy et al., *ACS Appl. Mater. Interfaces* 7, 3142 (2015), each of which is incorporated by reference in its entirety. Once $T_g$ of the polymer matrix increases, the matrix in the nanocomposite behaves as the pure polymer at a lower temperature with higher elastic modulus, so the polymer matrix becomes stiffer and this has the major contribution to the reinforcement found in FIG. 18, while the true mechanical reinforcement by loading to the nanofiller itself is very weak or even negligible, according to McKenna's work. See X. Li, G. B. McKenna, *ACS Macro Lett.* 1, 388 (2012), which is incorporated by reference in its entirety.

This can also be explained with the idea of percolation, a significant improvement of the composite properties like elastic modulus and electrical conductivity can be expected when the rigidity and connectivity percolation of nanofillers (or the percolation threshold) is achieved, and the composite properties then will be scaling with the modulus/conductivity of the nanofillers above this threshold, otherwise, just scaling with the modulus/conductivity of the matrix. All the composites mentioned above should still be below their percolation threshold and their moduli are still dependent on the matrix while not the nanofillers.

To quantify the corrected reinforcement from the nanofillers, the apparent experimental reinforcement (eq. 17) should be modified to eq. 18 by replacing the modulus as function of temperature by the modulus as a function of $T-T_g$:

$$\frac{E_c(T)}{E_m(T)} - 1 \tag{17}$$

$$\frac{E_c(T-T_g)}{E_m(T-T_g)} - 1 \tag{18}$$

The corrected reinforcements from GOs is much lower than the reported apparent reinforcement (FIGS. 6A-6H of X. Li, G. B. McKenna, *ACS Macro Lett.* 1, 388 (2012) for detail, which is incorporated by reference in its entirety), and also can be evidenced in Ruoff's work with polycarbonate (PC)/ GO, where little $T_g$ change is found. See J. R. Potts, S. Murali, Y. Zhu, X. Zhao, R. S. Ruoff, *Macromolecules* 44, 6488 (2011), which is incorporated by reference in its entirety. Therefore, the significant reinforcement found in those GO-based nanocomposites with a very small amount of GOx are not from the nanofillers bearing the load themselves, but primarily from the stiffening of the polymer matrix with enhanced $T_g$ caused by the "cross-linking" or by restricting effect from the nanofillers. Besides GOs or nanocarbons, other functional nanoparticles or even organic macromolecular cross-linker can also be used to achieve such an enhancement, as long as $T_g$ of the glassy matrix increases.

6. A Comparison of the Preparation Process with the Graphene Oxide-Based Nanocomposites A summary and comparison of various processing technologies of graphene or other nanocarbon-based nanocomposite can be found in various papers, e.g. the review papers from Macosko group, Ruoff group, Tsukruk group, and other groups. See H. Kim, A. A. Abdala, C. W. Macosko, *Macromolecules* 43, 6515 (2010), J. R. Potts, D. R. Dreyer, C. W. Bielawski, R. S. Ruoff, *Polymer* 52, 5 (2011), and K. Hu, D. D. Kulkarni, I. Choi, V. V. Tsukruk, *Prog. Polym. Sci.* 39, 1934 (2014), each of which is incorporated by reference in its entirety. Herein the previous processing methods are different from the 4j stacking/folding and shear scroll methods. Generally, graphene sources prepared by top-down approaches, i.e. graphite oxide, are widely used in the polymer nanocomposite due to their larger-scale availability. With these abundant GOs, two major methods including solution-based processing and melt-based processing can mix GOs and polymers. Solution-based mixing has the advantage of maximizing the dispersion of nanofillers in polymer matrix, but challenges including finding common solvents, requiring a large amount of organic solvent, using toxic solvent, difficulty in solvent removal, aggregation issues during mixing and evaporation stages are still not solved. A good dispersion of GOx or similar nanocarbons in polymer matrix is still a great challenge to scale up. See H. Kim, A. A. Abdala, C. W. Macosko, *Macromolecules* 43, 6515 (2010), J. R. Potts, D. R. Dreyer, C. W. Bielawski, R. S. Ruoff, *Polymer* 52, 5 (2011), K. Hu, D. D. Kulkarni, I. Choi, V. V. Tsukruk, *Prog. Polym. Sci.* 39, 1934 (2014), and M. Zhang, Y. Li, Z. Su, G. Wei, Polym. Chem. 6, 6107 (2015), each of which is incorporated by reference in its entirety.

High-quality graphenes, like those with fewer-layered structure, less functionalities, and high aspect ratio with better mechanical, electrical, thermal properties almost cannot be handled in solution due to their restacking, wrinkling, buckling, and folding. For the melt-based process, it is a solvent-free process with the potential to scale up in practical, but issues like difficulty in feeding into melt compounds, poorer dispersion, thermal degradation of modified GOx, the change of flake shapes due to high local shear force are still big challenges before any commercial scale use.

Large-area, high-quality graphene produced by chemical vapor deposition (CVD) method has been rarely considered in the fabrication of graphene/polymer nanocomposite at a macroscopic scale. The reason is that people usually considered CVD graphene can only be produced with limited quantity and a high cost. The technology of CVD graphene growth and transfer, however, develops rapidly and makes significant advances. The first two papers of CVDG reported the growth and transfer of 1-cm² graphene, after that, the roll-to-roll production of 30-inch graphene films was reported in 2010, the production of a 100-m-long high-quality graphene transparent conductive film by roll-to-roll chemical vapor deposition and transfer process was reported in 2013, an annual production capacity of CVD graphene film exceeds 110 000 m² (supported on copper or polymer film like polyethylene terephthalate) in China only at 2013, and large-area CVD graphene can be produced around 100 times cheaper in 2015 than ever before. See A. Reina et al., *Nano Lett.* 9, 30 (2009), X. Li et al., *Science* 324, 1312 (2009), S. Bae et al., *Nat. Nanotechnol.* 5, 574 (2010), T. Kobayashi et al., *Appl. Phys. Lett.* 102, 023112 (2013), W. Ren, H.-M. Cheng, *Nat. Nanotechnol.* 9, 726 (2014), and E. O. Polat et al., *Sci. Rep.* 5, 16744 (2015), each of which is incorporated by reference in its entirety. It is expected a larger-scale and lower-cost growth and transfer of CVD graphene in future. In addition, by using large-area, high-quality CVD graphene with semi-infinite aspect ratio, the required amount of graphene to achieve the percolation threshold of rigidity and conductivity is the lowest. Therefore, the required amount of CVD graphene to achieve a multifunctional reinforcement of the polymers will be much smaller than of GOx and other chemical converted graphenes. In addition, the thin polymer film-supported graphene can match the existing technology and facilities, e.g., the current film-to-fiber technology in industry. See Krassig, H. A., Fiber technology: from film to fiber. CRC Press, (1984), which is incorporated by reference in its entirety.

What is claimed is:

1. A composite comprising:
alternating layers of a first layer comprising a 2D material and a second layer including a polymer matrix,
wherein the 2D material comprises aligned nanoplatelets that create a sheet structure of a near infinite aspect ratio,
wherein the 2D material is present at a volume fraction ($V_G$) of between about 0.003% and about 0.185%,
wherein the composite comprises at least i stacked alternating layers of the first layer and the second layer;
wherein i is between about 1 and 1000; and wherein the aligned nanoplatelets for each first layer in the alternating layers of the composite are aligned along an axis.

2. The composite of claim 1, wherein the 2D material comprises graphene, graphyne, borophene, germanene, silicene, $Si_2BN$, stanene, phosphorene, molybdenite, or a single atom layer of metals.

3. The composite of claim 1, wherein the polymer matrix comprises a polyolefin, polyacrylate, polyester, polycyanate, polystyrene, polyamide, or blend thereof.

4. A method of making the composite of claim 1 comprising:

(1) depositing a layer including a polymer matrix;

(2) depositing a layer including a 2D material on the layer including the polymer matrix;

(3) repeating step (1) and step (2) to make stacked layers; and (4) quadrant-folding the stacked layers, wherein the 2D material is present at a volume fraction ($V_G$) of between about 0.003% and about 0.185%;

wherein the composite comprises at least i stacked alternating layers of the first layer and the second layer;

wherein i is between about 1 and 1000; and wherein the aligned nanoplatelets for each first layer in the alternating layers of the composite are aligned along an axis.

5. The method of claim 4, further comprising hot-pressing the stacked layers.

6. The method of claim 4, wherein the polymer matrix is deposited by spin-coating.

7. The method of claim 4, wherein the 2D material is depositing by chemical vapor deposition (CVD).

8. The composite of claim 4, wherein the 2D material includes graphene.

9. The method of claim 4, wherein the polymer matrix includes polycarbonate.

10. The composite of claim 2, wherein the 2D material comprises graphene.

11. The composite of claim 3, wherein the polymer matrix comprises polycarbonate.

12. The composite of claim 1, wherein the near infinite aspect ratio is at least about 100,000, or at least about 1,000,000, or at least about 10,000,000, or at least about 50,000,000, or at least about 60,000,000, or at least about 100,000,000.

13. The composite of claim 12, wherein the near infinite aspect ratio is at least about 60,000,000.

14. The composite of claim 1, wherein the uniaxial tensile storage (E') and/or loss (E") moduli are greater than the polymer matrix alone.

15. The composite of claim 1, wherein the stacked alternating layers are segmented and stacked or quadrant folded j times, wherein j is 1 to 10.

16. The composite of claim 15, wherein j is 1 or 2.

17. The composite of claim 1, wherein the composite is transparent.

18. The composite of claim 1, wherein the composite is anisotropically electrically conductive.

19. A composite fiber comprising:

alternating layers of a first layer comprising a 2D material and a second layer including a polymer matrix, wherein the 2D material comprises aligned nanoplatelets that create a sheet structure of a near infinite aspect ratio, wherein the 2D material is present at a volume fraction ($V_G$) of between about 0.003% and about 0.185%, and wherein the composite is rolled into a scroll fiber such that a single first layer and second layer form multiple alternating layers in a cross section of the composite fiber.

20. The composite fiber of claim 19, wherein the 2D material comprises graphene, graphyne, borophene, germanene, silicene, $Si_2BN$, stanene, phosphorene, molybdenite, or a single atom layer of metals.

21. The composite fiber of claim 20, wherein the 2D material is graphene.

22. The composite fiber of claim 19, wherein the polymer matrix comprises a polyolefin, polyacrylate, polyester, polycyanate, polystyrene, polyamide, or blend thereof.

23. The composite fiber of claim 22, wherein the polymer matrix comprises polycarbonate.

24. The composite fiber of claim 19, wherein the aligned nanoplatelets of the first layer are aligned along an axis when rolled into a scroll fiber.

25. The composite fiber of claim 24, wherein the axis is the long axis of the composite fiber.

26. The composite fiber of claim 24, wherein the effective modulus (GPa) is at least about 20% greater than a fiber of polymer matrix alone.

* * * * *